(12) United States Patent  
Tomotani et al.

(10) Patent No.: US 8,699,261 B2  
(45) Date of Patent: Apr. 15, 2014

(54) VARIABLE RESISTANCE NONVOLATILE MEMORY DEVICE AND DRIVING METHOD THEREOF

(75) Inventors: Hiroshi Tomotani, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 13 days.

(21) Appl. No.: 13/698,154

(22) PCT Filed: Jul. 4, 2012

(86) PCT No.: PCT/JP2012/004348  
§ 371 (c)(1),  
(2), (4) Date: Nov. 15, 2012

(87) PCT Pub. No.: WO2013/018281  
PCT Pub. Date: Feb. 7, 2013

(65) Prior Publication Data  
US 2013/0208529 A1     Aug. 15, 2013

(30) Foreign Application Priority Data  
Aug. 2, 2011    (JP) ................................. 2011-169674

(51) Int. Cl.  
     *G11C 11/00*          (2006.01)

(52) U.S. Cl.  
     USPC ........ 365/148; 365/200; 365/158; 365/189.14

(58) Field of Classification Search  
     USPC ..................... 365/148, 200, 158, 189.14, 163  
     See application file for complete search history.

(56) References Cited

U.S. PATENT DOCUMENTS

| | | | |
|---|---|---|---|
| 6,885,579 B2 | 4/2005 | Sakimura et al. | |
| 7,248,494 B2 | 7/2007 | Oh et al. | |
| 7,986,575 B2 | 7/2011 | Inaba | |
| 8,004,873 B2 | 8/2011 | Toda | |
| 8,305,795 B2 * | 11/2012 | Azuma et al. | 365/148 |
| 2004/0004856 A1 | 1/2004 | Sakimura et al. | |
| 2006/0050548 A1 | 3/2006 | Oh et al. | |
| 2009/0052225 A1 | 2/2009 | Morimoto | |
| 2009/0213639 A1 | 8/2009 | Toda | |
| 2010/0008125 A1 | 1/2010 | Inaba | |

FOREIGN PATENT DOCUMENTS

| | | |
|---|---|---|
| JP | 2006-79812 | 3/2006 |
| JP | 2006-203098 | 8/2006 |
| JP | 3821066 | 9/2006 |
| JP | 2009-199695 | 9/2009 |
| JP | 2010-20811 | 1/2010 |
| WO | 2011/004448 | 1/2011 |
| WO | 2012/140903 | 10/2012 |

* cited by examiner

*Primary Examiner* — David Lam  
(74) *Attorney, Agent, or Firm* — Wenderoth, Lind & Ponack, LLP

(57) ABSTRACT

A highly-reliable variable resistance nonvolatile memory device capable of a stable operation and a driving method of the variable resistance nonvolatile memory device are provided. A variable resistance nonvolatile memory device includes a memory cell array, a memory cell selection circuit, a write circuit, and a read circuit. The write circuit sets a variable resistance element of another memory cell different from a faulty memory cell and located on at least one of a bit line and a word line that includes the faulty memory cell to a second high resistance state where a resistance value is higher than a resistance value in a first low resistance state, by applying a second high-resistance write pulse to the other memory cell.

15 Claims, 25 Drawing Sheets

Memory cell characteristics
(Synthesized characteristics of diode and variable resistance layer)

Memory cell characteristics
(Synthesized characteristics of diode and variable resistance layer)

FIG. 13

|  |  |  | | Regular read mode | Cell characteristic determination mode |
|---|---|---|---|---|---|
| Bit-line control voltage switching circuit | SW1 | | | ON | OFF |
| | SW2 | | | OFF | ON |
| Clamp voltage, Bit-line voltage | Node CLMP | | | Vre + Vtn + VF | Vre + Vtn |
| | Selected bit line BL | | | ≤ Vre + VF | ≤ Vre |
| Output terminal SAOUT of read circuit | Normal cell | Variable resistance element | Low resistance state | "L" is outputted | "H" is outputted |
| | | | High resistance state | "H" is outputted | "H" is outputted |
| | Cell having faulty current control element | Variable resistance element | Low resistance state | "L" is outputted | "L" is outputted (faulty state is detected) |
| | | | High resistance state | "L" or "H" is outputted | "L" or "H" is outputted (faulty state is not detected) |

Characteristics between selected-bit-line voltage and selected-bit-line current

VARIABLE RESISTANCE NONVOLATILE MEMORY DEVICE AND DRIVING METHOD THEREOF

TECHNICAL FIELD

The present invention relates to a variable resistance nonvolatile memory device and a driving method thereof. In particular, the present invention relates to a variable resistance nonvolatile memory device including a memory cell having: a variable resistance element that reversibly changes, in response to the application of a voltage pulse, between a low resistance state and a high resistance state where a resistance value is higher than in the low resistance state; and a current steering element typified by a diode element, and to a driving method of the variable resistance nonvolatile memory device.

BACKGROUND ART

In recent years, with the advances in semiconductor miniaturization technologies, densities and capacities of memory devices (memories) have been significantly increased. The field of nonvolatile memory devices has made remarkable technological developments (such as miniaturization) in flash memories and electrically erasable and programmable ROMs (EEPROMs), and thus begun to achieve cost reduction. However, the miniaturization of flash memories is said to be approaching the limit. With this being the situation, a new nonvolatile memory device has received attention for further reducing a cell area size and a cost.

Research and development have been promoted for a nonvolatile memory device, as the new nonvolatile memory device, having a memory cell including a variable resistance element. Here, the variable resistance element reversibly changes a resistance value in response to an electrical signal, and can store data corresponding to this resistance value in a nonvolatile manner.

As a nonvolatile memory device employing a variable resistance element, a 1T1R type nonvolatile memory device is generally known. This 1T1R type nonvolatile memory device has a structure where so-called 1T1R type memory cells are arranged in an array of a matrix. Each of the 1T1R type memory cells includes a metal oxide semiconductor (MOS) transistor and a variable resistance element that are connected in series at a position near a cross point of a bit line and a word line that are arranged to cross each other. Moreover, as another example, a cross point type nonvolatile memory device is also generally known (see Patent Literatures 1 and 2, for instance). This cross point type nonvolatile memory device has a structure where so-called 1D1R memory cells are arranged in an array of a matrix. Each of the 1D1R memory cells includes a diode serving as a current steering element in place of a transistor.

Patent Literature 1 discloses a 1D1R nonvolatile memory device that employs, as a memory cell, a variable resistance element having a characteristic of changing resistance bidirectionally. Moreover, Patent Literature 2 discloses a method of detecting a fault in a nonlinear element in a 1D1R memory cell that includes a unidirectional variable resistance element as a memory cell.

CITATION LIST

Patent Literature

[PTL 1]
Japanese Unexamined Patent Application Publication No. 2006-203098 (FIG. 2)
[PTL 2]
Japanese Unexamined Patent Application Publication No. 2009-199695 (FIG. 6)

SUMMARY OF INVENTION

Technical Problem

When a memory cell array is increased in capacity, the number of memory cell faults tends to increase. For example, when a diode element used as a current steering element in a 1D1R cross point type array structure has a leakage current problem, a leakage current greater than an OFF current flows. Thus, normal reading cannot be performed when a faulty memory cell including this diode element having the leakage current problem is selected. Moreover, in the case of a bidirectional memory cell array where a bidirectional current steering element (such as a metal-semiconductor-metal (MSM) diode or a metal-insulator-metal (MIM) diode) is employed, a current flows when either one of the forward voltage and the reverse voltage is applied. On this account, the faulty memory cell having the leakage current problem cannot be detected (see Patent Literature 2).

In order to solve the stated problems, the present invention has an object to provide: a variable resistance nonvolatile memory device that is highly reliable and capable of performing a stable operation; and a driving method of the variable resistance nonvolatile memory device.

Solution to Problem

The variable resistance nonvolatile memory device in an aspect according to the present invention is a variable resistance nonvolatile memory device including: a memory cell array having a plurality of memory cells each including a variable resistance element and a current steering element that are connected in series, each of the memory cells being located at a three-dimensional cross point of one of a plurality of word lines and one of a plurality of bit lines, the variable resistance element changing a resistance value reversibly in response to an applied write voltage pulse, and the current steering element flowing a current from which the current steering element is assumed to be conducting as a result of an application of a voltage exceeding a predetermined threshold voltage; a memory cell selection circuit that selects at least one of the memory cells from the memory cell array by selecting at least one of the word lines and at least one of the bit lines; a write circuit that rewrites the resistance value of the variable resistance element of the selected memory cell by applying a voltage pulse to the selected memory cell; and a read circuit that reads a state of the selected memory cell by performing read-voltage application on the selected memory cell so that one of a first voltage higher than the threshold voltage and a second voltage lower than or equal to the threshold voltage is applied to the current steering element of the selected memory cell, wherein the write circuit sets the variable resistance element of the memory cell selected from among the plurality of memory cells to one of a first low resistance state and a first high resistance state by applying, as the write voltage pulse, a corresponding one of a first low-resistance write pulse and a first high-resistance write pulse to the selected memory cell, when the selected memory cell is not faulty and a resistance state of the variable resistance element of the selected memory cell is read by applying the first voltage to the selected memory cell, the read circuit detects (i) a current having a first predetermined value when the selected memory cell is in the first low resistance state and (ii) a current having a second predetermined value when the selected memory cell is in the first high resistance state, when a value of a current passing through the selected memory cell is greater than one of the first predetermined value corresponding to the first low resistance state and the second predetermined value corresponding to the first high resistance state when the resistance state of the variable resistance element of the selected memory cell is read, the read circuit determines that the selected memory cell is a faulty memory cell having a fault, and the write circuit sets the variable resistance element of an other memory cell different from the faulty memory cell and located on at least one of the bit line and the word line that includes the faulty memory cell to a second high resistance state where a resistance value is higher than a resistance value in the first low resistance state, by applying a second high-resistance write pulse to the other memory cell.

Advantageous Effects of Invention

The present invention can provide: the variable resistance nonvolatile memory device that is highly reliable and capable of performing a stable operation; and the driving method of the variable resistance nonvolatile memory device.

BRIEF DESCRIPTION OF DRAWINGS

FIG. 13 is a diagram showing a mode-specific truth table.

DESCRIPTION OF EMBODIMENTS

Knowledge Forming Basis of Present Invention

Before details about the present invention are described, knowledge that forms the basis of the present invention is firstly explained.

As described above, a variable resistance nonvolatile memory device having a cross point type structure where so-called 1T1R type memory cells or so-called 1D1R memory cells are arranged in an array of a matrix is generally known as a nonvolatile memory device employing a variable resistance element.

Figure 25:
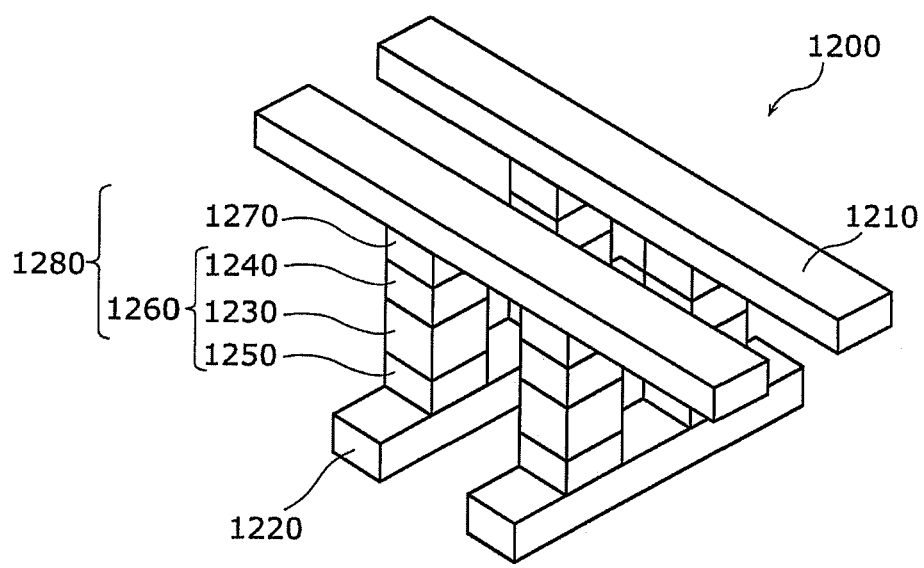
FIG. 25 is a diagram showing a configuration of a conventional nonvolatile memory cell.

FIG. 25 is a diagram showing a configuration of a conventional nonvolatile memory cell. The diagram shows a 1D1R nonvolatile memory device that employs, as a memory cell, a variable resistance element having a characteristic of changing resistance bidirectionally (see Patent Literature 1). FIG. 25 shows a memory cell array having a cross point type structure where a memory cell 1280 is placed at a cross point of a bit line 1210 and a word line 1220. The memory cell 1280 includes a variable resistance element 1260 and a nonlinear element 1270 that are connected in series. The variable resistance element 1260 includes a variable resistor 1230 sandwiched between an upper electrode 1240 and a lower electrode 1250. Here, the variable resistance element 1260 has a characteristic of reversibly changing a resistance value between a low resistance state and a high resistance state bidirectionally, in response to a polarity of the applied voltage. Moreover, the nonlinear element 1270 is configured with, for example, a varistor for the purpose of reducing a leakage current, as it is called, that passes through a nonselected cell. In the memory cell array having the cross point type structure, the memory cells can be arranged according to a wiring pitch. Furthermore, such memory cell arrays can be stacked three-dimensionally, thereby increasing in capacity.

Figure 26:
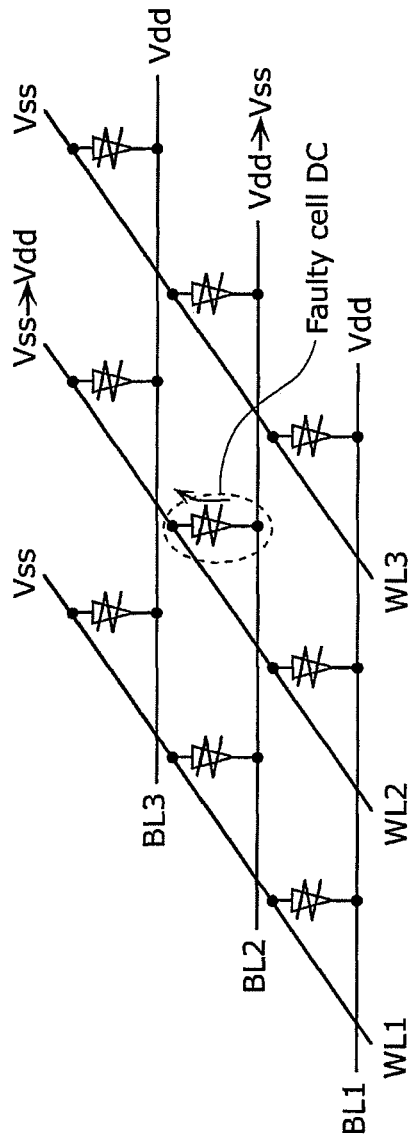
FIG. 26 is a diagram showing a configuration of a conventional nonvolatile memory cell array.

FIG. 26 is a diagram showing a configuration of a conventional nonvolatile memory cell array. The diagram indicates a method of detecting a fault in a nonlinear element included in a 1D1R memory cell that is configured with a unidirectional variable resistance element (see Patent Literature 2). In FIG. 26, a memory cell is placed at each cross point of bit lines BL1, BL2, and BL3 and word lines WL1, WL2, and WL3. The memory cell includes a unidirectional variable resistance element and a unidirectional diode element that are connected in series. The unidirectional diode has an anode and a cathode. With the application of a potential "Vdd" to all the bit lines and the application of a potential "Vss" to all the word lines, no current passes through a normal diode element in a reverse biased state. However, a DC current passes through a faulty diode element even in the reverse biased state, and the bit line on which the faulty diode element is located decreases in potential from the potential Vdd.

Patent Literature 2 discloses a method of detecting a bit line having such a faulty diode element as a faulty bit line.

Figure 27:
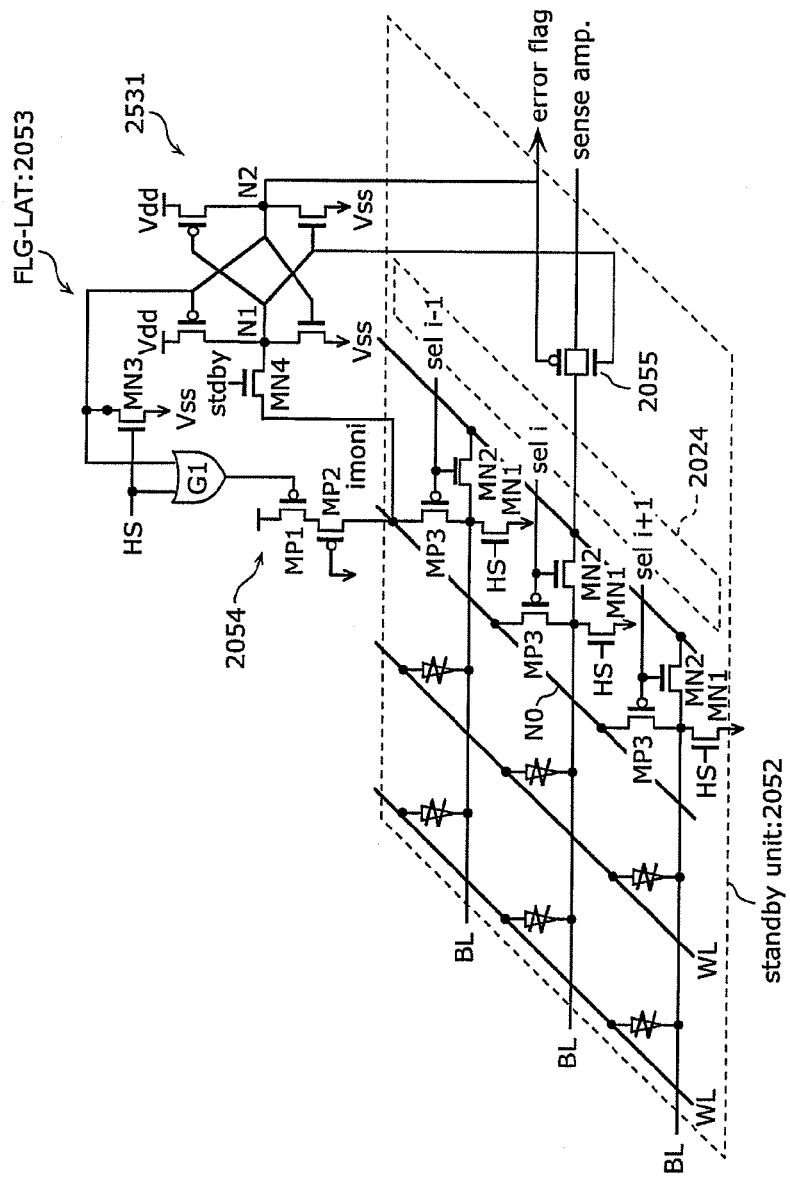
FIG. 27 is a diagram showing a model of a conventional memory cell that includes a unidirectional diode.

FIG. 27 is a diagram showing a model of a conventional memory cell that includes a unidirectional diode. As shown in FIG. 27, a fault detection circuit 2053 includes a bit-line power supply circuit 2054, a latch circuit 2531, and a switch circuit 2055, and is connected to a bit line connected to a bit line selection circuit 2024. A standby unit 2052 of the fault detection circuit 2053 detects a faulty bit line connected to a faulty diode element. Patent Literature 2 discloses a method of rescuing the faulty bit line.

Here, when a memory cell array is increased in capacity, the number of memory cell faults tends to increase. Suppose that a diode element used as a current steering element in a 1D1R cross point type array structure is normal. In an OFF state of the diode element, an OFF current that is at least one order of magnitude smaller than a current flowing in an ON state passes through this diode element. However, when the diode element has a leakage current problem, a leakage current greater than the OFF current flows. Thus, normal reading cannot be performed when a faulty memory cell including this diode element having the leakage current problem is selected. Moreover, even when a normal memory cell is selected, the influence of the faulty memory cell cannot be avoided. That is, even when only one memory cell is faulty, the memory cells located on the bit line or the word line connected to this faulty memory cell are misidentified as having faults and thus the address of the faulty memory cell cannot be specified. On this account, it is extremely difficult to analyze a cause of the fault by a physics analysis, a FIB analysis, or the like.

Patent Literature 2 discloses the method of detecting the faulty bit line in the unidirectional memory cell array that employs the unidirectional diode element having the anode and the cathode. To be more specific, Patent Literature 2 describes the method of detecting the faulty bit line having the leakage current problem by using the facts that a current flows when a forward voltage is applied and that no current flows when a reverse voltage is applied. When all the memory cells are normal, no current flows when: all the bit lines are set at a potential Vdd; all the word lines are set at a potential Vss; and the diode elements are set in the reverse biased state. However, when a faulty memory cell having a leakage current problem is present, a leakage current flows from the bit line having this faulty memory cell to the word lines. By determining this leakage current, the faulty bit line having the leakage current problem can be detected.

However, in the case of a bidirectional memory cell array where a bidirectional current steering element (such as a metal-semiconductor-metal (MSM) diode or a metal-insulator-metal (MIM) diode) is employed, a current flows when either one of the forward voltage and the reverse voltage is applied. On this account, the faulty memory cell having the leakage current problem cannot be detected by the method disclosed in Patent Literature 2. Moreover, as shown in FIG. 27, the fault detection circuit 2053 is connected only to the bit line. Therefore, although detecting the faulty bit line having the leakage current problem, the fault detection circuit 2053 cannot detect which one of the memory cells that is connected to this faulty bit line causes the fault.

Memory cell faults include not only the leakage current problem caused due to a short-circuit fault occurring to the current steering element, but also a problem of the variable resistance element that does not change to the high resistance state or the low resistance state even with the application of voltage to the memory cell because the variable resistance element is stuck in a super low resistance state.

When the current steering element has the short-circuit fault, the variable resistance element of the faulty memory cell may be set to the high resistance state to reduce the leakage current. As a result, an influence of the leakage current of the faulty memory cell having the short-circuit fault upon a normal memory cell can be prevented.

However, when the variable resistance element has the problem as mentioned above, it is difficult to set the variable resistance element stuck in the super low resistance state to the high resistance state and, therefore, an influence of the faulty memory cell upon a normal memory cell cannot be avoided. More specifically, the leakage current passing through the faulty memory cell may cause the normal memory cell to operate unstably.

With this being the situation, the following embodiments describe: a variable resistance nonvolatile memory device that is highly reliable and capable of performing a stable operation; and a driving method of the variable resistance nonvolatile memory device.

The variable resistance nonvolatile memory device in an aspect according to the present invention is a variable resistance nonvolatile memory device including: a memory cell array having a plurality of memory cells each including a variable resistance element and a current steering element that are connected in series, each of the memory cells being located at a three-dimensional cross point of one of a plurality of word lines and one of a plurality of bit lines, the variable resistance element changing a resistance value reversibly in response to an applied write voltage pulse, and the current steering element flowing a current from which the current steering element is assumed to be conducting as a result of an application of a voltage exceeding a predetermined threshold voltage; a memory cell selection circuit that selects at least one of the memory cells from the memory cell array by selecting at least one of the word lines and at least one of the bit lines; a write circuit that rewrites the resistance value of the variable resistance element of the selected memory cell by applying a voltage pulse to the selected memory cell; and a read circuit that reads a state of the selected memory cell by performing read-voltage application on the selected memory cell so that one of a first voltage higher than the threshold voltage and a second voltage lower than or equal to the threshold voltage is applied to the current steering element of the selected memory cell, wherein the write circuit sets the variable resistance element of the memory cell selected from among the plurality of memory cells to one of a first low resistance state and a first high resistance state by applying, as the write voltage pulse, a corresponding one of a first low-resistance write pulse and a first high-resistance write pulse to the selected memory cell, when the selected memory cell is not faulty and a resistance state of the variable resistance element of the selected memory cell is read by applying the first voltage to the selected memory cell, the read circuit detects (i) a current having a first predetermined value when the selected memory cell is in the first low resistance state and (ii) a current having a second predetermined value when the selected memory cell is in the first high resistance state, when a value of a current passing through the selected memory cell is greater than one of the first predetermined value corresponding to the first low resistance state and the second predetermined value corresponding to the first high resistance state when the resistance state of the variable resistance element of the selected memory cell is read, the read circuit determines that the selected memory cell is a faulty memory cell having a fault, and the write circuit sets the variable resistance element of an other memory cell different from the faulty memory cell and located on at least one of the bit line and the word line that includes the faulty memory cell to a second high resistance state where a resistance value is higher than a resistance value in the first low resistance state, by applying a second high-resistance write pulse to the other memory cell.

With this configuration, in the memory cell array having a cross point type array structure where a bidirectional current steering element is included, a memory cell that includes a current steering element having a short-circuit fault or a faulty memory cell that includes a faulty variable resistance element is specified. Then, other memory cells different from the faulty memory cell and located on the bit line or word line that includes the faulty memory cell are set to the second high resistance state. Thus, the faulty memory cell can be rescued without being set to the high resistance state. As a result, a highly-reliable variable resistance nonvolatile memory device can be implemented. It should be noted that a value of a memory cell current passing through a normal memory cell when a variable resistance element of the normal memory cell is in the first low resistance state is referred to as a first predetermined value. Also, note that a value of a memory cell current passing through the normal memory cell when the variable resistance element is in the first high resistance state is referred to as a second predetermined value.

Moreover, it is preferable that the write circuit sets the variable resistance elements of other memory cells different from the faulty memory cell and located on the bit line and the word line that include the faulty memory cell to a third high resistance state where a resistance value is higher than the resistance value in the first high resistance state, by applying a third high-resistance write pulse to the other memory cells.

With this configuration, the other memory cells different from the faulty memory cell and located on the bit line and the word line that include the faulty memory cell are set to the third high resistance state. As a result, an even more highly-reliable variable resistance nonvolatile memory device can be implemented.

Furthermore, it is preferable that when the value of the current passing through the selected memory cell with the application of the second voltage is greater than the first predetermined value, the read circuit determines that the selected memory cell is a faulty memory cell having a short-circuit fault.

With this configuration, since the second voltage lower than the threshold voltage is applied, the current having the value higher than or equal to the predetermined value does not pass through the memory cell having no short-circuit fault and the current having the value higher than or equal to the predetermined value passes through only the memory cell having the short-circuit fault. Therefore, by detecting this current, the faulty memory cell can be easily determined.

Moreover, it is preferable that the write circuit sets the variable resistance element of the selected memory cell to the first high resistance state by applying the first high-resistance write pulse, and that the read circuit reads the resistance state of the variable resistance element of the selected memory cell by applying the first voltage to the selected memory cell, and determines that the variable resistance element of the selected memory cell is faulty when the value of the current passing through the selected memory cell is greater than the second predetermined value.

With this configuration, the memory cell including the faulty variable resistance element can be easily specified.

Furthermore, it is preferable that when the value of the current passing through the selected memory cell with the application of the second voltage after the write circuit applies the first low-resistance write pulse to the faulty memory cell is greater than the first predetermined value, it is determined that the selected memory cell is a faulty memory cell having a short-circuit fault.

With this configuration, since the fault of the current steering element is detected after setting the variable resistance element to the first low resistance state, the faulty memory cell can be detected more accurately. As a result, a highly-reliable variable resistance nonvolatile memory device can be implemented.

Moreover, it is preferable that the write circuit sets the variable resistance element of the faulty memory cell to a fourth high resistance state where a resistance value is higher than the resistance value in the first low resistance state, by applying, to the faulty memory cell, a fourth high-resistance write pulse having an absolute value higher than or equal to an absolute value of a pulse voltage at which the variable resistance element enters a high resistance state.

With this configuration, the faulty memory cell and the other memory cell located at least one of the bit line and the word line that includes the faulty memory cell to the high resistance state. As a result, an even more highly-reliable variable resistance nonvolatile memory device can be implemented.

Furthermore, it is preferable that the memory cell array includes: a main memory cell array having the memory cells for a main memory; and a redundant memory cell array having a redundant memory cell used, when at least one of the memory cells included in the main memory cell array is a faulty memory cell, as a substitute for the other memory cell different from the faulty memory cell and located on at least one of the bit line and the word line that includes the faulty memory cell, the redundant memory cell array having a plurality of redundant memory cells.

With this configuration, the redundant memory cell is provided. Thus, this redundant memory cell can be used as a substitute for the memory cell set in the high resistance state. As a result, an even more highly-reliable variable resistance nonvolatile memory device can be implemented.

Moreover, it is preferable that the variable resistance nonvolatile memory device includes a fault address memory circuit that stores address information regarding the other memory cell located on at least one of the bit line and the word line that includes the faulty memory cell, in association with address information regarding the redundant memory cell.

With this configuration, the fault address memory circuit is provided. Thus, the other memory cell located on the bit line or the word line that includes the faulty memory cell substituted by the redundant memory cell can be stored in association with the redundant memory cell.

Furthermore, it is preferable that the fault address memory circuit stores an address of the bit line that includes the faulty memory cell, in association with an address of a bit line that includes the redundant memory cell used as the substitute for the other memory cell different from the faulty memory cell and located on the bit line that includes the faulty memory cell.

With this configuration, the other memory cell located on the bit line that includes the faulty memory cell can be substituted by the redundant memory cell. As a result, a highly-reliable variable resistance nonvolatile memory device that rescues the faulty memory cell can be implemented.

Moreover, it is preferable that the fault address memory circuit stores an address of the word line that includes the faulty memory cell, in association with an address of a word line that includes the redundant memory cell used as the substitute for the other memory cell different from the faulty memory cell and located on the word line that includes the faulty memory cell.

With this configuration, the other memory cell located on the word line that includes the faulty memory cell can be substituted by the redundant memory cell. As a result, a highly-reliable variable resistance nonvolatile memory device that rescues the faulty memory cell can be implemented.

Furthermore, the driving method of the variable resistance nonvolatile memory device in an aspect according the present invention is a driving method of a variable resistance nonvolatile memory device, the variable resistance nonvolatile memory device including a memory cell array having a plurality of memory cells each including a variable resistance element and a current steering element that are connected in series, each of the memory cells being located at a three-dimensional cross point of one of a plurality of word lines and one of a plurality of bit lines, the variable resistance element changing a resistance value reversibly in response to an applied write voltage pulse, and the current steering element flowing a current from which the current steering element is assumed to be conducting as a result of an application of a voltage exceeding a predetermined threshold voltage, and the driving method including: (a) setting, by the write circuit, the variable resistance element of the memory cell selected from among the plurality of memory cells to one of a first low resistance state and a first high resistance state by applying a corresponding one of a first low-resistance write pulse and a first high-resistance write pulse to the selected memory cell; (b) reading, by the read circuit, a resistance state of the variable resistance element of the selected memory cell by applying a first voltage higher than the threshold voltage to the selected memory cell; (c) determining that the selected memory cell is a faulty memory cell having a fault when a value of a current passing through the selected memory cell is greater than one of a first predetermined value corresponding to the first low resistance state and a second predetermined value corresponding to the first high resistance state when the resistance state of the variable resistance element of the selected memory cell is read, the first predetermined value representing a current passing through the selected memory cell when the selected memory cell is not faulty and is in the first low resistance state and the second predetermined value representing a current passing through the selected memory cell when the selected memory cell is not faulty and is in the first high resistance state; and (d) setting, by the write circuit, the variable resistance element of an other normal memory cell different from the faulty memory cell and located on at least one of the bit line and the word line that includes the faulty memory cell to a second high resistance state where a resistance value is higher than a resistance value in the first low resistance state, by applying a second high-resistance write pulse to the other memory cell.

With this configuration, in the memory cell array having a cross point type array structure where a bidirectional current steering element is included, a memory cell that includes a current steering element having a short-circuit fault or a faulty memory cell that includes a faulty variable resistance element is specified. Then, other memory cells different from the faulty memory cell and located on the bit line or word line that includes the faulty memory cell are set to the second high resistance state. Thus, the faulty memory cell can be rescued without being set to the high resistance state. As a result, a highly-reliable variable resistance nonvolatile memory device can be implemented.

Moreover, it is preferable that the write circuit sets the variable resistance elements of other memory cells different from the faulty memory cell and located on the bit line and the word line that include the faulty memory cell to a third high resistance state where a resistance value is higher than the resistance value in the first high resistance state, by applying a third high-resistance write pulse to the other memory cells.

With this configuration, the other memory cells different from the faulty memory cell and located on the bit line and the word line that include the faulty memory cell are set to the third high resistance state. As a result, an even more highly-reliable variable resistance nonvolatile memory device can be implemented.

Furthermore, it is preferable that, in the determining in (c), when the value of the current passing through the selected memory cell with the application of the second voltage lower than the threshold voltage is greater than the first predetermined value, the read circuit determines that the selected memory cell is the faulty memory cell having a short-circuit fault.

With this configuration, since the second voltage lower than the threshold voltage is applied, the current having the value higher than or equal to the predetermined value does not pass through the memory cell having no short-circuit fault and the current having the value higher than or equal to the predetermined value passes through only the memory cell having the short-circuit fault. Therefore, by detecting this current, the faulty memory cell can be easily determined.

Moreover, it is preferable that, in the determining in (c): the write circuit sets the variable resistance element of the selected memory cell to the first high resistance state by applying the first high-resistance write pulse to the selected memory cell; and the read circuit reads the resistance state of the variable resistance element of the selected memory cell by applying the first voltage to the selected memory cell, and determines that the variable resistance element of the selected memory cell is faulty when the value of the current passing through the selected memory cell is greater than the second predetermined value.

With this configuration, the faulty memory cell including the faulty variable resistance element can be detected and rescued.

Furthermore, it is preferable that the driving method further includes, in the setting in (d), (e) setting, by the write circuit, the variable resistance element of the faulty memory cell to a fourth high resistance state where a resistance value is higher than the resistance value in the first low resistance state, by applying, to the faulty memory cell, a fourth high-resistance write pulse having an absolute value higher than or equal to an absolute value of a pulse voltage at which the variable resistance element enters a high resistance state.

With this configuration, since the fourth high-resistance pulse voltage is applied to set the faulty memory cell to the fourth high resistance state, the faulty memory element can be rescued. As a result, a highly-reliable variable resistance nonvolatile memory device can be implemented.

The following is a description of Embodiments of a variable resistance nonvolatile memory device (may be simply referred to as the "nonvolatile memory device" hereafter) according to the present invention, with reference to the drawings. Although the present invention is described by way of Embodiments with reference to the drawings, it is to be noted that Embodiments below describe only examples and are not intended to limit the present invention. It should be noted that each of Embodiments below describes only a preferred specific example. Note that numerical values, shapes, materials, components, locations and connection states of the components, steps, a sequence of the steps, and so forth described in Embodiments below are only examples and are not intended to limit the present invention. Moreover, among the components described in Embodiments below, a component that is not described in an independent claim indicating a top concept according to the present invention is described as an arbitrary component to implement a more preferred embodiment.

Embodiment 1

Memory Cell

Figure 1:
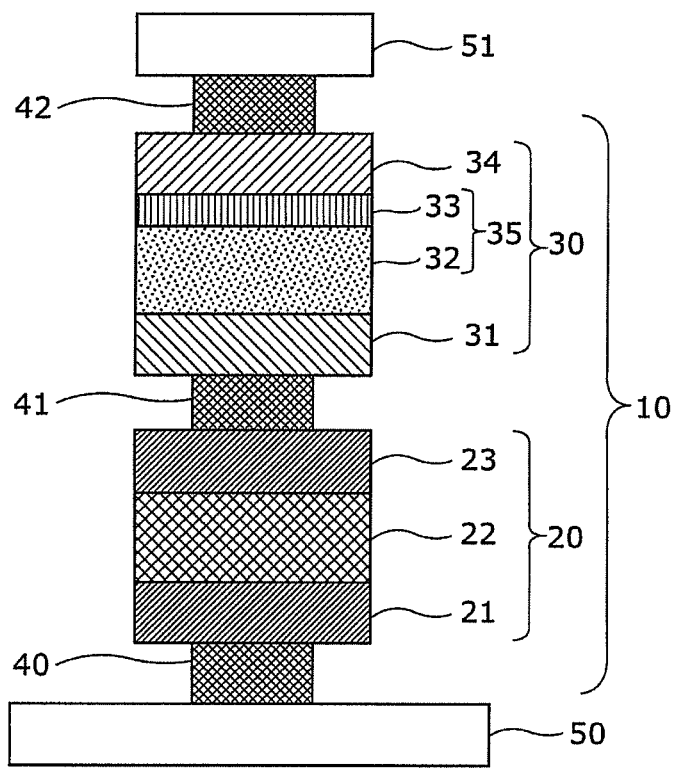
FIG. 1 is a schematic diagram showing a basic configuration of a memory cell in Embodiment according to the present invention.

FIG. 1 is a diagram showing an example of a configuration of a memory cell in Embodiment 1 according to the present invention. A memory cell 10 shown in FIG. 1 includes a current steering element 20 and a variable resistance element 30 that are connected in series.

In FIG. 1, the current steering element 30 is connected to the variable resistance element 20 via a contact 41, and the current steering element 30 and the variable resistance element 20 form the one-bit 1D1R memory cell 10. One terminal of the memory cell 10 is connected to a lower line 50 via a contact 40, and the other terminal of the memory cell 10 is connected to an upper line 51 via a contact 42.

Here, the memory cell 10 shown in FIG. 1 has a connection relationship where the current steering element 20 is positioned under the variable resistance element 30. However, this connection relationship may be turned upside down, that is, the current steering element 20 may be positioned on the variable resistance element 30.

The current steering element 20 includes a lower electrode (a first electrode) 21, an upper electrode (a second electrode) 23, and a current steering layer 22 (a semiconductor layer 22 or an insulator layer 22) sandwiched between the lower electrode 21 and the upper electrode 23. The lower electrode 21 and the semiconductor layer 22 are in physical and electrical contact with each other to form a Schottky barrier having a bidirectional rectifying characteristic. The upper electrode 23 and the semiconductor layer 22 are in physical and electrical contact with each other to form a Schottky barrier having a bidirectional rectifying characteristic. When the insulator layer 22 is used instead of the semiconductor layer 22, the lower electrode 21, the insulator layer 22, and the upper electrode 23 form a tunnel diode having a bidirectional rectifying characteristic.

More specifically, as can be understood from that the current steering element 20 is typified by a diode or the like, a voltage applied to both terminals of the current steering element 20 and a current flowing between the terminals of the current steering element 20 show nonlinear characteristics. The current steering element 20 is a bidirectional diode that changes a direction of current flow according to a polarity of the applied voltage. To be more specific, the current steering element 20 has a threshold voltage ("VF") for each of positive and negative applied voltage regions. When an absolute value of the voltage to be applied to the both terminals of the current steering element 20 is lower than or equal to the threshold voltage (VF), a resistance value of the current steering element 20 increases and an absolute value of the current to flow is lower than or equal to a value of a predetermined threshold current. When the absolute value of the voltage to be applied to the both terminals of the current steering element 20 exceeds the threshold voltage (VF), the resistance value of the current steering element 20 decreases and the absolute value of the current to flow nonlinearly increases. In other words, when the absolute value of the voltage to be applied to the both terminals of the current steering element 20 is lower than or equal to the threshold voltage (VF), only a slight OFF current lower than or equal to the predetermined threshold current passes through the current steering element 20, meaning that the current steering element 20 enters an OFF state. On the other hand, when the absolute value of the voltage to be applied to the both terminals of the current steering element 20 exceeds the threshold voltage (VF), a great ON current passes through the current steering element 20, meaning that the current steering element 20 enters an ON state. To be more specific, the current steering element 20 has a function as a switch having the ON state and the OFF state according to the voltage to be applied to the both terminals of the current steering element 20. Suppose that the current steering element 20 has a vertically symmetric structure (that is, when the two electrodes comprise the same material and the current steering layer 22 is vertically consistent in quality). In this case, when positive and negative voltages are applied, the voltage-current characteristics of the current steering element 20 are symmetrical with respect to a point. That is, an absolute value of the threshold voltage in the positive applied voltage region and an absolute value of the threshold voltage in the negative applied voltage region are approximately the same value.

The current steering element 20 in Embodiment 1 is configured as a metal-semiconductor-metal (MSM) diode including, for example: the lower electrode 21 comprising a tantalum nitride; the semiconductor layer 22 comprising a nitrogen-deficient silicon nitride film having a lower nitrogen content atomic percentage than a silicon nitride film ($Si_3N_4$); and the upper electrode 23 comprising a tantalum nitride. The thickness of the semiconductor layer 22 can be, for example, 3 nm to 20 nm. The silicon nitride film can be formed to have a semiconducting property by reducing the nitrogen content atomic percentage. A diode configured as the MSM diode can be made by a simple manufacturing process. For example, the nitrogen-deficient silicon nitride film ($SiN_z$ where $0<z\le0.85$) can be formed according to a reactive sputtering method using, for example, a silicon (Si) target under a nitrogen gas atmosphere. Here, the film may be manufactured at ambient temperature, with a chamber pressure being 0.1 Pa to 1 Pa and a flow rate of $Ar/N_2$ being 18/2 sccm.

It should be noted that the current steering element 20 in Embodiment 1 may be a metal-insulator-metal (MIM) diode, a PN diode, a Schottky diode, or a zener diode. When the MIM diode is used, the insulator layer 22 is provided, in place of the semiconductor layer, between the lower electrode 21 and the upper electrode 23. The current steering element 20 may be a unidirectional current steering element where a current flows in only one direction. The variable resistance element 30 includes a lower electrode (a third electrode) 31, an upper electrode (a fourth electrode) 34, and a variable resistance layer 35 sandwiched between the lower electrode 31 and the upper electrode 34. Here, the variable resistance layer 35 includes: a first transition metal oxide layer 32 comprising an oxygen-deficient transition metal oxide; and a second transition metal oxide layer 33 formed on the first transition metal oxide layer 32 and comprising a transition metal oxide having an oxygen deficiency degree lower than an oxygen deficiency degree of the first transition metal oxide layer 32. Embodiment 1 describes a configuration, as an example, including a first oxygen-deficient tantalum oxide layer (hereafter, referred to as the first Ta oxide layer) 32 and a second tantalum oxide layer (hereafter, referred to as the second Ta oxide layer) 33 formed on the first Ta oxide layer 32. Here, the oxygen content atomic percentage of the second Ta oxide layer 33 is higher than that of the first Ta oxide layer 32. In other words, the oxygen deficiency degree of the second Ta oxide layer 33 is lower than the oxygen deficiency degree of the first Ta oxide layer 32. The oxygen deficiency degree refers to a ratio of deficient oxygen to the amount of oxygen included in an oxide having a stoichiometric composition in a corresponding transition metal. For example, when the transition metal is tantalum (Ta), the stoichiometric composition of the oxide is $Ta_2O_5$ and thus can be expressed as $TaO_{2.5}$. The oxygen deficiency degree of $TaO_{2.5}$ is 0%. For example, the oxygen deficiency of the oxygen-deficient tantalum oxide having the composition of $TaO_{1.5}$ is expressed as $(2.5-1.5)/2.5=40\%$. The oxygen content atomic percentage of $Ta_2O_5$ is a percentage of oxygen atoms of the total number of atoms (i.e., O/(Ta+O)), and thus is $5/7=71.4$ atm %. Therefore, the oxygen content atomic percentage of the oxygen-deficient tantalum oxide is higher than 0 and lower than 71.4 atm %.

As a metal included in the variable resistance layer 35, a transition metal other than tantalum may be used. Examples of the transition metal include tantalum (Ta), titanium (Ti), hafnium (Hf), zirconium (Zr), niobium (Nb), and tungsten (W). The transition metal can take different oxidized states, and thus can implement different resistance states by oxidation-reduction reactions. For example, suppose that a hafnium oxide is used, that a composition of a first hafnium oxide layer 32 is expressed as $HfO_x$, and that a composition of a second hafnium oxide layer 33 is expressed as $HfO_y$. In this case, it is confirmed that the resistance value of the variable resistance layer 35 can be changed stably at high speed when "x" is between 0.9 and 1.6 inclusive and "y" is greater than x. Here, it is preferable for the thickness of the second hafnium oxide layer 33 to be between 3 nm and 4 nm inclusive. Moreover, suppose that a zirconium oxide is used, that a composition of a first zirconium oxide layer 32 is expressed as $ZrO_x$, and that a composition of a second zirconium oxide layer 33 is expressed as $ZrO_y$. In this case, it is confirmed that the resistance value of the variable resistance layer 35 can be changed stably at high speed when x is between 0.9 and 1.4 inclusive and y is greater than x. Here, it is preferable for the thickness of the second zirconium oxide layer 33 to be between 1 nm and 5 nm inclusive.

It should be noted that a different transition metal may be used for each of a first transition metal included in the first transition metal oxide layer 32 and a second transition metal included in the second transition metal oxide layer 33. In this case, it is preferable for the second transition metal oxide layer 33 to have an oxygen deficiency degree lower than an oxygen deficiency degree of the first transition metal oxide layer 32, that is, to have a higher resistance. With this configuration, a voltage applied between the lower electrode 31 and the upper electrode 34 during a resistance change is distributed more to the second transition metal oxide layer 33, so that an oxidation-reduction reaction can easily occur in the second transition metal oxide layer 33. Moreover, when a different material is used for each of the first transition metal and the second transition metal, it is preferable for a standard electrode potential of the second transition metal to be lower than a standard electrode potential of the first transition metal. This is because a resistance change phenomenon is assumed to occur when an oxidation-reduction reaction takes place in a minute filament (a conductive path) formed in the highly-resistant second transition metal oxide layer 33 and the resistance value thus changes. For example, a stable resistance change can be obtained by using an oxygen-deficient tantalum oxide for the first transition metal oxide layer 32 and using a titanium oxide ($TiO_2$) is used for the second transition metal oxide layer 33. Titanium (the standard electrode potential=−1.63 eV) is a material that is lower in the standard electrode potential than tantalum (the standard electrode potential=−0.6 eV). When the standard electrode potential is higher, this material is less oxidizable. When a metal oxide having a standard electrode potential lower than the standard electrode potential of the first transition metal oxide layer 32 is used for the second transition metal oxide layer 33, it is easier for an oxidation-reduction reaction to occur in the second transition metal oxide layer 33.

A resistance change phenomenon in each of the variable resistance films comprising the aforementioned materials in the stacked structure is assumed to occur when an oxidation-reduction reaction takes place in a minute filament formed in the highly-resistant second transition metal oxide layer 33 and the resistance value thus changes. To be more specific, when a positive voltage is applied to the upper electrode 34 on the side of the second transition metal oxide layer 33 with respect to the lower electrode 31, oxygen ions included in the variable resistance layer 35 are pulled to the side of the second transition metal oxide layer 33. Then, it is assumed that an oxidation reaction occurs in a minute filament formed in the second transition metal oxide layer 33 and thus a resistance of the minute filament increases. On the other hand, when a negative voltage is applied to the upper electrode 34 on the side of the second transition metal oxide layer 33 with respect to the lower electrode 31, oxygen ions included in the second transition metal oxide layer 33 are pushed to the side of the first transition metal oxide layer 32. Then, it is assumed that a reduction reaction occurs in a minute filament formed in the second transition metal oxide layer 33 and thus a resistance of the minute filament decreases.

The upper electrode 34 connected to the second transition metal oxide layer 33 having a lower oxygen deficiency degree comprises a material, such as platinum (Pt) or iridium (Ir), that has a standard electrode potential higher than standard electrode potentials of the transition metal included in the second transition metal oxide layer 33 and the material included in the lower electrode 31. Moreover, the lower electrode 31 comprises an electrode material including, as a main component, a material (such as tantalum nitride (TaN)) having a standard electrode potential lower than a standard electrode potential of the upper electrode 34. More specifically, when the tantalum oxide is used for each of the first transition metal oxide layer 32 and the second transition metal oxide layer 33, it is preferable for the material used for the lower electrode 31 to be selected from among TaN, W, nickel (Ni), Ta, Ti, and aluminum (Al) and for the material used for the upper electrode 34 to be selected from among Pt, Ir, palladium (Pd), silver (Ag), copper (Cu), and gold (Au). With this configuration, an oxidation-reduction reaction selectively occurs in the second transition metal oxide layer 33 at a position closer to an interfacial surface between the upper electrode 34 and the second transition metal oxide layer 33. As a result, a stable resistance change phenomenon can be obtained.

In order to drive the variable resistance element 30 configured as described thus far, a voltage satisfying a predetermined condition is applied, using an external power source, between the lower electrode 31 and the upper electrode 34.

It should be noted that the connection relationship between the current steering element 20 and the variable resistance element 30 shown in FIG. 1 may be turned upside down. Moreover, note that the connection relationship between the first transition metal oxide layer 32 and the second transition metal oxide layer 33 may be turned upside down, and that the connection relationship between the lower electrode 31 and the upper electrode 34 may be turned upside down.

Figure 2:
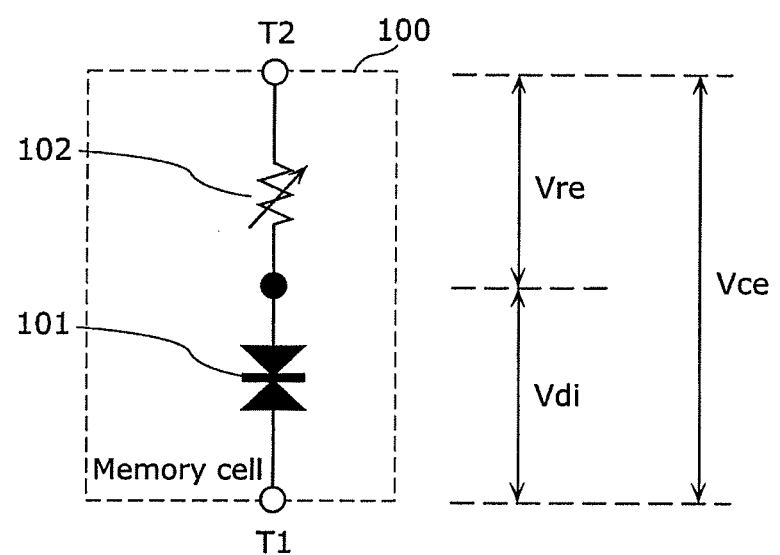
FIG. 2 is an equivalent circuit diagram of the memory cell in Embodiment according to the present invention.

FIG. 2 is an equivalent circuit diagram of the memory cell 10 shown in FIG. 1 in Embodiment 1. FIG. 2 shows an equivalent circuit diagram of a memory cell 100 where a current steering element 101 and a variable resistance element 102 are connected in series. One terminal T1 of the memory cell 100 is connected to the current steering element 101, and the other terminal T2 of the memory cell 100 is connected to the variable resistance element 102. Moreover, the one terminal T1 is connected to the lower line 50 and the other terminal T2 is connected to the upper line 51.

In FIG. 2, when a voltage "Vce" is applied between the two terminals T1 and T2 of the memory cell 100, the applied voltage Vce is divided into respective voltages according to impedances of the current steering element 101 and the variable resistance element 102. Thus, Vce=Vdi+Vre. Here, "Vdi" refers to a voltage to be applied to both terminals of the current steering element 101, and "Vre" refers to a voltage to be applied to both terminals of the variable resistance element 102.

When an absolute value of the voltage Vdi applied to the current steering element 101 exceeds a threshold voltage (VF), the current steering element 101 enters an ON state and a memory cell current "Ice" passes through the memory cell 100. On the other hand, when the absolute value of the voltage Vdi applied to the current steering element 101 is lower than or equal to the threshold voltage (VF), the current steering element 101 enters an OFF state and only an OFF current "Ioff" that is a minute current passes through the memory cell 100. More specifically, by setting the current steering element 101 to the ON state or the OFF state according to whether the voltage applied to the memory cell 100 is higher or lower than the threshold voltage (VF), the memory cell 100 can be set to a selected state or a nonselected state.

Figure 3A:
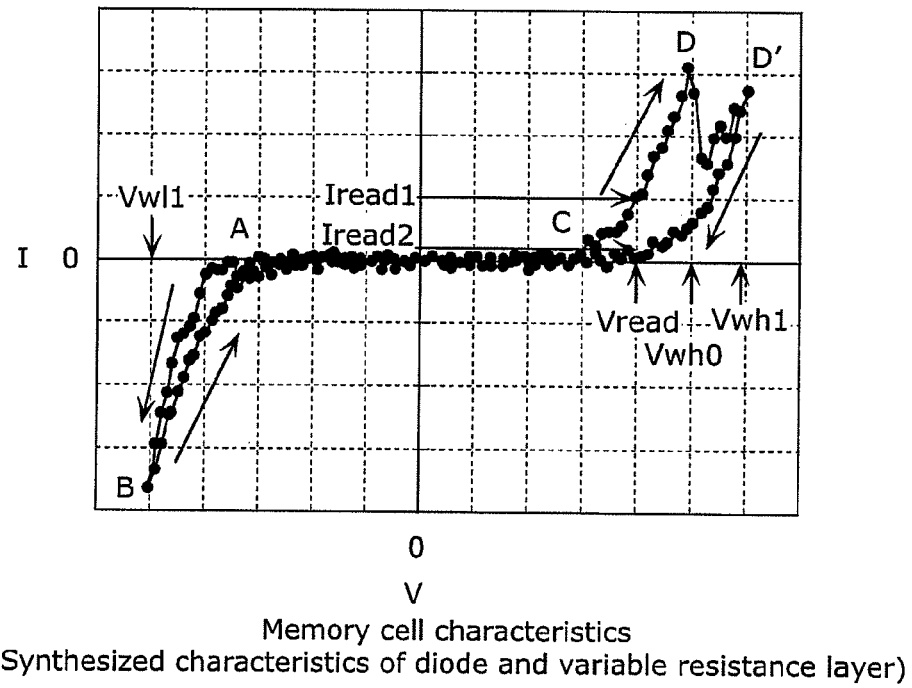
FIG. 3A is a diagram showing voltage-current characteristics of the memory cell.

FIG. 3A is a diagram showing voltage-current characteristics of the memory cell 10 that is normal, in Embodiment 1. Suppose that, in the memory cell 10 having the configuration as shown in FIG. 1, when the upper line 51 is at a higher voltage than the lower line 50, this voltage is a positive-polarity voltage. Moreover, suppose that, when the lower line 50 is at a higher voltage than the upper line 51, this voltage is a negative-polarity voltage. Also suppose that the direction in which a current flows from the upper line 51 to the lower line 50 is a positive current direction, and that the direction in which a current flows from the lower line 50 to the upper line 51 is a negative current direction. In this case, FIG. 3A shows actual measurement values representing a relationship between voltage and current when the voltage is applied to the both terminals of the memory cell 10.

Suppose that a voltage is applied to the memory cell 10 so that the lower line 50 is at a higher potential than the upper line 51. More specifically, suppose that a negative polarity voltage is applied in FIG. 3A. In this case, a current starts flowing around a point A and the variable resistance element 30 starts changing from a high resistance state to a first low resistance state around a point where the voltage exceeds "Vwl1". Then, when the voltage up to a point B is applied, an absolute value of the current increases with an absolute value of the applied voltage and the resistance value gradually decreases. That is, any resistance value in the low resistance state can be set according to a voltage (or a current) to be applied to the memory cell 10.

On the other hand, suppose that a voltage is applied to the memory cell 10 so that the upper line 51 is at a higher potential than the lower line 50. More specifically, suppose that a positive polarity voltage is applied in FIG. 3A. In this case, a current starts flowing around a point C and the variable resistance element 30 starts changing from a first low resistance state to a first high resistance state at a point D that is approximately symmetrical to the voltage at which the variable resistance element 30 changes to the first low resistance state. Thus, the current passing through the memory cell 10 decreases. Then, when the voltage up to a point D' is applied, the current increases according to the applied voltage. However, when the applied voltage decreases, the current decreases more as compared to the case where the applied voltage increases. From this, it can be understood that the variable resistance element 30 changes to a higher resistance state.

To be more specific, the actual measurement data shown in FIG. 3A indicates a bidirectional variable resistance characteristic. That is, when the voltage of the lower line 50 reaches a first low-resistance write voltage Vwl1 with respect to the voltage of the upper line 51 as a reference voltage (in FIG. 3A, the Vwl1 indicates a negative voltage, and the potential of the upper line 51 is lower than the potential of the lower line 50 by the Vwl1), the memory cell 10 having the configuration shown in FIG. 1 changes to the first low resistance state (at the point B). Also, when the voltage of the upper line 51 reaches a high-resistance start voltage "Vwh0", at which the low resistance state starts changing to the high resistance state, with respect to the voltage of the lower line 50 as a reference voltage, the memory cell 10 changes from the low resistance state to the high resistance state (at the point D). Moreover, the actual measurement data shown in FIG. 3A indicates that the first low-resistance write voltage Vwl1 and the high-resistance start voltage Vwh0 are approximately symmetrical in the voltage-current relationship with respect to an origin point of the actual measurement data. When a first high-resistance write voltage "Vwh1" higher than the high-resistance start voltage Vwh0 is applied, the memory cell 10 enters a first high resistance state (at the point D'). Here, the resistance value at the point D' is greater than the resistance value at the point D.

Even when the voltage is applied to the memory cell 10, a voltage region between the point A and the point C includes a region where a current does not flow remarkably. This is because the current steering element 20 of the memory cell 10 is in an OFF state and thus the current hardly passes through the memory cell 10. More specifically, the current passing through the current steering element 20 of the memory cell 10 by the application of voltage has a nonlinear characteristic. On this account, when the absolute value of the voltage applied to the current steering element 20 is lower than or equal to the threshold voltage (VF) of the current steering element 20, the current hardly flows. From this, the current steering element 20 is considered to be in the OFF state and, therefore, the current hardly passes through the memory cell 10. Here, the threshold voltage (VF) of the current steering element 20 refers to a maximum voltage to be applied to the current steering element 20 when only a current such that the current steering element 20 is considered to be in the OFF state flows (this current is referred to as the maximum OFF current). Moreover, the maximum OFF current of the current steering element 20 is a current lower than a maximum current "IHR" flowing when at least the variable resistance element 30 of the memory cell 10 is in the high resistance state.

Each of the point A and the point C corresponds to a total voltage of the threshold voltage (VF) of the current steering element 20 and the voltage applied to the variable resistance element 30. In a memory cell array where a plurality of memory cells 10 are arranged in an array (namely, a cross point type array), a voltage exceeding a voltage range between the point A and the point C is applied to the memory cell 10 that is selected (i.e., the selected memory cell 10) and a voltage within the voltage range between the point A and the point C is applied to a memory cell that is not selected (i.e., a nonselected memory cell). As a result of this, a leakage current is prevented from flowing to the nonselected cell and the current passes through the selected memory cell 10.

When the resistance state of the memory cell 10 is to be read, a read voltage "Vread" shown as an example in FIG. 3A is applied to the memory cell 10. Then, by detecting a current flowing at this time, the resistance state of the memory cell 10 can be determined. Here, an absolute value of the Vread is greater than an absolute value of the VF. In the case of the characteristics as shown in FIG. 3A, when the variable resistance element 30 of the memory cell 10 is in the first low resistance state and the read voltage Vread is applied, the current steering element 20 is turned ON and a read current "Iread1" passes through the memory cell 10. On the other hand, when the variable resistance element 30 of the memory cell 10 is in the first high resistance state and the read voltage Vread is applied, a read current "Iread2" passes through the memory cell 10. By detecting the amount of this current value, the state of the memory cell 10 can be determined.

In this way, the resistance state of the memory cell 10 can be determined by applying the read voltage Vread to the memory cell 10 and then detecting the memory cell current (Iread1 or Iread2) that flows at this time, when the voltage-current characteristics of the memory cell 10 are normal as shown in FIG. 3A. However, when the current steering element 20 of the memory cell 10 is faulty and has a short-circuit fault, an excessive current passes through the memory cell 10. Moreover, when the current steering element 20 has an open-circuit fault, a current hardly flows, meaning that the resistance state of the memory cell 10 cannot be determined. On account of this, it is necessary to detect a memory cell having a fault (namely, a faulty memory cell) and prevent an abnormal current from passing through the faulty memory cell.

Figure 3B:
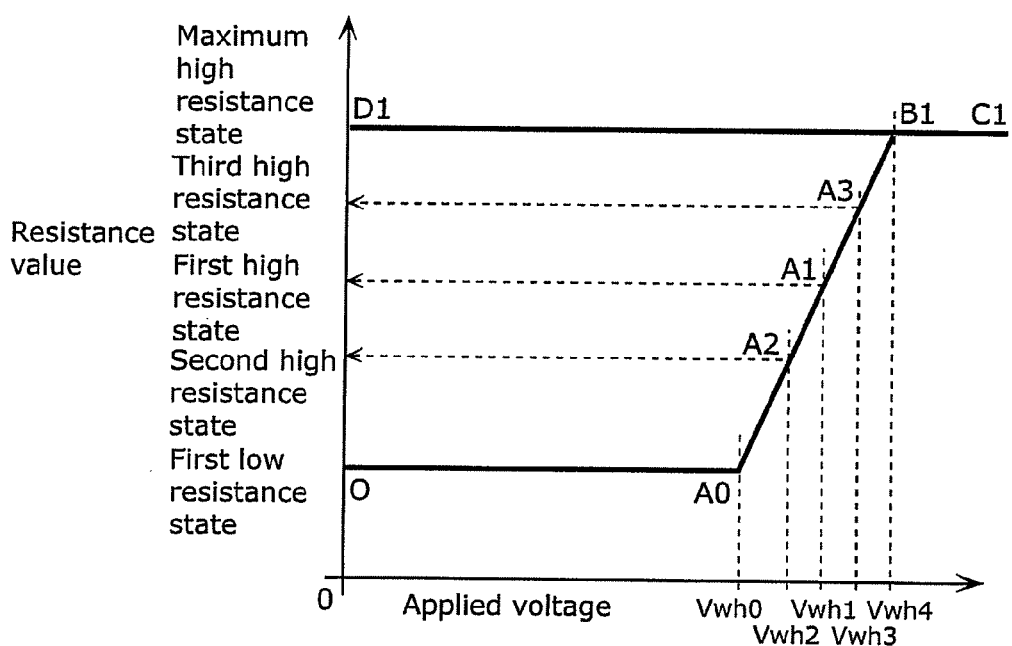
FIG. 3B is a diagram showing resistance-voltage characteristics of a variable resistance element.

FIG. 3B is a schematic diagram showing a part of resistance-voltage characteristics of the variable resistance element 30 shown in FIG. 1. The horizontal axis represents the value of the voltage applied between the lower electrode 31 and the upper electrode 34 of the variable resistance element 30 with respect to the lower electrode. The vertical axis represents the resistance value of the variable resistance element 30.

As the voltage applied to the variable resistance element 30 that is in a state "0", i.e., the first low resistance state is gradually increased, the variable resistance element 30 starts changing to the high resistance state at the voltage Vwh0 (A0). When the voltage applied to the variable resistance element 30 is further increased, the variable resistance element 30 enters, at the voltage Vwh4, a high resistance state B1 (a maximum high resistance state) having the maximum resistance value. Then, even when the voltage applied to the variable resistance element 30 is further increased, the resistance value of the variable resistance element 30 does not change (C1). Even when the voltage applied to the variable resistance element 30 is gradually reduced from C1, the resistance value does not decrease and the maximum high resistance state is maintained.

The resistance-voltage characteristics of the variable resistance element 30 from the state A0 to the state B1 have a predetermined slope (nonlinear, in reality). In order to bring the variable resistance element 30 into the normal high resistance state A1 (the first high resistance state), the corresponding first high-resistance write voltage Vwh1 is applied. In order to bring the variable resistance element 30 into a second high resistance state A2 where the resistance value is higher than the resistance value in the first low resistance state, a corresponding second high-resistance write voltage Vwh2 is applied. In order to bring the variable resistance element 30 into a third high resistance state A3 where the resistance value is higher than the resistance value in the first high resistance state, a corresponding third high-resistance write voltage Vwh3 is applied. When a voltage higher than or equal to the voltage Vwh4 is applied, the variable resistance element 30 can be brought into the maximum high resistance state.

[Characteristics of Faulty Memory Cell]

Figure 4:
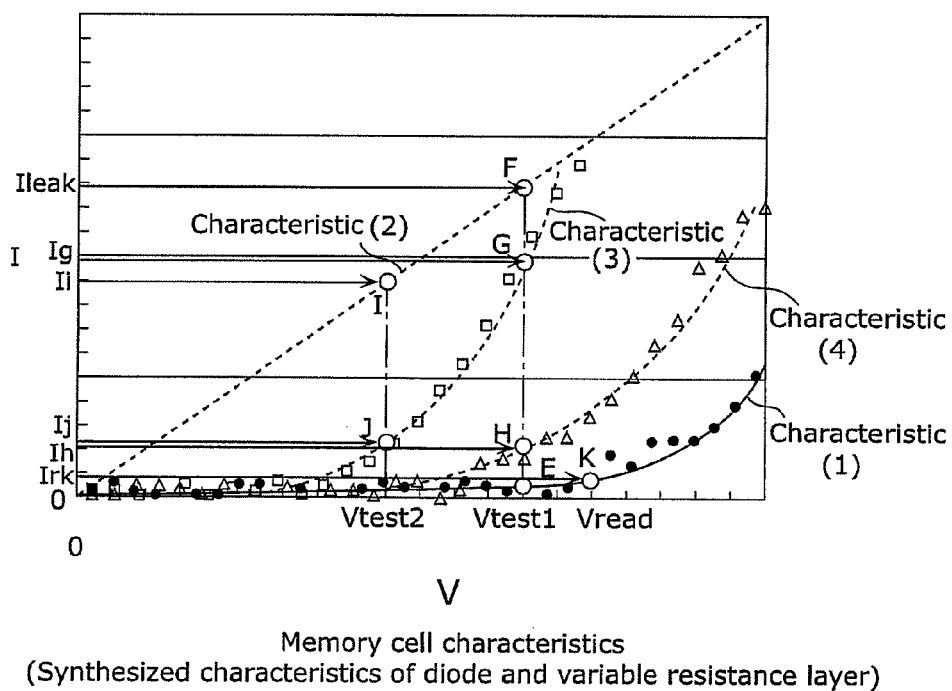
FIG. 4 is a diagram showing voltage-current characteristics of a normal memory cell and a faulty memory cell.

FIG. 4 is a diagram showing the voltage-current characteristics of: the memory cell 10 including the current steering element 20 having a normal characteristic; and the memory cell 10 including the current steering element 20 having a faulty characteristic (a short-circuit fault). Note that, in the memory cell 10 selected by the lower line 50 and the upper line 51 shown in FIG. 1, when the upper line 51 is at a higher voltage than the lower line 50, this voltage is a positive-polarity voltage. Also note that the direction in which a current flows from the upper line 51 to the lower line 50 is a positive current direction. In this case, the positive voltage and current applied to the normal memory cell 10 that is in the first low resistance state are as follows. As indicated by a characteristic (1), when the absolute value of the voltage applied to the memory cell 10 is lower than or equal to a voltage "Vtest1", a current hardly passes through the memory cell 10. When the applied voltage exceeds the voltage Vtest1, a current passes through the memory cell 10. Then, the current passing through the memory cell 10 nonlinearly increases with an increase in the applied voltage. To be more specific, the voltage Vtest1 is a voltage such that the threshold voltage (VF) is applied to the current steering element 20.

On the other hand, in the case of the faulty memory cell 10 including the current steering element 20 that is completely faulty and shorted, the characteristic of the variable resistance element 30 is dominant. Therefore, when the resistance value of the variable resistance element 30 is low, the memory cell 10 having the faulty characteristic shows a linear voltage-current characteristic as indicated by a characteristic (2) shown in a broken line in FIG. 4.

For example, suppose that the voltage Vtest1 is applied to the both terminals of the memory cell 10. When the memory cell 10 has the normal characteristic as indicated by the characteristic (1) shown in FIG. 4, only a current of a few μA passes through the memory cell 10. On the other hand, when the memory cell 10 has the characteristic of the complete short-circuit fault as indicated by the characteristic (2), a current "Ileak" passes through the memory cell 10 as indicated by a point F with the same application of Vtest1.

To be more specific, suppose that the voltage Vtest1 is applied to the both terminals of the memory cell 10 selected by the lower line 50 and the upper line 51 so that a voltage lower than or equal to the threshold voltage VF is applied to the current steering element 20 and thus the current steering element 20 enters the OFF state. In this case, when the memory cell 10 has the normal characteristic as indicated by the characteristic (1), a current hardly flows as indicated by a point E. On the other hand, when the memory cell 10 includes the current steering element 20 having the short-circuit fault as indicated by the characteristic (2), a greater current flows as indicated by the point F. In this way, the voltage Vtest1 for detecting a fault is applied to the memory cell 10 so that a voltage lower than or equal to the threshold voltage is applied to the current steering element 20 of the memory cell 10. By detecting a difference in the current passing through the memory cell 10 at this time, whether or not the memory cell 10 is faulty can be determined.

The case of the characteristic (2) where the current steering element 20 is completely faulty and shorted has been described thus far. Note that the determination can be made in the same way when the current steering element 20 is not completely faulty and in a halfway shorted state. Examples of such a case include a faulty characteristic where the threshold voltage of the current steering element 20 is lower than that of the current steering element 20 of the normal memory cell 10.

Each of a characteristic (3) and a characteristic (4) shown in FIG. 4 corresponds to the voltage-current characteristic of the memory cell 10 in the case where the threshold voltage VF of the current steering element 20 is lower than the threshold voltage VF of the current steering element 20 of the normal memory cell 10. Here, suppose that the voltage Vtest1 is applied to the both terminals of the memory cell 10. Since the current steering element 20 has the faulty characteristic in the cases of the characteristics (3) and (4), respective currents "Ig" and "Ih" pass through the memory cell 10 as indicated by a point G and a point H. On the other hand, when the memory cell 10 has the normal characteristic as indicated by the characteristic (1), a current hardly flows as indicated by the point E. By detecting a difference between these currents, the characteristic of the faulty memory cell can be determined.

Moreover, when a voltage "Vtest2" is applied to the both terminals of the memory cell 10 having the characteristic (1) or (4), a current hardly passes through the memory cell 10. However, in the case of the characteristics (2) and (3), respective currents "Ii" and "Ij" pass through the memory cell 10 as indicated by a point I and a point J. To be more specific, by applying the voltage Vtest2 (<Vtest1) for evaluating the characteristic to the memory cell 10 according to the threshold voltage of the current steering element 20 of the memory cell 10, the characteristic of the current steering element 20 of the memory cell 10 can be evaluated.

Next, suppose that the memory cell 10 has a faulty characteristic (an open-circuit fault). In this case, even when the read voltage Vread is applied to the memory cell 10, a current hardly passes through the memory cell 10. In Embodiment 1, when the read voltage Vread is applied, a memory cell current "Irk" flows as indicated by a point K in the case where the resistance value of the variable resistance element 30 of the memory cell 10 is of the first low resistance state as indicated by the characteristic (1) and the memory cell 10 includes the current steering element 20 having the normal characteristic. On the other hand, in the case of the memory cell 10 having the open-circuit fault, only a memory cell current lower than the current Irk flows (not illustrated). In other words, the open-circuit fault of the memory cell 10 can be detected by applying the read voltage Vread to the memory cell 10 after setting the variable resistance element 30 of the memory cell 10 to the first low resistance state.

When the detection of the open-circuit fault is performed on the memory cell 10 having the short-circuit fault, an excessive current passes through the memory cell 10 and, therefore, the resistance value of the variable resistance element 30 changes or the variable resistance element 30 becomes faulty. On account of this, after the memory cell 10 having the short-circuit fault is detected, it is preferable for the detection of the open-circuit fault to be performed on the memory cell 10 different from the memory cell 10 having the short-circuit fault.

[Variable Resistance Nonvolatile Memory Device]

Figure 5:
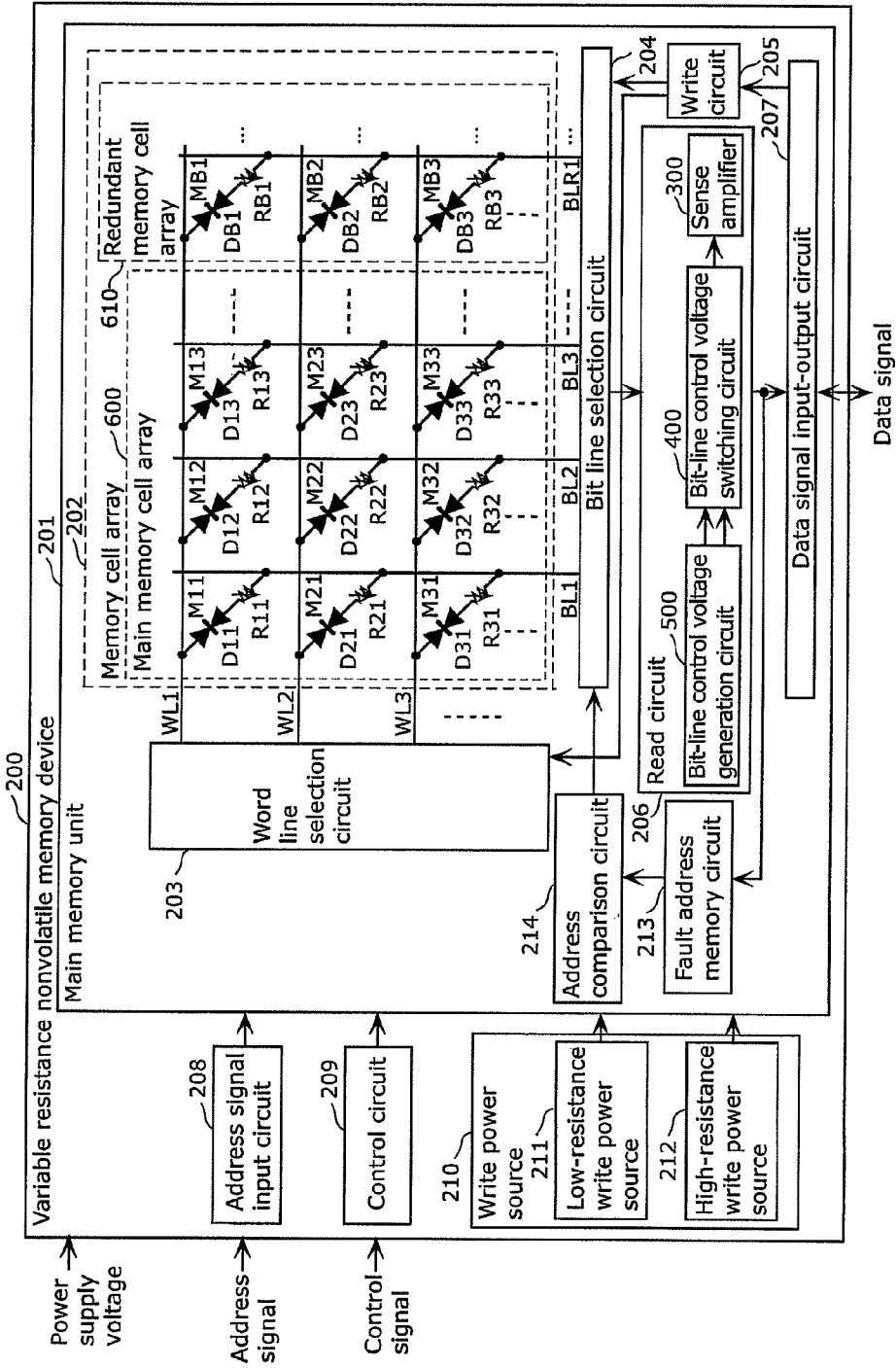
FIG. 5 is a diagram showing a configuration of a variable resistance nonvolatile memory device.

FIG. 5 is a diagram showing a configuration of a variable resistance nonvolatile memory device 200 in Embodiment 1. As shown in FIG. 5, the variable resistance nonvolatile memory device 200 in Embodiment 1 includes a main memory unit 201 formed on a substrate. The main memory unit 201 includes a memory cell array 202, a word line selection circuit 203, a bit line selection circuit 204, a write circuit 205 for writing data, a read circuit 206 for reading data, and a data signal input-output circuit 207.

The read circuit 206 includes a sense amplifier 300, a bit-line control voltage switching circuit 400, and a bit-line control voltage generation circuit 500 that generates a bit-line control voltage. The read circuit 206 is connected to the data signal input-output circuit 207 that receives and outputs a data signal from and to an external source.

Moreover, the variable resistance nonvolatile memory device 200 includes: an address signal input circuit 208 that receives address information from outside the variable resistance nonvolatile memory device 200; and a control circuit 209 that receives a control signal from outside the variable resistance nonvolatile memory device 200.

Furthermore, the variable resistance nonvolatile memory device 200 includes, as a write power source 210, a low-resistance write power source 211 and a high-resistance write power source 212. An output VL of the low-resistance write power source 211 and an output VH of the high-resistance write power source 212 are supplied to the write circuit 205 of the main memory unit 201.

Moreover, the variable resistance nonvolatile memory device 200 includes: a fault address memory circuit 213 that stores a fault address detected by the read circuit 206; and a comparison circuit 214 that compares addresses.

The variable resistance nonvolatile memory device 200 in Embodiment 1 has the following operation modes: a write mode in which data is written into a memory cell; a regular read mode in which data is read from a memory cell; a cell characteristic determination mode in which a characteristic of a memory cell is determined to determine whether or not the memory cell is faulty; and a rescue mode in which a normal memory cell connected to the bit line or the word line that includes the faulty memory cell is set to the second high resistance state where the resistance value is higher than the resistance value in the first low resistance state and replaced by a spare normal memory cell (namely, a redundant memory cell). Moreover, the variable resistance nonvolatile memory device 200 has a mode in which the faulty memory cell is set to a fourth high resistance state where the resistance value is higher than the resistance value in the first low resistance state.

The cell characteristic determination mode, in turn, includes: a current-steering-element characteristic determination mode in which a characteristic of the current steering element is determined; and a variable-resistance-element determination mode in which a characteristic of the variable resistance element is determined.

The memory cell array 202 includes: a main memory cell array 600 in which the memory cells 100 one of which is shown in FIG. 2 are arranged in a matrix with rows and columns; and a redundant memory cell array 610 in which the memory cells 100 one of which is also shown in FIG. 2 are arranged. The redundant memory cell array 610 includes the same number of memory cells 100 for each of the rows of the main memory cell array 600. As an example, the redundant memory cell array 610 shown in FIG. 5 includes one memory cell 100 for each of the rows of the main memory cell array 600. That is, the redundant memory cell array 610 corresponding to one column is formed.

Moreover, the memory cell array 202 includes a plurality of word lines WL1, WL2, WL3, . . . , and a plurality of bit lines BL1, BL2, BL3, . . . . Here, the word lines and the bit lines are arranged so as to cross each other. In addition, the memory cell array 202 includes one or more redundant bit lines BLR1, . . . arranged in parallel to the bit lines BL1, BL2, BL3, . . . .

As shown in FIG. 5, the plurality of word lines WL1, WL2, WL3, . . . are arranged in parallel to each other in one plane (a first plane) that is parallel to a main plane of the substrate. Similarly, the plurality of bit lines BL1, BL2, BL3, . . . are arranged in parallel to each other in one plane (a second plane parallel to the first plane) that is parallel to the first plane. The redundant bit lines BLR1, . . . are arranged in parallel to the bit lines BL1, BL2, BL3, . . . in the second plane.

The first plane and the second plane are parallel to each other, and the word lines WL1, WL2, WL3, . . . , and the bit lines BL1, BL2, BL3, . . . are arranged so as to three-dimensionally cross each other. Moreover, the word lines WL1, WL2, WL3, . . . , and the redundant bit lines BLR1, . . . are also arranged so as to three-dimensionally cross each other.

In the main memory cell array 600, at the three-dimensional cross points of the word lines WL1, WL2, WL3, . . . , and the bit lines BL1, BL2, BL3, . . . , there are provided memory cells M11, M12, M13, M21, M22, M23, M31, M32, M33, . . . (referred to as "the memory cells M11, M12, M13, . . ." hereafter). In the redundant memory cell array 610, at the three-dimensional cross points of the word lines WL1, WL2, WL3, . . . , and the redundant bit lines BLR1, . . . , there are provided redundant memory cells MB1, MB2, MB3, . . . . More specifically, the word lines WL1, WL2, WL3, . . . are provided to be shared by the main memory cell array 600 and the redundant memory cell array 610.

Each of the memory cells M11, M12, M13, . . . is configured with: a corresponding one of current steering elements D11, D12, D13, D21, D22, D23, D31, D32, D33, . . . (referred to as "the current steering elements D11, D12, D13, . . ." hereafter); and a corresponding one of variable resistance elements R11, R12, R13, R21, R22, R23, R31, R32, R33, . . . (referred to as "the variable resistance elements R11, R12, R13, . . ." hereafter) connected in series with the corresponding one of the current steering elements D11, D12, D13, . . . . Similarly, each of the redundant memory cells MB1, MB2, MB3, . . . is configured with: a corresponding one of current steering elements DB1, DB2, DB3, . . . ; and a corresponding one of variable resistance elements RB1, RB2, RB3, . . . connected in series with the corresponding one of the current steering elements DB1, DB2, DB3, . . . .

To be more specific, as shown in FIG. 5, one terminal of each of the variable resistance elements R11, R21, R31, . . . in the main memory cell array 600 is connected to a corresponding one of the current steering elements D11, D21, D31, . . . , and the other terminal of each of the variable resistance elements R11, R21, R31, . . . is connected to the bit line BL1. One terminal of each of the variable resistance elements R12, R22, R32, . . . is connected to a corresponding one of the current steering elements D12, D22, D32, . . . , and the other terminal of each of the variable resistance elements R12, R22, R32, . . . is connected to the bit line BL2. One terminal of each of the variable resistance elements R13, R23, R33, . . . is connected to a corresponding one of the current steering elements D13, D23, D33, . . . , and the other terminal of each of the variable resistance elements R13, R23, R33, . . . is connected to the bit line BL3. Moreover, one terminal of each of the current steering elements D11, D12, D13, . . . is connected to a corresponding one of the variable resistance elements R11, R12, R13, . . . , and the other terminal of each of the current steering elements D11, D12, D13, . . . is connected to the word line WL1. One terminal of each of the current steering elements D21, D22, D23, . . . is connected to a corresponding one of the variable resistance elements R21, R22, R23, . . . , and the other terminal of each of the current steering elements D21, D22, D23, . . . is connected to the word line WL2. One terminal of each of the current steering elements D31, D32, D33, . . . is connected to a corresponding one of the variable resistance elements R31, R32, R33, . . . , and the other terminal of each of the current steering elements D31, D32, D33, . . . is connected to the word line WL3.

Similarly, one terminal of each of the variable resistance elements RB1, RB2, RB3, . . . in the redundant memory cell array 610 is connected to a corresponding one of the current steering elements DB1, DB2, DB3, . . . , and the other terminal of each of the variable resistance elements RB1, RB2, RB3, . . . is connected to the redundant bit line BLR1, . . . . One terminal of each of the current steering elements DB1, DB2, DB3, . . . is connected to a corresponding one of the variable resistance elements RB1, RB2, RB3, . . . , and the other terminal of the current steering elements DB1, DB2, DB3, . . . is connected to a corresponding one of the word lines WL1, WL2, WL3, . . . .

In Embodiment 1, the variable resistance element is connected on the bit line side and the current steering element is connected on the word line side. However, it should be noted that the current steering element may be connected on the bit line side and that the variable resistance element may be connected on the word line side. Moreover, the number of the redundant bit line BLR1, . . . in the redundant memory cell array may be at least one in Embodiment 1, and more than one redundant bit line may be provided according to the number of memory cells 100 in columns in the redundant memory cell array.

The word line selection circuit 203 receives row address information from the address signal input circuit 208, and applies a voltage supplied from the write circuit 205 to the word line selected from among the word lines WL1, WL2, WL3, . . . based on the received row address information. In addition, the word line selection circuit 203 can apply a predetermined nonselected-row voltage (a voltage between Vss and Vwl or a voltage between Vss and Vwh) to a nonselected word line or fix the nonselected word line to an inactive state, i.e., a high impedance (Hi-Z) state.

Similarly, the bit line selection circuit 204 receives column address information from the address signal input circuit 208 and an address match determination signal from the address comparison circuit 214. Then, based on the received column address information and the address match determination signal, the bit line selection circuit 204 applies a voltage supplied from the write circuit 205 or the read circuit 206 to the bit line selected from among the bit lines BL1, BL2, BL3, ... and the redundant bit line BLR1, .... In addition, the bit line selection circuit 204 can apply a predetermined nonselected-column voltage (a voltage between Vss and Vwl, a voltage between Vss and Vwh, or a voltage between Vss and Vbl) to a nonselected bit line or fix the nonselected bit line to the high impedance (Hi-Z) state.

It should be noted that each of the word line selection circuit 203 and the bit line selection circuit 204 corresponds to a memory cell selection circuit according to the present invention.

The write circuit 205 receives a write signal outputted from the control circuit 209. Then, by applying the write voltage to the memory cell selected by the word line selection circuit 203 and the bit-line section circuit 204, the write circuit 205 can change the state of this memory cell.

In the variable resistance nonvolatile memory device 200 shown in FIG. 5, when the first low-resistance write voltage Vwl1 that is high in potential with respect to the BL1 is applied to the WL1 in the write mode, the variable resistance element R11 of the normal memory cell M11 changes to the first low resistance state. Similarly, when the first high-resistance write voltage Vwh1 that is high in potential with respect to the WL1 is applied to the BL1, the variable resistance element R11 of the normal memory cell M11 changes to the first high resistance state.

In the regular read mode, the read circuit 206 applies a read voltage "Vblr" between the word line selected by the word line selection circuit 203 and the bit line selected by the bit line selection circuit 204. Then, by determining a memory cell current passing through the memory cell using the sense amplifier 300, the read circuit 206 can read a storage state of the memory cell. Moreover, in the current-steering-element characteristic determination mode, the read circuit 206 applies a cell characteristic determination voltage "Vblt" between the word line selected by the word line selection circuit 203 and the bit line selected by the bit line selection circuit 204. Then, by determining a memory cell current passing through the memory cell using the sense amplifier 300, the read circuit 206 can determine the current-steering-element characteristic of the memory cell. It should be noted that, in the variable-resistance-element characteristic determination mode, the read circuit 206 performs the same operation as in the regular read mode and, therefore, the explanation is omitted here.

Here, the bit-line control voltage generation circuit 500 generates a read clamp voltage "Vcr" and a cell characteristic determination clamp voltage "Vct" according to the regular read mode and the current-steering-element characteristic determination mode, respectively, to set a potential of the bit line selected by the bit line selection circuit 204. With the application of the read clamp voltage Vcr to the normal memory cell, the current steering element of the normal memory cell is set to an ON state. With the application of the cell characteristic determination clamp voltage Vct to the normal memory cell, the current steering element of the normal memory cell is set to an OFF state. Here, note that the read clamp voltage Vcr corresponds to a first voltage according to the present invention and that the cell characteristic determination clamp voltage Vct corresponds to a second voltage according to the present invention.

The bit-line control voltage switching circuit 400 can switch between the voltages to be supplied to the sense amplifier 300, according to the regular read mode and the current-steering-element characteristic determination mode as follows. In the regular read mode, the bit-line control voltage switching circuit 400 supplies, to the sense amplifier 300, the read clamp voltage Vcr outputted from the bit-line control voltage generation circuit 500. In the current-steering-element characteristic determination mode, the bit-line control voltage switching circuit 400 supplies, to the sense amplifier 300, the cell characteristic determination clamp voltage Vct outputted from the bit-line control voltage generation circuit 500.

According to the corresponding one of the regular read mode and the current-steering-element characteristic determination mode, the sense amplifier 300 sets the potential of the bit line to the read voltage Vblr or the cell characteristic determination voltage Vblt based on the read clamp voltage Vcr or the cell characteristic determination clamp voltage Vct supplied by the bit-line control voltage switching circuit 400.

Moreover, in the regular read mode, the sense amplifier 300 determines whether the state of the variable resistance element in the memory cell is the first low resistance state or the first high resistance state, on the basis of the memory cell current read via the bit line selection circuit 204. Then, the sense amplifier 300 outputs a result of the determination to an external source via the data signal input-output circuit 207. Furthermore, in the current-steering-element characteristic determination mode, the sense amplifier 300 determines whether the state of the memory cell is a normal state or a faulty state, on the basis of the memory cell current read via the bit line selection circuit 204. Then, the sense amplifier 300 outputs a result of the determination to the fault address memory circuit 213 as well as to an external source via the data signal input-output circuit 207.

The control circuit 209 operates as follows. In the write mode, the control circuit 209 outputs, to the write circuit 205, a signal indicating the application of a write voltage, according to input data "Din" received by the data signal input-output circuit 207. In the regular read mode and the variable-resistance-element characteristic determination mode, the control circuit 209 outputs, to the read circuit 206, a signal indicating the application of a read voltage. In the current-steering-element characteristic determination mode, the control circuit 209 outputs, to the read circuit 206, a signal indicating the application of a cell determination voltage used for determining the characteristic of the current steering element. In the rescue mode, the control circuit 209 outputs, to the write circuit 205, a signal indicating the application of a write voltage for setting the normal memory cell connected to the bit line or the word line that includes the faulty memory cell to the second high resistance state where the resistance value is higher than the resistance value in the first low resistance state, and also outputs a signal indicating a rescue process to the main memory unit 201.

The address signal input circuit 208 receives address information from an external source. Then, based on the received address information, the address signal input circuit 208 outputs row address information to the word line selection circuit 203 and also outputs column address information to the bit line selection circuit 204. Here, the address information refers to information indicating an address of a specific memory cell included in the memory cell array 202. The column address information refers to address information indicating a specific column in the memory cell array 202. The row address information refers to address information indicating a specific row in the memory cell array 202. The address signal input circuit 208 outputs the address information (i.e., the column address information and the row address information) to the fault address memory circuit 213 and the address comparison circuit 214.

Figure 6A:
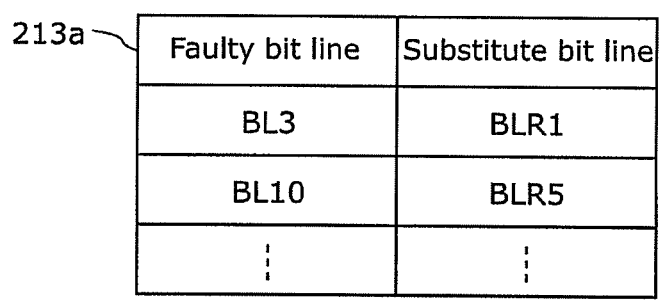
FIG. 6A is a diagram showing an example of an address conversion table.

When the selected memory cell is determined to be faulty in the current-steering-element characteristic determination mode of the read circuit 206, the fault address memory circuit 213 stores, as a fault address, the column address information received from the address signal input circuit 208. To be more specific, the fault address memory circuit 213 includes an address conversion table 213a as shown in FIG. 6A. FIG. 6A is a diagram showing an example of the address conversion table included in the fault address memory circuit 213. FIG. 6A shows a case where a faulty memory cell is rescued on a bit line basis. As shown in FIG. 6A, the address conversion table 213a stores a faulty bit line having a faulty memory cell in association with a redundant bit line having a redundant memory cell serving as a substitute destination. It should be noted that, when a faulty memory cell is rescued, the substitution may be made not only on a bit line basis, but also on a word line basis or on a memory cell basis. When the memory cell is rescued on a word line basis, the address conversion table 213a may store a faulty word line having a faulty memory cell in association with a redundant word line serving as a substitute destination of the faulty word line. When the memory cell is rescued on a memory cell basis, the address conversion table 213a may store a faulty memory cell in association with a redundant memory cell serving as a substitute destination of the faulty memory cell.

The address comparison circuit 214 compares the column address information received from the address signal input circuit 208 with a faulty-bit-line address stored in the fault address memory circuit 213. Then, the address comparison circuit 214 outputs, to the bit line selection circuit 204, an address match determination signal indicating whether or not the column address information matches the faulty-bit-line address. Suppose that the column address information received from the address signal input circuit 208 matches the faulty-bit-line address stored in the fault address memory circuit 213. In this case, in the rescue mode described later, the faulty bit line (the BL3, for example) is substituted by the redundant bit line (the BLR1, for example) serving as the substitution destination for writing and reading data, according to the address conversion table 213a shown in FIG. 6A.

The write power source 210 includes the low-resistance write power source 211 and the high-resistance write power source 212. Each of the outputs of the low-resistance write power source 211 and the high-resistance write power source 212 is supplied to the write circuit 205 of the main memory unit 201.

Figure 6B:
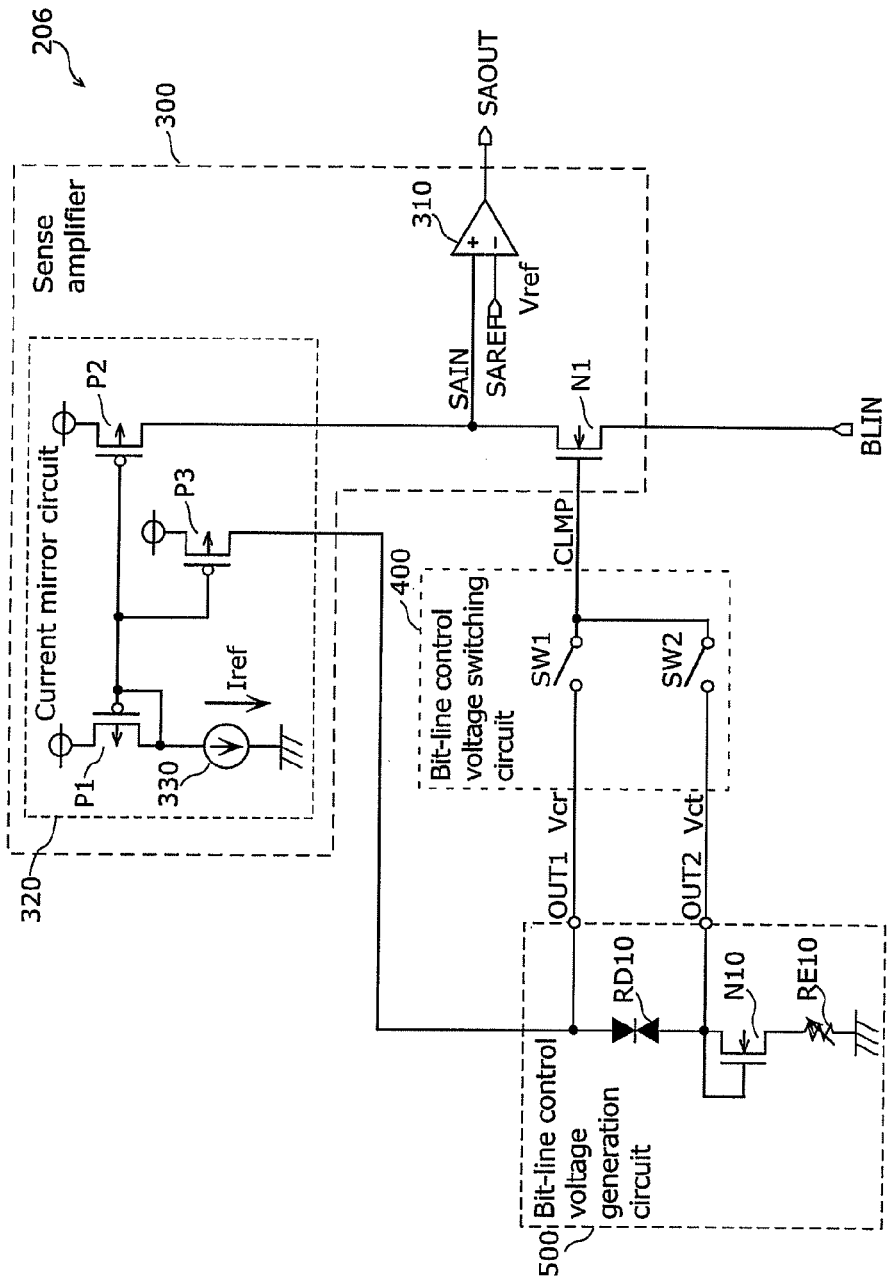
FIG. 6B is a circuit diagram showing an example of a configuration of a read circuit.

FIG. 6B is a circuit diagram showing an example of a configuration of the read circuit 206 shown in FIG. 5.

The read circuit 206 includes the sense amplifier 300, the bit-line control voltage switching circuit 400, and the bit-line control voltage generation circuit 500.

The sense amplifier 300 includes a comparison circuit 310, a current mirror circuit 320, and a bit-line voltage control transistor N1. The current mirror circuit 320 includes a P-channel metal oxide semiconductor (PMOS) transistor P1, a PMOS transistor P2, a PMOS transistor P3, and a constant current circuit 330. Each of source terminals of the PMOS transistor P1, the PMOS transistor P2, and the PMOS transistor P3 of the current mirror circuit 320 is connected to a power source. Gate terminals of the PMOS transistor P1, the PMOS transistor P2, and the PMOS transistor P3 are connected to each other, and are also connected to a drain terminal of the PMOS transistor P1 and one terminal of the constant current circuit 330. The other terminal of the constant current circuit 330 is connected to a ground potential. A drain terminal of the PMOS transistor P2 is connected to one input terminal (a plus terminal, for example) of the comparison circuit 310 and to a drain terminal of the bit-line voltage control transistor N1. A drain terminal of the PMOS transistor P3 is connected to the bit-line control voltage generation circuit 500. A gate terminal of the bit-line voltage control transistor N1 is connected to an output terminal of the bit-line control voltage switching circuit 400. A source terminal of the bit-line voltage control transistor N1 is connected to the bit line selection circuit 204 via a terminal "BLIN" of the read circuit 206. The other terminal (a minus terminal, for example) of the comparison circuit 310 is connected to a terminal "SAREF" of the read circuit 206. An output terminal of the comparison circuit 310 is connected to the data signal input-output circuit 207 via an output terminal "SAOUT" of the read circuit 206, and then outputs the data to an external source.

Here, a reference current "Iref" passing through the constant current circuit 330 is amplified (or attenuated) according to a mirror ratio M2 (=P2/P1) determined by a size ratio between the PMOS transistor P1 and the PMOS transistor P2. As a result, a load current "Ild2" (=Iref*the mirror ratio M2) of the PMOS transistor P2 is determined. Moreover, the reference current Iref passing through the constant current circuit 330 is amplified (or attenuated) according to a mirror ratio M3 (=P3/P1) determined by a size ratio between the PMOS transistor P1 and the PMOS transistor P3. As a result, a load current "Ild3" (=Iref*the mirror ratio M3) of the PMOS transistor P3 is determined. When the PMOS transistor P2 and the PMOS transistor P3 are made in the same size, the load currents can be set at the same current value (Ild2=Ild3).

The clamp voltage (Vcr or Vct) outputted from the bit-line control voltage switching circuit 400 is applied to the gate terminal of the bit-line voltage control transistor N1. Therefore, a voltage reduced from the clamp voltage (Vcr or Vct) outputted from the bit-line control voltage switching circuit 400 by a threshold voltage "Vtn" of the bit-line voltage control transistor N1 is applied to the source terminal (the terminal BLIN) of the bit-line voltage control transistor N1, and is thus applied to the selected bit line via the bit line selection circuit 204.

Moreover, the potential of the drain terminal (a terminal "SAIN") of the bit-line voltage control transistor N1 is applied to the plus terminal of the comparison circuit 310. Also, a reference voltage "Vref" is applied to the minus terminal of the comparison circuit 310 from the terminal SAREF. The comparison circuit 310 compares the reference voltage Vref applied to the minus terminal and the potential of the terminal SAIN applied to the plus terminal. When the potential of the terminal SAIN is lower than the potential of the terminal SAREF, the comparison circuit 310 outputs a potential L to the output terminal. When the potential of the terminal SAIN is higher than the potential of the terminal SAREF, the comparison circuit 310 outputs a potential H to the output terminal. By doing so, the comparison circuit 310 outputs the state of the memory cell 10 to an external source via the data signal input-output circuit 207.

To be more specific, when the current passing through the memory cell 10 is high, the potential of the terminal SAIN quickly changes from the potential H to the potential L. When the current passing through the memory cell 10 is low, the potential of the terminal SAIN slowly changes from the potential H to the potential L or is maintained at the potential H. Then, the comparison circuit 310 compares the potential of the terminal SAIN and the potential of the terminal SAREF at a predetermined output sense timing. When the potential of the terminal SAIN is lower, the comparison circuit 310 outputs the potential L to the output terminal SAOUT and thus determines that the current passing through the memory cell 10 is high. Similarly, when the potential of the terminal SAIN is higher, the comparison circuit 310 outputs the potential H to the output terminal SAOUT and thus determines that the current passing through the memory cell 10 is low. Although not illustrated in FIG. 6B, it should be noted that the reference voltage Vref applied from the terminal SAREF may be generated in the variable resistance nonvolatile memory device 200 or applied from an external terminal.

The voltage to be applied to the gate terminal of the bit-line voltage control transistor N1 is generated by the bit-line control voltage generation circuit 500. The bit-line control voltage generation circuit 500 includes a reference current steering element RD10, an N-channel metal oxide semiconductor (NMOS) transistor N10, and a reference variable resistance element RE10.

One terminal of the reference current steering element RD10 is connected to the drain terminal of the PMOS transistor P3 of the current mirror circuit 320 and to an output terminal "OUT1" of the bit-line control voltage generation circuit 500. The reference current steering element RD10 outputs the read clamp voltage Vcr from the output terminal. The other terminal of the reference current steering element RD10 is connected to the drain terminal and the gate terminal of the NMOS transistor N10 and to an output terminal "OUT2". The reference current steering element RD10 outputs the cell-characteristic clamp voltage Vct from the output terminal.

A source terminal of the NMOS transistor N10 is connected to one terminal of the reference variable resistance element RE10. The other terminal of the reference variable resistance element RE10 is grounded.

Here, the reference current steering element RD10 is configured with the same element as included in the memory cell array 202, such as the current steering elements D11, D12, D13, . . . . Also, the reference variable resistance element RE10 is configured with the same element as included in the memory cell array 202, such as the variable resistance elements R11, R12, R13, . . . . Although not explicitly described here, the reference variable resistance element RE10 can be set to the high resistance state or the low resistance state as is the case with the variable resistance element included in the memory cell array 202. In order to detect a memory cell at least in the low resistance state, it is preferable for the resistance value of the reference variable resistance element RE10 to be set at a value of when the memory cell array 202 is in an average high resistance state.

The read clamp voltage Vcr outputted from the output terminal OUT1 of the bit-line control voltage generation circuit 500 and the cell characteristic determination clamp voltage Vct outputted from the output terminal OUT2 are expressed by Expression 1 and Expression 2, respectively, as follows. Here, note that: a voltage applied to the reference variable resistance element RE10 is represented by Vre (that is approximately the same as the voltage applied to the variable resistance elements R11, R12, R13, . . . ); a threshold voltage of the NMOS transistor N10 is represented by Vtn (that is approximately the same as the threshold voltage of the NMOS transistor N1); and a threshold voltage of the reference current steering element RD10 is represented by VF (that is approximately the same as the threshold voltage of the current steering elements D11, D12, D13, . . . ).

$$Vcr = Vre + Vtn + VF \quad \text{Expression 1}$$

$$Vct = Vre + Vtn \quad \text{Expression 2}$$

The NMOS transistor N10 is in the same transistor size as the bit-line voltage control transistor N1 of the sense amplifier 300. The PMOS transistor P3 of the sense amplifier 300 is in the same transistor size as the PMOS transistor P2. Note here that, as long as the size ratio between the bit-line voltage control transistor N1 and the PMOS transistor P2 is maintained, the NMOS transistor N10 and the PMOS transistor P3 may be made in smaller sizes.

With this configuration, the output terminal OUT1 outputs a pseudo voltage higher than the voltage of the terminal BLIN of the read circuit 206 (i.e., the bit line voltage applied in an operation to read a memory cell) by the threshold voltage Vtn of the bit-line voltage control transistor N1. Moreover, the output terminal OUT2 outputs a voltage lower than the voltage of the output terminal OUT1 by a threshold voltage VF' of the reference current steering element RD10 (the threshold voltage VF' may be equal to the threshold voltage VF of the current steering element of the memory cell). It should be noted that the voltages outputted from the output terminal OUT1 and the output terminal OUT2 correspond to a first output and a second output, respectively, in Embodiment 1.

The bit-line control voltage switching circuit 400 includes switches "SW1" and "SW2". One terminal of the switch SW1 of the bit-line control voltage switching circuit 400 is connected to the output terminal OUT1 of the bit-line control voltage generation circuit 500. One terminal of the switch SW2 is connected to the output terminal OUT2 of the bit-line control voltage generation circuit 500. The other terminal of the switch SW1 and the other terminal of the switch SW2 are connected to each other, and are also connected to the gate terminal of the bit-line voltage control transistor N1 of the sense amplifier 300. In the regular read mode of the sense amplifier 300, the bit-line control voltage switching circuit 400 sets the switch SW1 to an ON state and the switch SW2 to an OFF state. By doing so, the bit-line control voltage switching circuit 400 outputs the read clamp voltage Vcr of the output terminal OUT1 of the bit-line control voltage generation circuit 500 to the gate terminal of the transistor N1. In the current-steering-element characteristic determination mode, the bit-line control voltage switching circuit 400 sets the switch SW1 to the OFF state and the switch SW2 to the ON state. By doing so, the bit-line control voltage switching circuit 400 outputs the cell characteristic determination clamp voltage Vct of the output terminal OUT2 of the bit-line control voltage generation circuit 500 to the gate terminal of the transistor N1

With this configuration, the voltage to be applied to the selected bit line does not exceed the voltage lower than the voltage to be applied to the gate terminal of the bit-line voltage control transistor N1 by the threshold voltage Vtn of the transistor N1. Therefore, the read voltage Vblr applied to the bit line in the regular read mode and the cell characteristic determination voltage Vblt applied to the bit line in the current-steering-element characteristic determination mode can be represented by Expression 3 and Expression 4, respectively, as follows.

$$Vblr \leq Vre + VF \quad \text{Expression 3}$$

$$Vblt \leq Vre \quad \text{Expression 4}$$

Next, an operation to read a resistance state of a memory cell in the regular read mode is described.

Figure 7:
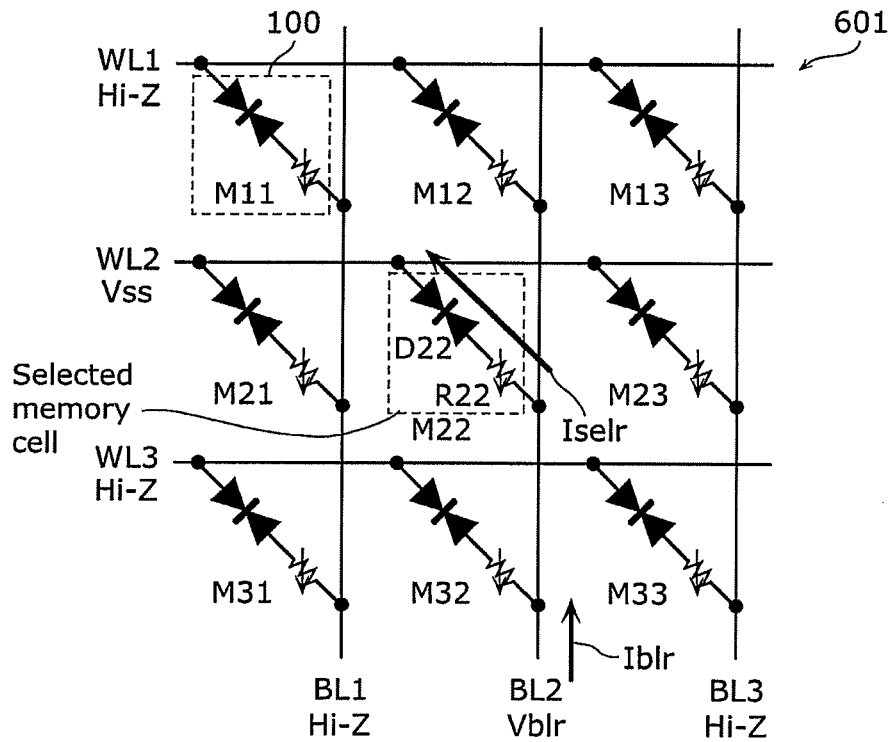
FIG. 7 is a circuit diagram explaining a current path in a read mode.
Figure 8:
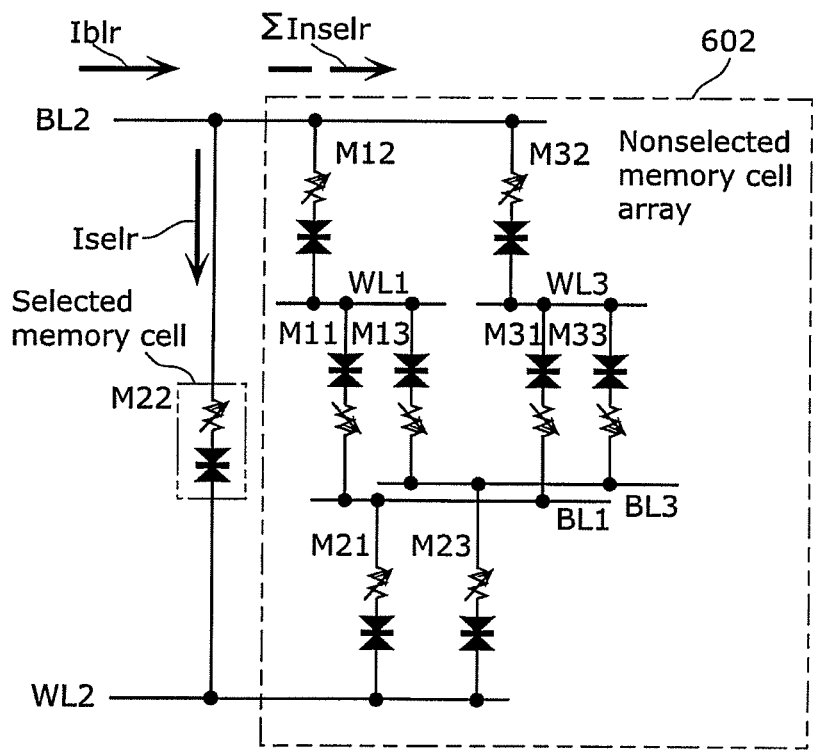
FIG. 8 is an equivalent circuit diagram of the circuit diagram shown in FIG. 7.

FIG. 7 is a circuit diagram explaining a current path in the main memory cell array 600. For the sake of simplifying the explanation, this diagram shows an example where the memory cell M22 is to be selected from the main memory cell array 600 configured with a 3-by-3 array in FIG. 5 described above. FIG. 8 is an equivalent circuit diagram of the circuit diagram shown in FIG. 7.

As an example of reading a resistance state of a memory cell in the case where all memory cells included in a main memory cell array 601 shown in FIG. 7 are normal, reading a resistance state of the memory cell M22 is described.

Suppose that the resistance state of the memory cell M22 is to be read in the regular read mode. In order to select the memory cell M22: the potential Vss is applied to the word line WL2 selected by the word line selection circuit 203; the read voltage Vblr represented by Expression 3 is applied to the bit line BL2 selected by the bit line selection circuit 204; and the nonselected bit lines BL1 and BL3 and the nonselected word lines WL1 and WL3 are fixed to the high impedance states (Hi-Z). Although the nonselected bit lines BL1 and BL3 and the nonselected word lines WL1 and WL3 are fixed to the high impedance states in Embodiment 1, each of these lines may be set at a voltage lower than or equal to the voltage applied between the selected bit line BL2 and the selected word line WL2.

As shown in FIG. 8, when the memory cell 22 is selected, each of the memory cells M11, M12, M13, M21, M23, M31, M32, and M33 in the nonselected memory cell array 602 is expressed equivalently as one of three memory cells connected in series in parallel to the memory cell M22. To be more specific, in a shortest current path from the selected bit line BL2 to the selected word line WL2, a nonselected-memory-cell sum current "ΣInselr" passing through the nonselected memory cell array 602 flows into a plurality of current paths via the nonselected memory cells connected in series in at least three stages. A plurality of nonselected memory cells are connected in parallel for each of the three stages. In a first stage, the nonselected memory cells M12 and M32 connected to the selected bit line BL2 are connected in parallel. In a second stage, the nonselected memory cells M11, M13, M31, and M33 connected to the corresponding nonselected bit line BL1 or BL3 and the corresponding nonselected word line WL1 or WL3 are connected in parallel. In a third stage, the nonselected memory cells M21 and M23 connected to the selected word line WL2 are connected in parallel. When the size of the memory cell array is increased, the number of nonselected memory cells connected in parallel in the second stage is increased and the impedance is reduced. Suppose that an M number (=100) of memory cells are arranged in a row direction and that an N number (=100) of memory cells are arranged in a column direction. In this case, the number of memory cells in the second stage is calculated by (M−1)*(N−1) (i.e., approximately 10000 memory cells), and thus the impedance is vanishingly low.

On account of this, the voltage is divided to be applied to the nonselected memory cells M12, M32, M21, and M23 arranged in the first and second stages, according to the respective impedances of these nonselected memory cells. Suppose that the number of memory cells in the row direction and the number of memory cells in the column direction are the same, and that each of the memory cells has the same resistance state. In this case, about one half or less of the read voltage Vblr applied between the selected bit line BL2 and the selected word line WL2 is applied to the nonselected memory cells M12, M32, M21, and M23 arranged in the first and second stages. Thus, when the nonselected memory cells M11, M12, M13, M21, M23, M31, M32, and M33 are normal as indicated by the characteristic (1) shown in FIG. 4, a voltage lower than or equal to the threshold voltage VF is applied to the respective current steering elements D11, D12, D13, D21, D23, D31, D32, and D33 of the nonselected memory cells M11, M12, M13, M21, M23, M31, M32, and M33. Thus, each of these memory cells is brought into the OFF state. Hence, the current ΣInselr that is the sum of currents passing through the nonselected memory cells M11, M12, M13, M21, M23, M31, M32, and M33 is only a slight OFF current lower than 1 µA.

More specifically, as expressed by Expression 5, a selected-bit-line current "Iblr" passing through the selected bit line Bl2 when the resistance state of the memory cell M22 is read is a sum of a selected-memory-cell current "Iselr" and the nonselected-memory-cell sum current ΣInselr. Here, since the value of the nonselected-memory-cell sum current ΣInselr is vanishingly low, the selected-bit-line current Iblr passing through the selected bit line BL2 can be approximated as expressed by Expression 6. Accordingly, the memory cell current of the selected memory cell M22 can be read via the selected bit line BL2, and whether the variable resistance element R22 of the selected memory cell M22 is in the first high resistance state or the low resistance state can be determined.

$$Iblr = Iselr + \Sigma Inselr \qquad \text{Expression 5}$$

$$Iblr \approx Iselr \qquad \text{Expression 6}$$

It should be noted that the nonselected memory cell array 602 shown in FIG. 8 has at least four paths (a) to (d) below as nonselected-memory-cell current paths from the selected bit line BL2 to the selected word line WL2 via the nonselected memory cells in the three stages. Thus, the nonselected-memory-cell sum current ΣInselr is expressed by Expression 7.

(a) Inselr (a): M12 → M11 → M21
(b) Inselr (b): M12 → M13 → M23
(c) Inselr (c): M32 → M31 → M21
(d) Inselr (d): M32 → M33 → M23

$$\Sigma Inselr = Inselr(a) + Inselr(b) + Inselr(c) + Inselr(d) \qquad \text{Expression 7}$$

Here, when the current steering element D22 of the selected memory cell M22 has a short-circuit fault, the current steering element D22 can be assumed to be conducting and, therefore, the bit line voltage Vblr is applied entirely to the variable resistance element R22. Thus, regardless of whether the variable resistance element R22 of the memory cell M22 is in the first low resistance state or the first high resistance state, the aforementioned selected-bit-line current Iblr is higher than the memory cell current that flows in the case of a normal memory cell. This means that the current according to the resistance state of the variable resistance element R22 of the memory cell M22 cannot be read accurately and, therefore, the resistance state of the memory cell M22 cannot be detected.

It should be noted that a value of a memory cell current passing through a normal memory cell when the variable resistance element R22 is in the first low resistance state is referred to as a first predetermined value. Also note that a value of a memory cell current passing through a normal memory cell when the variable resistance element R22 is in the first high resistance state is referred to as a second predetermined value.

A method of determining a faulty memory cell including such a current steering element having a short-circuit fault and a method of rescuing the faulty memory cell are described later.

Moreover, an explanation is given about memory-cell reading in the case where the memory cell array includes, other than the selected memory cell, a faulty memory cell including a current steering element having a short-circuit fault.

Figure 9:
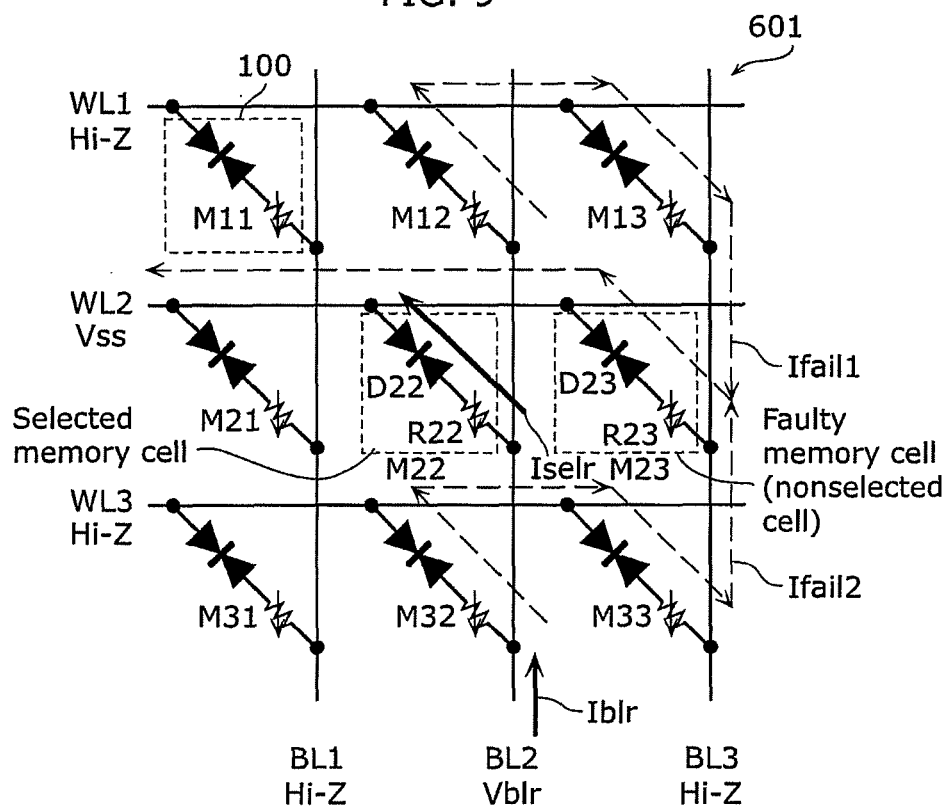
FIG. 9 is a circuit diagram explaining a current path in the read mode.
Figure 10:
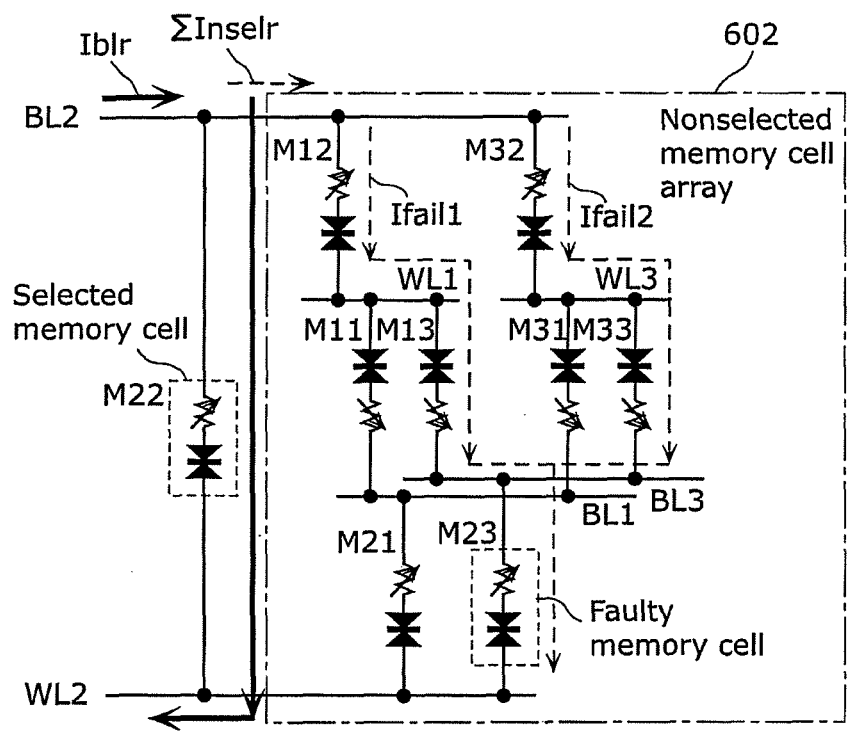
FIG. 10 is an equivalent circuit diagram of the circuit diagram shown in FIG. 9.

FIG. 9 is a circuit diagram explaining a current path of the case where one of the nonselected memory cells, such as the memory cell M23, in the main memory cell array 601 has a short-circuit fault. For the sake of simplifying the explanation, this circuit diagram shows an example where the memory cell M22 is selected from the above-described main memory cell array 600 in FIG. 5 configured with an array with 3 rows and 3 columns and the memory cell M23 has a short-circuit fault. FIG. 10 is an equivalent circuit diagram of the circuit diagram shown in FIG. 9.

The following describes the case where the resistance state of the memory cell M22 in the main memory cell array 601 shown in FIG. 9 is read in the read mode. As described above, in order to select the memory cell M22 to read the resistance state of the memory cell M22 in the regular read mode: the potential Vss is applied to the word line WL2 selected by the word line selection circuit 203; the read voltage Vblr represented by Expression 3 is applied to the bit line BL2 selected by the bit line selection circuit 204; and the nonselected bit lines BL1 and BL3 and the nonselected word lines WL1 and WL3 are fixed to the high impedance states (Hi-Z). Although the nonselected bit lines BL1 and BL3 and the nonselected word lines WL1 and WL3 are fixed to the high impedance states in Embodiment 1, each of these lines may be set at a voltage lower than or equal to the voltage applied between the selected bit line BL2 and the selected word line WL2.

For example, suppose here that the nonselected memory cell M23 in the main memory cell array 601 has a short-circuit fault. In this case, abnormal currents "Ifail1" and "Ifail2" passing through the main memory cell array 601 influence the whole of the main memory cell array 601. For this reason, the resistance state of the selected memory cell M22 cannot be detected accurately.

To be more specific, as shown in FIG. 10, when the nonselected memory cell M23 in the nonselected memory cell array 602 has a short-circuit fault, the memory cell M23 is in a state that allows the memory cell M23 to be assumed to be conducting. Then, since the resistance values decrease and the abnormal currents pass through the aforementioned nonselected-memory-cell current paths (b) and (d), the value of the nonselected-memory-cell sum current ΣInselr expressed by Expression 7 increases. Thus, the memory cell current passing through the selected memory cell M22 cannot be read accurately. That is, as long as the faulty memory cell M23 is connected to the main memory cell array 601, the abnormal current passes through the nonselected memory cell array 602 and this influences the whole of the main memory cell array 601 even when the faulty memory cell M23 is not selected. Hence, it is difficult for the resistance state of the variable resistance element R22 of the selected memory cell M22 to be detected.

The following describes a method that determines such a faulty memory cell having a short-circuit fault and rescues the faulty memory cell.

[Method of Determining Faulty Memory Cell]

Figure 11:
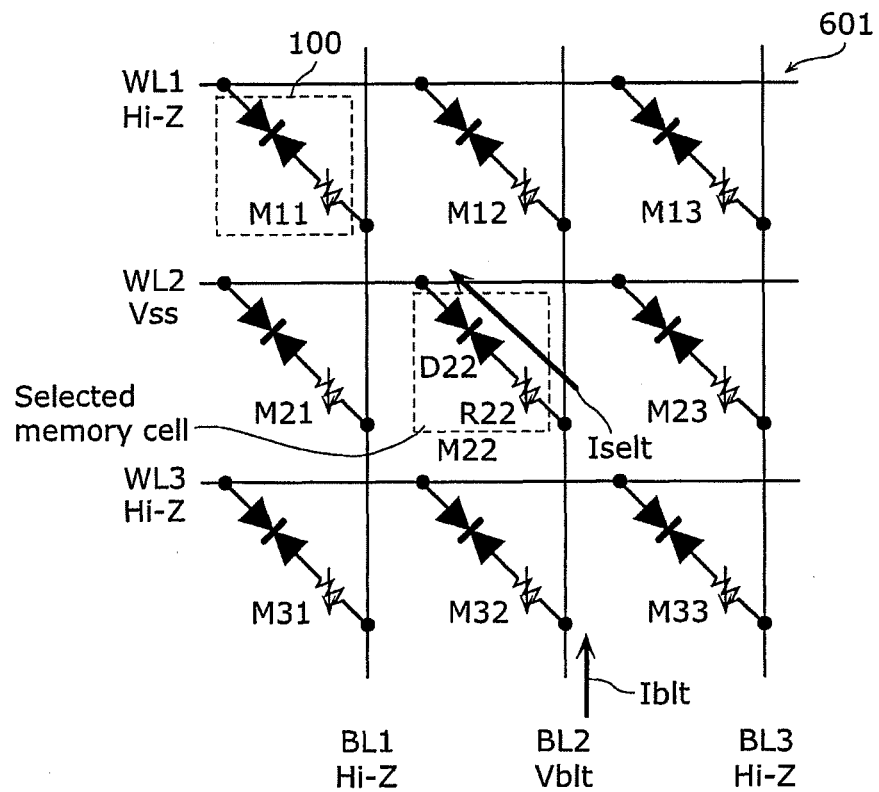
FIG. 11 is a circuit diagram explaining a current path in a cell characteristic determination mode.
Figure 12:
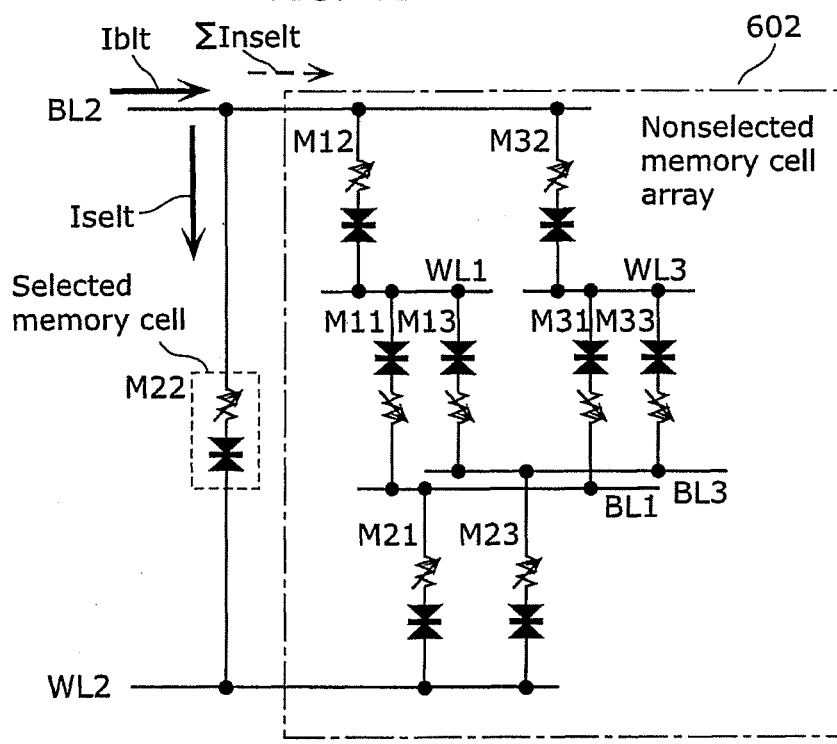
FIG. 12 is an equivalent circuit diagram of the circuit diagram shown in FIG. 11.

FIG. 11 is a circuit diagram explaining a current path of the memory cell array 202 in Embodiment 1. For the sake of simplifying the explanation, this circuit diagram shows an example where the memory cell M22 is to be selected from the above-described main memory cell array 600 in FIG. 5 configured with an array with 3 rows and 3 columns. FIG. 12 is an equivalent circuit diagram of the circuit diagram shown in FIG. 11.

Firstly, an explanation is given about determining, in the current-steering-element characteristic determination mode, the memory cell M22 included in the main memory cell array 601 shown in FIG. 11. In order to select the memory cell M22 in the current-steering-element characteristic determination mode in which whether the memory cell M22 is normal or has a short-circuit fault is determined: the potential Vss is applied to the word line WL2 selected by the word line selection circuit 203; the cell characteristic determination voltage Vblt (the second voltage) represented by Expression 4 is applied to the bit line BL2 selected by the bit line selection circuit 204; and the nonselected bit lines BL1 and BL3 and the nonselected word lines WL1 and WL3 are fixed to the high impedance states. To be more specific, the bit line voltage Vblt that is lower than the bit line voltage Vblr in the regular read mode by the threshold voltage VF' of the reference current steering element RD10 (approximately equal to the threshold voltage of the current steering element D22) is applied to the bit line BL2. Although the nonselected bit lines BL1 and BL3 and the nonselected word lines WL1 and WL3 are fixed to the high impedance states in Embodiment 1, each of these lines may be set at a voltage lower than or equal to the voltage applied between the selected bit line BL2 and the selected word line WL2.

As shown in FIG. 12, a selected-bit-line current "Iblt" passing through the selected bit line in the current-steering-element characteristic determination mode is a sum of a selected-memory-cell current "Iselt" passing through the selected memory cell M22 and a nonselected-memory-cell sum current "ΣInselt" passing through the nonselected memory cell array 602. Here, the cell characteristic determination voltage Vblt applied between the selected bit line BL2 and the selected word line WL2 is applied to the memory cell M22, and the selected-memory-cell current Iselt flows according to the cell characteristic state of the memory cell M22. On the other hand, the cell characteristic determination voltage Vblt applied between the selected bit line BL2 and the selected word line WL2 is applied to the nonselected memory cell array 602. Since each of the connection combinations has an equivalent serial connection of three memory cells, the cell characteristic determination voltage Vblt applied to the selected bit line BL2 is divided to be applied to the nonselected memory cells M11, M12, M13, M21, M23, M31, M32 and M33 according to the respective impedances of these nonselected memory cells. When the nonselected memory cells M11, M12, M13, M21, M23, M31, M32 and M33 in the nonselected memory cell array 602 are normal, only a voltage lower than or equal to the threshold voltage VF is applied to each of the respective current steering elements. Thus, each of the current steering elements enters the OFF state, meaning that the nonselected-memory-cell sum current ΣInselt of the nonselected memory cell array 602 hardly flows. To be more specific, the selected-bit-line current Iblt becomes approximately equal to the selected-memory-cell current Iselt. Accordingly, the cell characteristic state of the selected memory cell M22 can be read. Moreover, suppose that one of the nonselected memory cells M11, M12, M13, M21, M23, M31, M32 and M33 in the nonselected memory cell array 602 has a short-circuit fault. Even in this case, the cell characteristic determination voltage Vblt applied between the selected bit line BL2 and the selected word line WL2 is lower than the threshold voltage VF of the current steering element D22. On this account, even when one of the three memory cells connected in series has a short-circuit fault, only a voltage lower than or equal to the threshold voltage VF is applied to each of the respective current steering elements as long as the other two memory cells are normal. Thus, each of the current steering elements enters the OFF state, meaning that the nonselected-memory-cell sum current ΣInselt of the nonselected memory cell array 602 hardly flows. To be more specific, the selected-bit-line current Iblt becomes approximately equal to the selected-memory-cell current Iselt. Accordingly, by detecting the selected-bit-line current Iblt, the cell characteristic state of the selected memory cell M22 can be read.

More specifically, as expressed by Expression 8, the selected-bit-line current Iblt passing through the selected bit line Bl2 when the resistance state of the memory cell M22 is read is a sum of the selected-memory-cell current Iselt and the nonselected-memory-cell sum current ΣInselt. Here, since the value of the nonselected-memory-cell sum current ΣInselt is vanishingly low, the selected-bit-line current Iblt passing through the selected bit line BL2 can be approximated as expressed by Expression 9. Accordingly, the memory cell current of the selected memory cell M22 can be read via the selected bit line BL2, and whether the memory cell M22 is normal or has a short-circuit fault can be determined.

$$Iblt = Iselt + \Sigma Inselt \quad \text{Expression 8}$$

$$Iblt \approx Iselt \quad \text{Expression 9}$$

Here, when the selected memory cell M22 is normal and the bit line voltage Vblt represented by Expression 4 is applied to the memory cell M22, a voltage lower than or equal to the threshold voltage VF is applied to the current steering element D22. As a result, the current steering element D22 enters the OFF state. Thus, regardless of the resistance state of the variable resistance element R22, the selected-bit-line current Iblt hardly flows.

On the other hand, when the current steering element D22 of the memory cell M22 has a short-circuit fault, the current steering element D22 is in a state where the resistance value is lower than the resistance value in a normal conducting state. Thus, the bit line voltage Vblt is applied entirely to the variable resistance element R22. Here, when the variable resistance element R22 is in the first low resistance state, the selected-bit-line current Iblt flows according to the resistance value of the variable resistance element R22. Then, the read circuit 206 can detect the current and, accordingly, the memory cell M22 is determined to have a short-circuit fault. Here, the read circuit 206 may determine that "the memory cell M22 is faulty" as follows. For example, suppose that when the threshold voltage (the first voltage) at which a normal current steering element enters the ON state is applied to the variable resistance element in the first low resistance state and the normal current steering element, the normal current steering element can be assumed to be in the OFF state (where the maximum OFF current flows). Then, when a current higher than the maximum OFF current passing through the normal current steering element (the value of the maximum OFF current is the first predetermined value) passes through the current steering element D22 having a short-circuit fault, the memory cell M22 may be determined to be faulty.

Moreover, suppose that the variable resistance element R22 is in the first high resistance state. In this case, the read circuit 206 may determine that "the memory cell M22 is faulty" as follows. For example, suppose that when the threshold voltage (the second voltage) at which a normal current steering element enters the ON state is applied to the variable resistance element in the first high resistance state and the normal current steering element, the normal current steering element can be assumed to be in the OFF state (where the maximum OFF current flows). Then, when a current higher than the maximum OFF current passing through the normal current steering element (the value of the maximum OFF current is the second predetermined value) passes through the current steering element D22 having a short-circuit fault, the memory cell M22 may be determined to be faulty.

Here, when the variable resistance element R22 is in the first high resistance state, the selected-bit-line current Iblt hardly passes through the variable resistance R22. For this reason, it may be difficult to determine whether or not the current steering element D22 is faulty.

More specifically, in the current-steering-element characteristic determination mode of the variable resistance nonvolatile memory device 200 including the bidirectional current steering element in Embodiment 1, at least when the variable resistance element R22 of the selected memory cell M22 is in the first low resistance state, whether the current steering element D22 of the selected memory cell M22 is normal or has a short-circuit fault can be determined and thus an address of the faulty memory cell can be specified. When the variable resistance element R22 of the selected memory cell M22 is in the first high resistance state, it may be difficult to accurately determine the state of the current steering element D22 of the selected memory cell M22 (i.e., determine whether the current steering element D22 is normal or has a short-circuit fault). However, by implementing the current-steering-element characteristic determination mode after bringing the variable resistance element R22 of the selected memory cell M22 into the first low resistance state, whether the current steering element D22 of the selected memory cell M22 is in the normal state or the faulty state can be determined.

In each of the nonselected-memory-cell current paths in the nonselected memory cell array 602, three memory cells are connected in series. On this account, even when the memory cells with at least two bits or less are faulty in the leakage current path in the nonselected memory cell array 602, the nonselected-memory-cell sum current ΣInselt does not flow when the remaining one bit is normal. Therefore, by determining the selected-bit-line current Iblt passing through the selected bit line BL2, the address of the faulty memory cell can be specified. For example, when faulty memory cells exceeding two bits, such as M12, M11, and M23, are present, only faulty cells with two bits or less are present in each of the leakage current paths (a) to (d). Thus, the nonselected-memory-cell current Insel hardly flows, meaning that the address of the faulty memory cell can be similarly specified. When all the memory cells in one leakage current path, i.e., all the three bits, are faulty, most of the memory cells included in the memory cell array 202 may be faulty. Therefore, the faulty memory cells can be easily detected through, for example, analysis.

FIG. 13 is a table (mode-specific truth table) showing the respective setting states in the regular read mode and the current-steering-element characteristic determination mode and the states of the output terminal SAOUT of the read circuit 206 shown in FIG. 6B. In FIG. 13, "L" represents a first logic output in Embodiment 1, and indicates that the sense amplifier 300 outputs the potential L when the memory cell is in the first low resistance state. Moreover, "H" represents a second logic output in Embodiment 1, and indicates that the sense amplifier 300 outputs the potential H when the memory cell is in the first high resistance state.

In the regular read mode, the SW1 and the SW2 of the bit-line control voltage switching circuit 400 are in the ON state and the OFF state, respectively, as shown in FIG. 13. Thus, the read clamp voltage Vcr (=Vre+Vtn+VF) is applied to the gate terminal (a node "CLMP") of the bit-line voltage control transistor N1 of the sense amplifier 300 shown in FIG. 6B. Therefore, the voltage of the selected bit line BL connected to the terminal BLIN via the bit line selection circuit 204 is set lower than or equal to a voltage (Vre+VF) reduced from the read clamp voltage Vcr of the gate terminal of the bit-line voltage control transistor N1 of the sense amplifier 300 by the threshold voltage Vtn of the bit-line voltage control transistor N1.

Here, when the selected memory cell is normal, the current steering element of the memory cell is in the ON state and the memory cell current passing through the memory cell is determined according to the resistance state of the variable resistance element of the memory cell. With this memory cell current, the potential of the terminal SAIN of the sense amplifier 300 of the read circuit 206 changes from the potential H to the potential L via the bit line BL and the bit line selection circuit 204. Here, when the variable resistance element of the memory cell is in the first low resistance state, the memory cell current increases and thus the potential of the terminal SAIN quickly changes to the potential L. When the variable resistance element of the memory cell is in the first high resistance state, the memory cell current decreases and thus the potential of the terminal SAIN slowly changes to the potential L or is maintained at the potential H. Then, the comparison circuit 310 compares the potential of the terminal SAIN and the potential of the terminal SAREF at a predetermined output timing. When the potential of the terminal SAIN is lower, the comparison circuit 310 outputs the potential L to the output terminal SAOUT and thus determines that the current passing through the memory cell is high. When the potential of the terminal SAIN is higher, the comparison circuit 310 outputs the potential H to the output terminal SAOUT and thus determines that the current passing through the memory cell is low. More specifically, when the sense amplifier 300 outputs the potential L, this means that the memory cell is in the first low resistance state. When the sense amplifier 300 outputs the potential H, this means that the memory cell is in the first high resistance state.

On the other hand, when the current steering element of the selected memory cell is faulty, most of the voltage applied to the memory cell is applied to the variable resistance element. For this reason, even when the variable resistance element is in the first high resistance state, a large amount of the memory cell current may flow. To be more specific, when the variable resistance element is in the first low resistance state, the sense amplifier 300 outputs the potential L which indicates that the memory cell is in the first low resistance state. However, when the variable resistance element is in the first high resistance state, the sense amplifier 300 outputs the potential L or the potential H. This means that the resistance state of the memory cell cannot be accurately determined.

As described thus far, in the regular read mode, when the memory cell is normal, the resistance state of the memory cell can be determined from the potential outputted by the sense amplifier 300. However, when the current steering element of the memory cell is faulty, the resistance state of the memory cell cannot be determined.

In the current-steering-element characteristic determination mode, the SW1 and the SW2 of the bit-line control voltage switching circuit 400 are in the OFF state and the ON state, respectively, as shown in FIG. 13. Thus, the cell characteristic determination clamp voltage Vct (=Vre+Vtn) is applied to the gate terminal (the node "CLMP") of the bit-line voltage control transistor N1 of the sense amplifier 300 shown in FIG. 6B. Therefore, the voltage of the selected bit line BL connected to the terminal BLIN via the bit line selection circuit 204 is set lower than or equal to a voltage (Vre) reduced from the cell characteristic determination clamp voltage Vct of the gate terminal of the bit-line voltage control transistor N1 of the sense amplifier 300 by the threshold voltage Vtn of the bit-line voltage control transistor N1.

Here, when the selected memory cell is normal, the current steering element of the memory cell is in the OFF state. Thus, regardless of the resistance state of the variable resistance element of the memory cell, the memory cell current hardly passes through the memory cell. When the sense amplifier 300 of the read circuit 206 determines this memory cell current via the bit line BL and the bit line selection circuit 204, the sense amplifier 300 outputs, as a result, the potential H regardless of the resistance state of the variable resistance element.

On the other hand, when the current steering element of the selected memory cell is faulty, most of the voltage applied to the memory cell is applied to the variable resistance element. For this reason, even when the variable resistance element is in the first high resistance state, a large amount of current may pass through the memory cell. To be more specific, when the variable resistance element is in the first low resistance state, the sense amplifier 300 outputs the potential L. Thus, it can be determined that the current steering element is faulty. However, when the variable resistance element is in the first high resistance state, the sense amplifier 300 outputs the potential L or the potential H. This means that the resistance state of the memory cell cannot be accurately determined.

When the variable resistance element of the memory cell is in the first high resistance state, whether the current steering element of the memory cell is in the normal state or the faulty state can be determined by implementing the current-steering-element characteristic determination mode after previously setting the variable resistance element to the first low resistance state. When a current having a value higher than the first predetermined value does not pass through the current steering element in the case where the variable resistance element is previously set to the first low resistance state, the current steering element can be clearly determined to be normal. In order to bring the variable resistance element into the first low resistance state, the write circuit 205 applies, to the WL1, the low-resistance write voltage Vwl that is high in potential with respect to the BL1. As a result, the variable resistance element changes to the first low resistance state.

As described, in the current-steering-element characteristic determination mode, at least when the variable resistance element of the memory cell is in the first low resistance state, the state of the current steering element of the memory cell can be determined. More specifically, when the variable resistance element is in the low resistance state and the current having the value higher than the first predetermined value passes through the current steering element, the current steering element of the memory cell can be determined to have a short-circuit fault. It should be noted that the value of the aforementioned maximum OFF current of the current steering element of the memory cell may be used as the first predetermined value.

When the variable resistance element of the memory cell is in the first high resistance state, the state of the current steering element of the memory cell cannot be determined accurately. However, by implementing the current-steering-element characteristic determination mode after bringing the variable resistance element into the first low resistance state, whether the current steering element of the memory cell is in the normal state or the faulty state can be determined. The memory cell determined to have the faulty current steering element may not be used, or a predetermined repair process may be performed on this memory cell.

Next, an example of a determination flow performed in the current-steering-element characteristic determination mode is described.

Figure 14A:
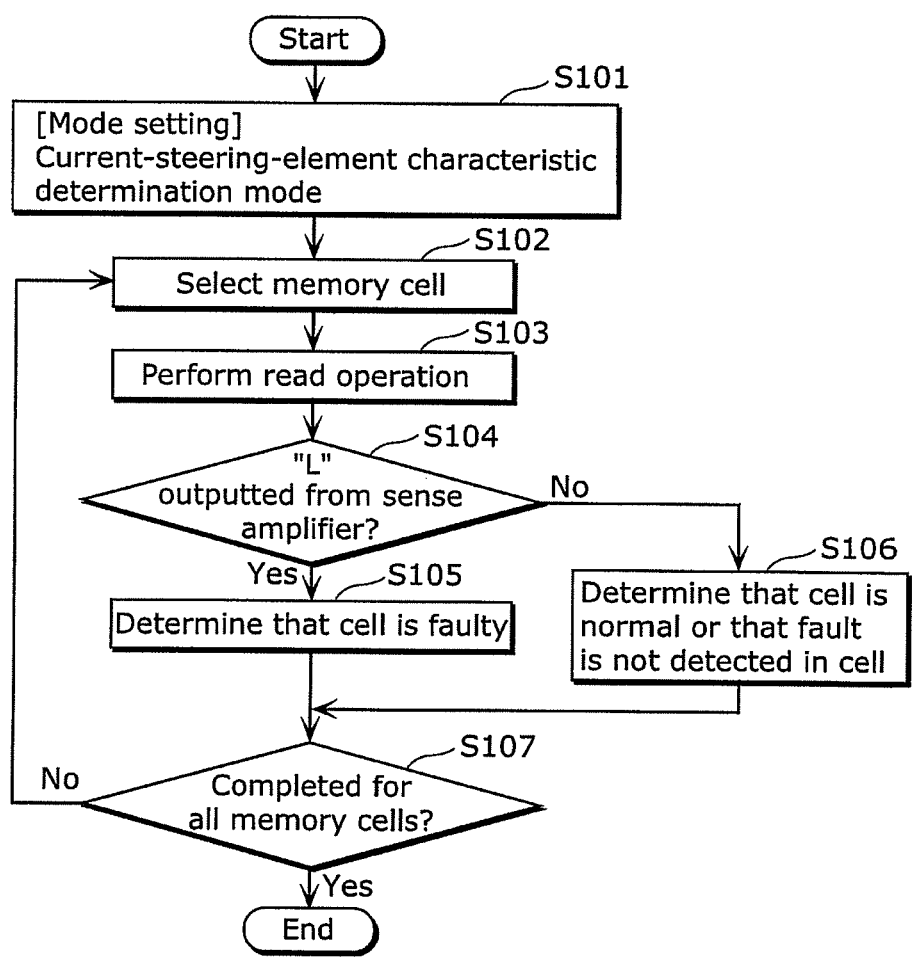
FIG. 14A is a diagram showing an example of a determination flow in a current-steering-element characteristic determination mode.

FIG. 14A is a diagram showing an example of the determination flow that is independent of the state of the variable resistance element of the memory cell and performed in the current-steering-element characteristic determination mode.

Firstly, when the read circuit 206 is set to the current-steering-element characteristic determination mode (step S101), the SW1 and the SW2 of the bit-line control voltage switching circuit 400 enter the OFF state and the ON state, respectively. With this, the output terminal OUT2 of the bit-line control voltage generation circuit 500 shown in FIG. 6B is selected, and the cell characteristic determination clamp voltage Vct is applied to the gate terminal of the bit-line voltage control transistor N1 of the sense amplifier 300.

After this, at least one of the memory cells included in the memory cell array 202 is selected by the word line selected by the word line selection circuit 203 and the bit line selected by the bit line selection circuit 204 (step S102). Moreover, a read operation is performed on the selected memory cell (step S103).

Then, the voltage outputted to the output terminal SAOUT of the sense amplifier 300 is determined (step S104). When the output voltage is the potential L, the current steering element of the memory cell is determined to be faulty (step S105). When the output voltage is the potential H, the memory cell is determined to be normal or to have the current steering element where a fault is not detected (step S106). After the determination is completed for the entire memory cell region (step S107), the current-steering-element characteristic determination mode is terminated.

To be more specific, according to the determination flow in the current-steering-element characteristic determination mode as shown in FIG. 14A, when the potential L is outputted to the output terminal SAOUT of the sense amplifier 300, the current steering element of the memory cell is determined to be faulty.

Figure 14B:
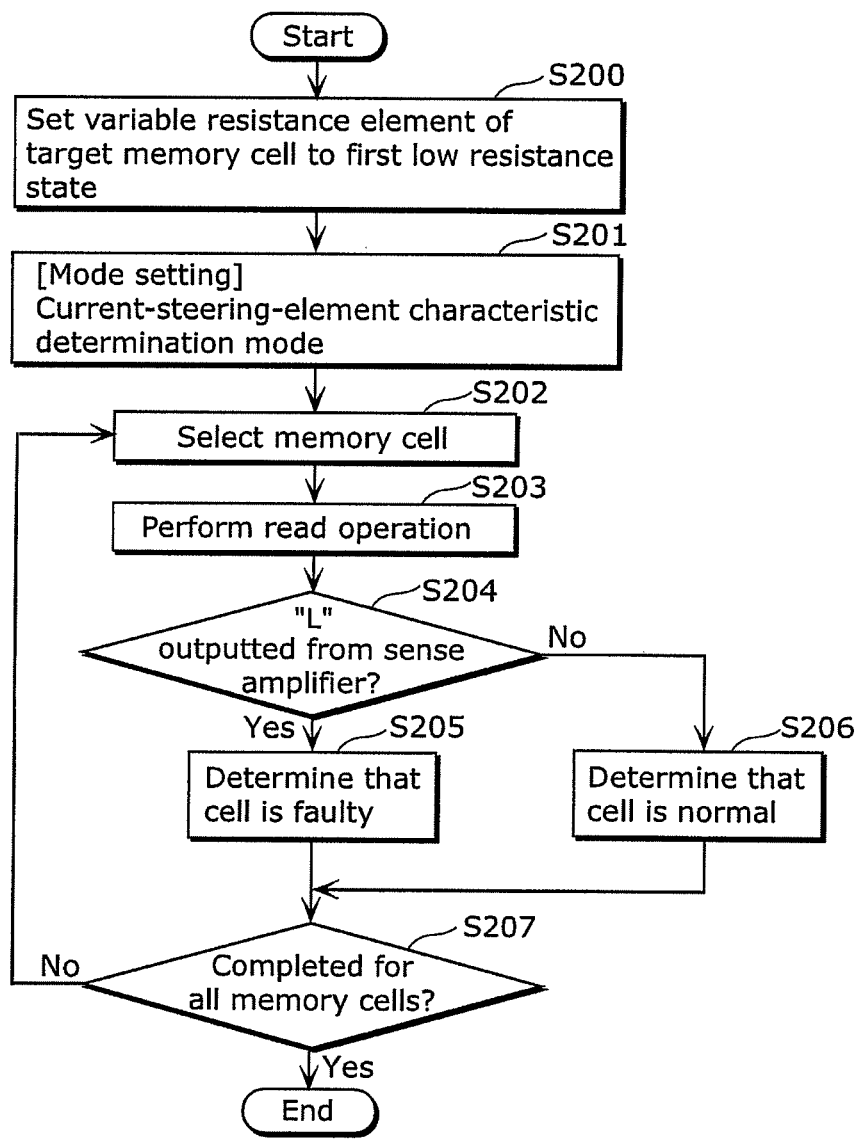
FIG. 14B is a diagram showing an example of a determination flow in a current-steering-element characteristic determination mode.

FIG. 14B is a diagram showing an example of the determination flow in the current-steering-element characteristic determination mode that is implemented after the variable resistance element of the memory cell is previously set to the first low resistance state.

Firstly, the memory cell that is a target of the current-steering-element characteristic determination is set to the first low resistance state with the application of a first low-resistance write pulse (step S200). Next, when the read circuit 206 is set to the current-steering-element characteristic determination mode (step S201), the SW1 and the SW2 of the bit-line control voltage switching circuit 400 enter the OFF state and the ON state, respectively. With this, the output terminal OUT2 of the bit-line control voltage generation circuit 500 shown in FIG. 6B is selected, and the cell characteristic determination clamp voltage Vct is applied to the gate terminal of the bit-line voltage control transistor N1 of the sense amplifier 300.

After this, at least one of the memory cells included in the memory cell array 202 is selected by the word line selected by the word line selection circuit 203 and the bit line selected by the bit line selection circuit 204 (step S202). Moreover, the aforementioned current-steering-element characteristic determination operation (i.e., the operation to read the characteristic of the current steering element) is performed on the selected memory cell (step S203).

Then, the voltage outputted to the output terminal SAOUT of the sense amplifier 300 is determined (step S204). When the output voltage is the potential L, the current steering element of the memory cell is determined to be faulty (step S205). When the output voltage is the potential H, the memory cell is determined to be normal (step S206). After the determination is completed for the entire memory cell region (step S207), the current-steering-element characteristic determination mode is terminated.

To be more specific, according to the determination flow in the current-steering-element characteristic determination mode as shown in FIG. 14B, whether or not the current steering element of the memory cell is faulty can be accurately determined by previously setting the variable resistance element of the memory cell to the first low resistance state.

Next, an example of a determination flow performed in the variable-resistance-element characteristic determination mode is described.

Figure 15:
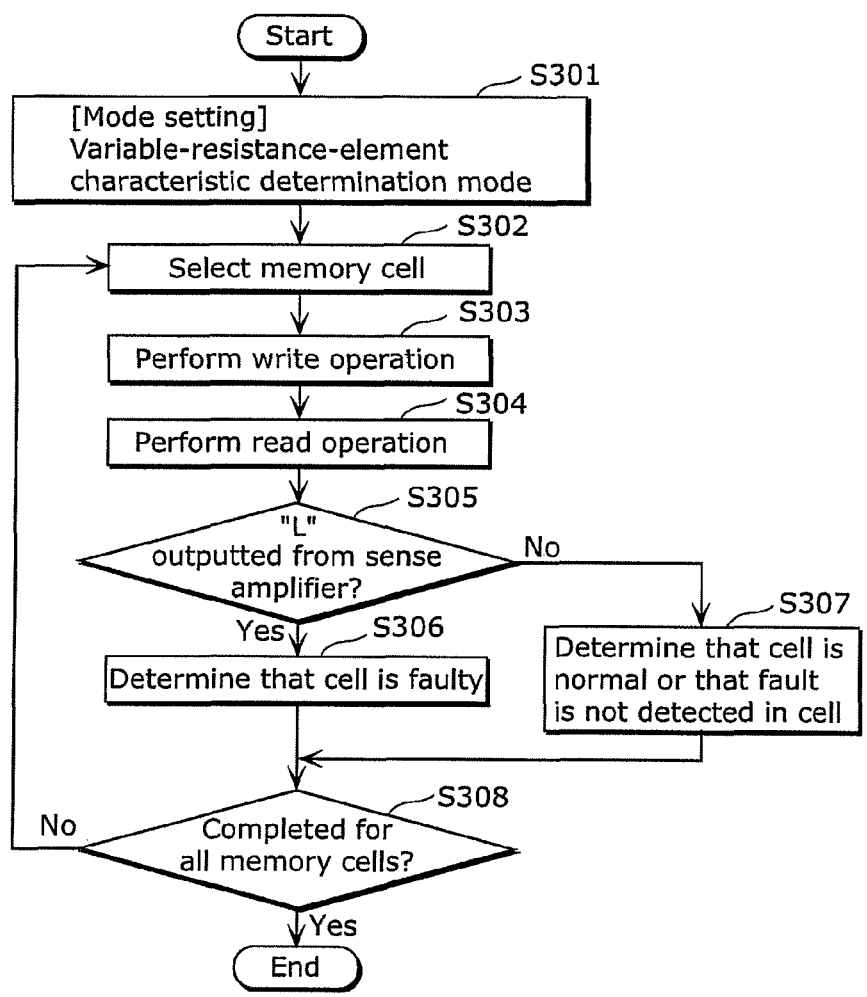
FIG. 15 is a diagram showing an example of a determination flow in a variable-resistance-element characteristic determination mode.

FIG. 15 is a diagram showing an example of the determination flow in the variable-resistance-element characteristic determination mode implemented on the memory cell. In the variable-resistance-element characteristic determination performed on the memory cell, after a regular write operation is performed on the selected memory cell, whether or not the write operation is performed successfully is determined by a read operation. When the write operation is performed successfully, the selected memory cell is determined to be normal. When the write operation is performed unsuccessfully, the selected memory cell is determined to be faulty. Here, when the selected memory cell is determined to be faulty, this means that, for example, the variable resistance element is in the second low resistance state where the resistance value is lower than the resistance value in the first low resistance state and thus the variable resistance element does not change in resistance.

Firstly, when the read circuit 206 is set to the variable-resistance-element characteristic determination mode (step S301), the variable resistance nonvolatile memory device is set to the write mode (for the high resistance state).

Then, at least one memory cell included in the memory cell array 202 is selected by the word line selected by the word line selection circuit 203 and the bit line selected by the bit line selection circuit 204 (step S302).

Following this, a high-resistance write operation is performed on the selected memory cell (step S303). At this time, a first high-resistance write pulse is applied to the memory cell.

After the end of the write operation, the SW1 and the SW2 of the bit-line control voltage switching circuit 400 are set to the ON state and the OFF state, respectively, as in the case of the regular read mode. With this, the output terminal OUT1 of the bit-line control voltage generation circuit 500 shown in FIG. 6B is selected and the read clamp voltage Vcr is applied to the gate terminal of the bit-line voltage control transistor N1 of the sense amplifier 300. The read operation is performed on the selected memory cell (step S304).

Then, the voltage outputted to the output terminal SAOUT of the sense amplifier 300 is determined (step S305). When the potential L is outputted, the memory cell is determined to have a faulty variable resistance element (step S306). When the potential H is outputted, the memory cell is determined to be normal (step S307). After the determination is completed for the entire memory cell region (step S308), the variable-resistance-element characteristic determination mode is terminated.

To be more specific, according to the determination flow in the variable-resistance-element characteristic determination mode as shown in FIG. 15, when the potential L is outputted to the output terminal SAOUT of the sense amplifier 300, the variable resistance element of the memory cell is determined to be faulty.

It should be noted that the write voltage in the variable-resistance-element characteristic determination mode is not limited to the aforementioned first high-resistance write pulse. For example, an initial breakdown voltage applied at the initial breakdown of the variable resistance element may be used.

[Method of Rescuing Faulty Memory Cell]

The following describes the method of rescuing a faulty memory cell in Embodiment 1.

Figure 16:
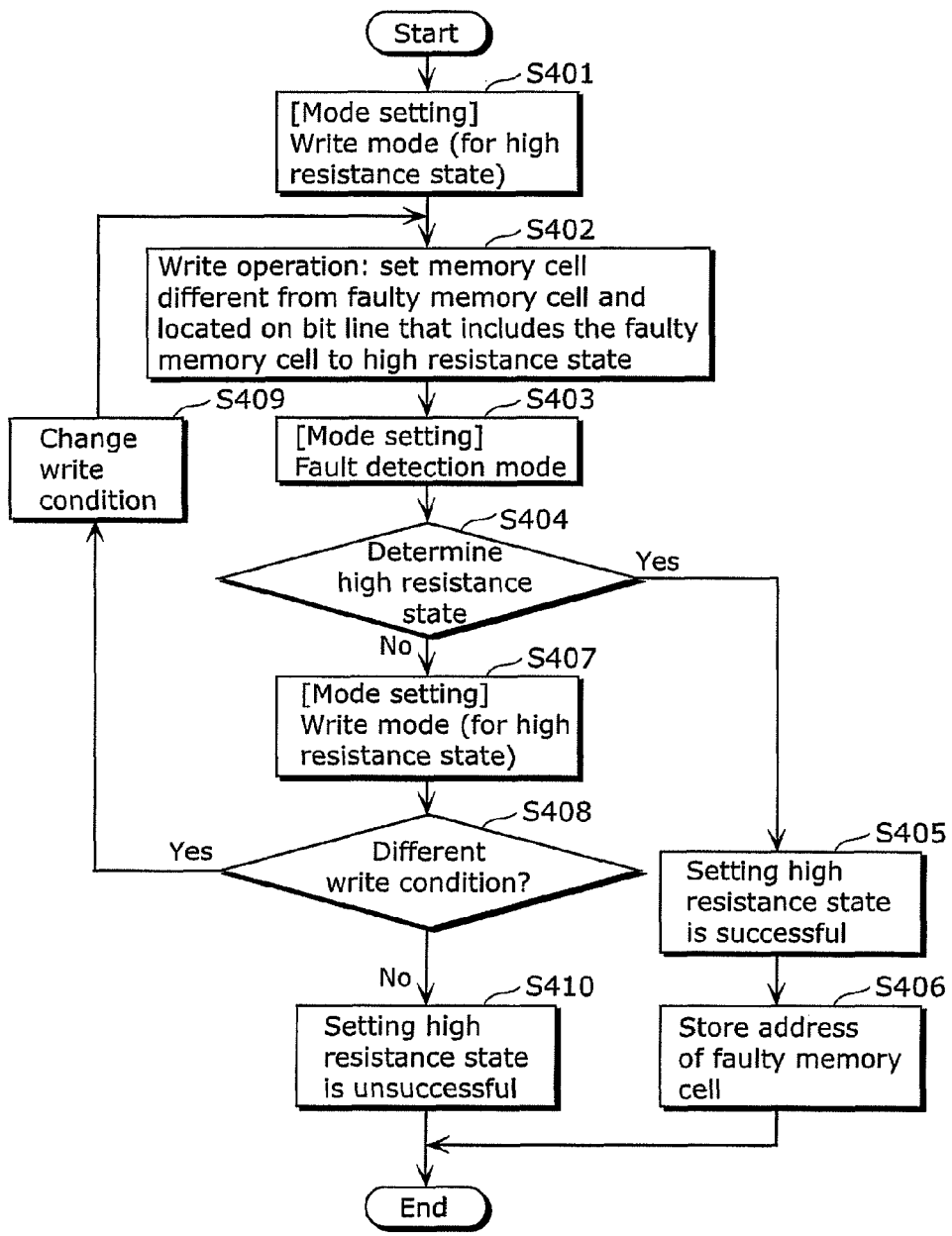
FIG. 16 is a diagram showing an example of a determination flow in a rescue mode.

FIG. 16 is a diagram showing an example of a flowchart of the method for rescuing a memory cell that is determined to be faulty in the current-steering-element characteristic determination mode. More specifically, variable resistance elements of normal memory cells different from the faulty memory cell having the faulty current steering element and located on the bit line that includes the faulty memory cell are set to the second high resistance state where the resistance value is higher than the resistance value in the first low resistance state (that is, the resistance value is set to be higher than in the low resistance state for a regular write operation). As a result, all the memory cells located on the bit line or the word line that includes the faulty memory cell are not to be used. Moreover, in order to substitute a redundant memory cell as a normal memory cell for each of the memory cells different from the faulty memory cell and located on the bit line that includes the faulty memory cell, each of addresses of the memory cells is stored in association with an address of the corresponding substitute.

As shown in FIG. 16, according to the method of rescuing the faulty memory cell in Embodiment 1, the variable resistance nonvolatile memory device is firstly set to the write mode (for the high resistance state) (step S401). Then, a high-resistance write operation is performed by the application of a second high-resistance write pulse to: at least one faulty memory cell, in the memory cell array 202, selected by the word line selected by the word line selection circuit 203 and the bit line selected by the bit line selection circuit 204; and the normal memory cells different from the faulty memory cell and located on the bit line that includes the faulty memory cell (step S402). After this, a fault detection mode is set (step S403). Then, the sense amplifier 300 of the read circuit 206 determines whether the other memory cells different from the faulty memory cell and located on the bit line that includes the faulty memory cell are in the second high resistance state (step S404).

When the other memory cells different from the faulty memory cell and located on the bit line that includes the faulty memory cell are in the second high resistance state, it is determined that each target memory cell is set to the high resistance state successfully (step S405). Following this, the address of each target memory cell is stored into the fault address memory circuit 213 (step S406). Then, the process is terminated here.

On the other hand, when the other memory cells different from the faulty memory cell and located on the bit line that includes the faulty memory cell are not in the second high resistance state in step S404, the write mode (for the high resistance state) is set again in the mode setting (step S407). After this, whether or not a different write condition can be set is determined (step S408). When it is determined that a different write condition can be set, the different write condition is set (step S409). Then, once again, the high-resistance write operation is performed on the other memory cells different from the faulty memory cell and located on the bit line that includes the faulty memory element (step S402). Here, to set the different write condition is to change, for example, a write voltage, a write pulse time, and a drive capability of a write driver. For example, when the different write condition is set, the write voltage may be changed to a third write pulse, that is described later, to set a memory cell to a third high resistance state where the resistance value is higher than the resistance value in the first high resistance state. When it is determined in step S408 that the different write condition cannot be set, it is determined that setting the target memory cell different from the faulty memory cell and located on the bit line that includes the faulty memory cell to the high resistance state is unsuccessful (step S410). Then, the process is terminated here. In this case, the faulty memory cell cannot be rescued, and is thus treated as a faulty circuit.

It should be noted that the detection flow and the rescue flow of the faulty memory cell described above may be performed: when the variable resistance nonvolatile memory device 200 is turned on; at predetermined intervals; or whenever a record is written.

Figure 17:
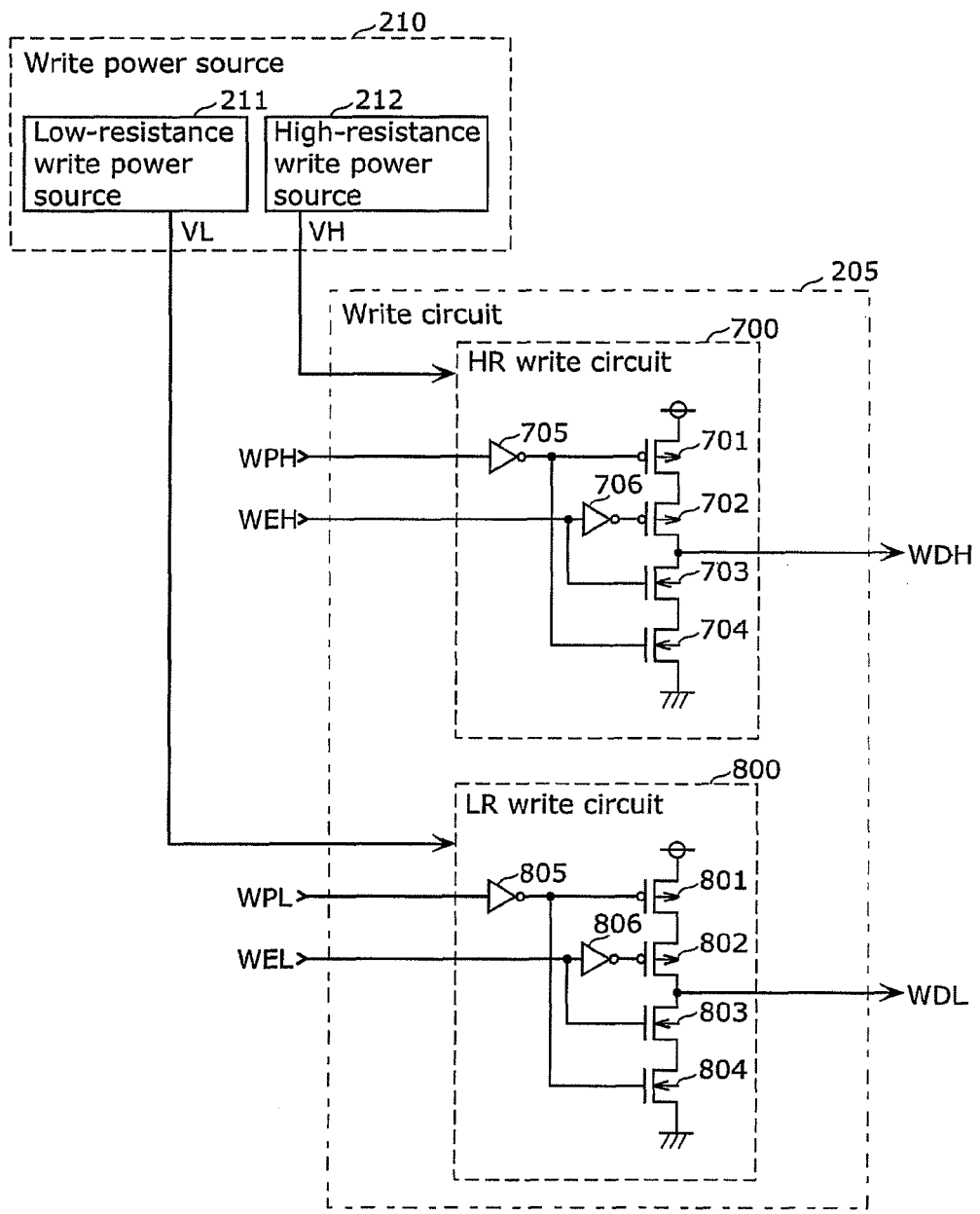
FIG. 17 is a circuit diagram showing an example of a configuration of a write circuit.

FIG. 17 is a circuit diagram showing an example of a connection relationship between the write circuit 205 and the write power source 210 in Embodiment 1.

As shown in FIG. 17, the write circuit 205 includes an HR write circuit 700 and an LR write circuit 800. The HR write circuit 700 applies a voltage and a current to the memory cell so that the resistance state of the variable resistance element of the memory cell changes to the high resistance state. The LR write circuit 800 applies a voltage and a current to the memory cell so that the resistance state of the variable resistance element of the memory cell changes to the first low resistance state.

Suppose that the memory cell selected by the word line selection circuit 203 and the bit line selection circuit 204 is normal. In this case, the HR write circuit 700 applies the first high-resistance write voltage Vwh1 to the bit line BL selected by the bit line selection circuit 204 with respect to the word line WL, as a reference, selected by the word line selection circuit 203. Here, the first high-resistance write voltage Vwh1 is applied as a voltage to change the resistance state of the variable resistance element of the memory cell to the first high resistance state.

The HR write circuit 700 includes a PMOS 701, a PMOS 702, an NMOS 703, an NMOS 704, an inverter 705, and an inverter 706. It should be noted that the simple descriptions "PMOS" and "NMOS" represent "PMOS transistor" and "NMOS transistor", respectively.

The PMOS 701, the PMOS 702, the NMOS 703, and the NMOS 704 are connected in this order in series with each other via respective main terminals (i.e., a drain terminal of one transistor is connected to a source terminal of the other transistor) to form one current path. Of two main terminals of the PMOS 701, the main terminal (the source terminal) that is not connected to the PMOS 702 is connected to the power source (such as the high-resistance write power source 212). Moreover, of two main terminals of the NMOS 704, the main terminal (the source terminal) that is not connected to the NMOS 703 is connected to a ground potential.

An HR write enable signal WEH outputted from the data signal input-output circuit 207 is inputted to an input terminal of the inverter 706 and a gate terminal of the NMOS 703. The HR write enable signal WEH received by the input terminal of the inverter 706 is inputted, as an inverted signal, to a gate terminal of the PMOS 702. Moreover, an HR write pulse signal WPH outputted from the control circuit 209 is inputted to an input terminal of the inverter 705. The signal received by the input terminal of the inverter 705 is inputted, as an inverted signal, to gate terminals of the PMOS 701 and the NMOS 704. One of main terminals (a drain terminal) of the PMOS 702 and one of main terminals (a drain terminal) of the NMOS 703 are connected, and an output thereof is provided from the write circuit 205 via an output terminal WDH of the HR write circuit 700 to the bit line selection circuit 204 and the word line selection circuit 203.

When the HR write enable signal WEH is in an H state, the HR write circuit 700 outputs one of a potential VH (=the first high-resistance write voltage Vwh1) supplied by the high-resistance write power source 212 and the ground potential (Vss), according to the HR write pulse signal WPH. When the HR write enable signal WEH is in an L state, the HR write circuit 700 outputs a Hi-Z state from the output terminal WDH.

Suppose that the memory cell selected by the word line selection circuit 203 and the bit line selection circuit 204 is normal. In this case, the LR write circuit 800 applies the first low-resistance write voltage Vwl1 to the word line WL selected by the word line selection circuit 203 with respect to the word line BL, as a reference, selected by the bit line selection circuit 204. Here, the first low-resistance write voltage Vwl1 is applied as a voltage to change the resistance state of the variable resistance element of the memory cell to the first low resistance state.

The LR write circuit 800 includes a PMOS 801, a PMOS 802, an NMOS 803, an NMOS 804, an inverter 805, and an inverter 806.

The PMOS 801, the PMOS 802, the NMOS 803, and the NMOS 804 are connected in this order in series with each other via respective main terminals (i.e., a drain terminal of one transistor is connected to a source terminal of the other transistor) to form one current path. Of two main terminals of the PMOS 801, the main terminal (the source terminal) that is not connected to the PMOS 802 is connected to the power source (such as the low-resistance write power source 211). Moreover, of two main terminals of the NMOS 804, the main terminal (the source terminal) that is not connected to the NMOS 803 is connected to the ground potential.

An LR write enable signal WEL outputted from the data signal input-output circuit 207 is inputted to an input terminal of the inverter 806 and a gate terminal of the NMOS 803. The LR write enable signal WEL received by the input terminal of the inverter 806 is inputted, as an inverted signal, to a gate terminal of the PMOS 802. Moreover, an LR write pulse signal WPL outputted from the control circuit 209 is inputted to an input terminal of the inverter 805. The signal received by the input terminal of the inverter 805 is inputted, as an inverted signal, to gate terminals of the PMOS 801 and the NMOS 804. One of main terminals (a drain terminal) of the PMOS 802 and one of main terminals (a drain terminal) of the NMOS 803 are connected, and an output thereof is provided from the write circuit 205 via an output terminal WDL of the LR write circuit 800 to the word line selection circuit 203.

When the LR write enable signal WEL is in an H state, the LR write circuit 800 outputs one of a VL potential (=the first low-resistance write voltage Vwl1) supplied by the low-resistance write power source 211 and the ground potential (Vss), according to the LR write pulse signal WPL. When the LR write enable signal WEL is in an L state, the LR write circuit 800 outputs a Hi-Z state from the output terminal WDL.

By setting the other memory cells different from the faulty memory cell and located on the bit line that includes the faulty memory cell to the second high resistance state where the resistance value is higher than or equal to the resistance value in the first low resistance state, the abnormal current passing through the faulty memory cell can be reduced. After this, when the rescue process is performed by substituting a redundant bit or word line for the bit or word line that includes the faulty memory cell, the abnormal current does not pass through the faulty memory cell. Thus, even when the faulty memory cell is not disconnected from the memory cell array 202, the abnormal current does not pass through the memory cell array 202. Accordingly, a stable reading operation can be performed on the selected memory cell.

Figure 18:
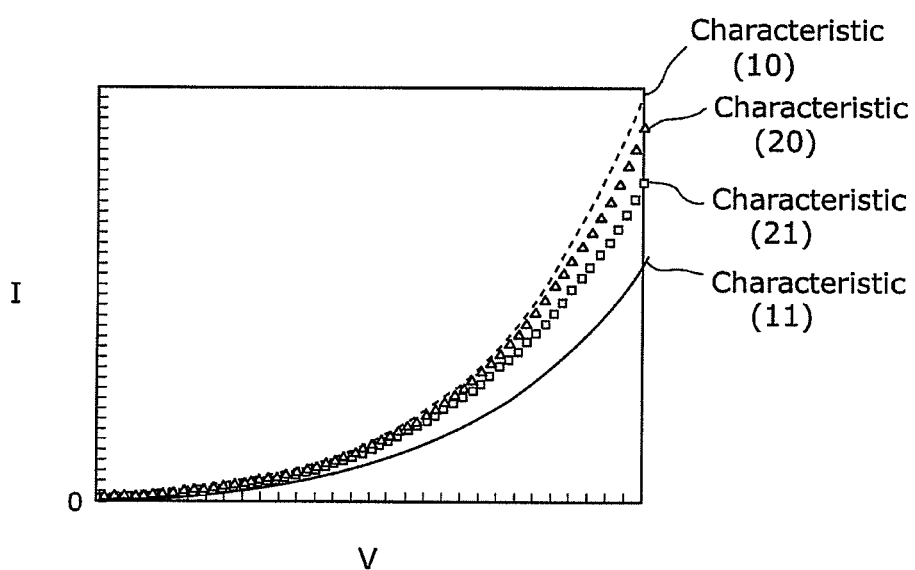
FIG. 18 is a diagram showing an example of voltage-current characteristics between a voltage applied to a selected bit line and a current passing through the selected bit line.

FIG. 18 is a diagram showing an example of voltage-current characteristics between a voltage applied to a selected bit line and a current passing through the selected bit line. Suppose that each of all the memory cells 100 included in the memory cell array 202 of the variable resistance nonvolatile memory device 200 shown in FIG. 5 has a normal characteristic as indicated by, for example, the characteristic (1) shown in FIG. 4, and that each of the variable resistance elements 102 of all the memory cells 100 is in the first low resistance state. In this case, a characteristic (10) shown by a broken line in FIG. 18 is indicated when the horizontal axis represents the voltage V applied to the selected bit line and the vertical axis represents the current I passing through the selected bit line. Similarly, suppose that each of all the memory cells 100 included in the memory cell array 202 has a normal characteristic as indicated by, for example, the characteristic (1) shown in FIG. 4, and that each of the variable resistance elements 102 of all the memory cells 100 is in the first high resistance state. In this case, a characteristic (11) shown by a thick solid line in FIG. 18 is indicated.

On the other hand, suppose that the selected memory cell 100 in the memory cell array 202 of the variable resistance nonvolatile memory device 200 shown in FIG. 5 is set to the first high resistance state and that one of the nonselected memory cells includes the current steering element having a short-circuit fault, such as the current steering element D23 of the memory cell M23 shown in FIG. 9. Also suppose that the variable resistance element R23 of the faulty memory cell M23 is in the second low resistance state where the resistance value is lower than the resistance value in the first low resistance state. In this case, when all the other memory cells M13, M33, . . . different from the faulty memory cell M23 and located on the bit line that includes the faulty memory cell M23 are set to the second high resistance state where the resistance value is higher than the resistance value in the first low resistance state, a characteristic (20) shown by an open-triangle line in FIG. 18 is indicated.

To be more specific, the characteristic (20) indicated when the selected memory cell 100 is in the first high resistance state and all the other memory cells M13, M33, . . . different from the faulty memory cell M23 and connected to the bit line that includes the faulty memory cell M23 are set to the second high resistance state indicates that the selected memory cell 100 is at a resistance value higher than the resistance value indicated by the characteristic (10) in the first low resistance state. Accordingly, by setting all the other memory cells M13, M33, . . . different from the faulty memory cell M23 and connected to the bit line that includes the faulty memory cell M23 to the second high resistance state where the resistance value is higher than the resistance value in the first low resistance state, the state of the selected memory cell can be determined regardless of the presence or absence of a faulty memory cell in the nonselected memory cell array.

Moreover, it is even more preferable for all the other memory cells M13, M33, . . . different from the faulty memory cell M23 and connected to the bit line that includes the faulty memory cell M23 to be set to a high resistance state where the resistance value is higher than the resistance value in the first high resistance state. For example, suppose that all the other memory cells M13, M33, . . . different from the faulty memory cell M23 and connected to the bit line that includes the faulty memory cell M23 are set to the third high resistance state where the resistance value is about ten times higher than the resistance value in the first high resistance state. In this case, a characteristic (21) shown by an open-rectangle line in FIG. 18 is indicated. The resistance indicated in the characteristic (21) is higher (that is, the current is lower) than in the characteristic (20). Thus, regardless of the presence or absence of a faulty memory cell in the nonselected memory cell array, the state of the selected memory cell can be determined more accurately.

[Modification of Embodiment 1]

The following describes a variable resistance nonvolatile memory device in Modification of Embodiment 1 according to the present invention.

Figure 19:
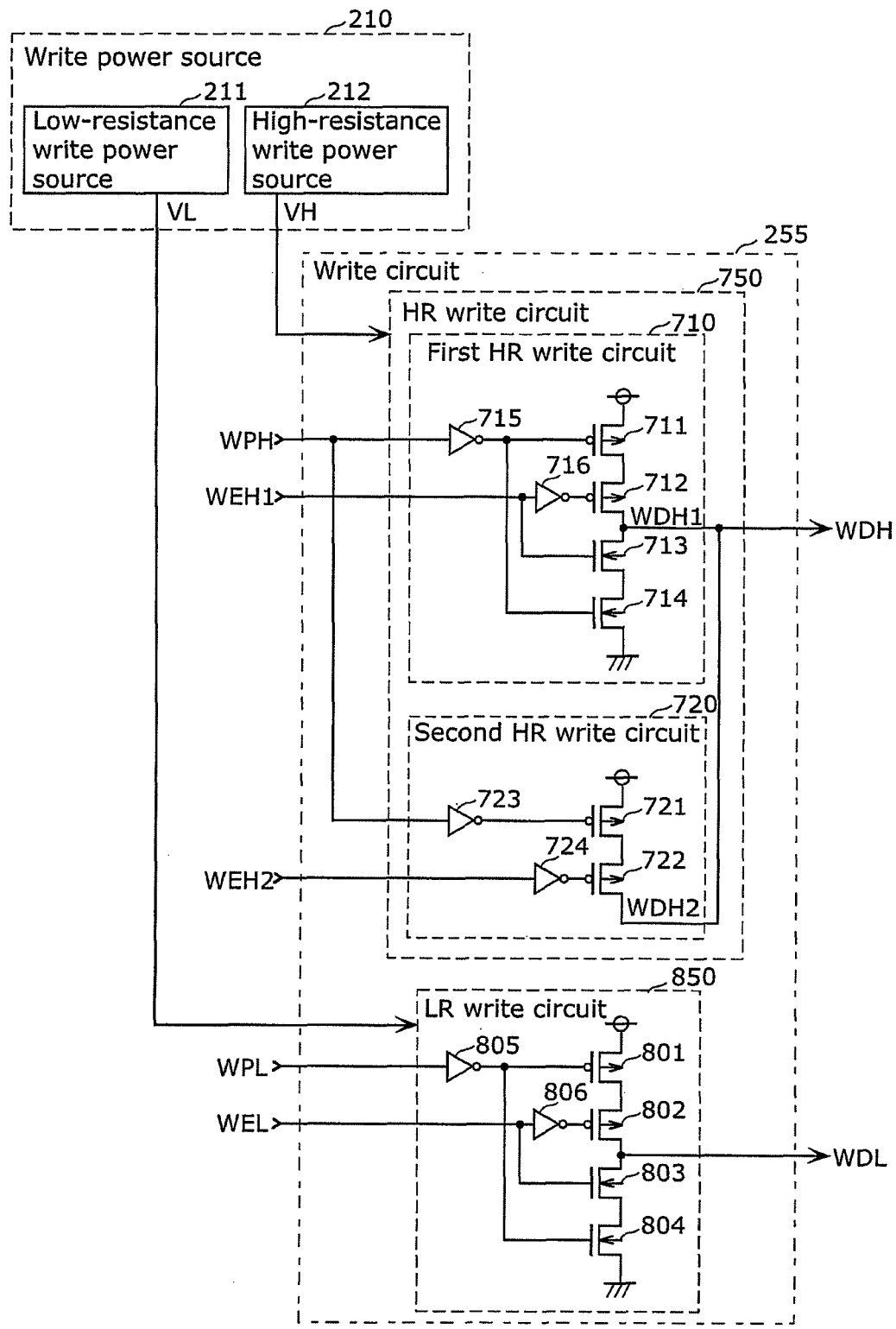
FIG. 19 is a circuit diagram showing an example of a configuration of a write circuit.

FIG. 19 is a circuit diagram showing a write circuit 255 and a write power source 210 and a connection relationship of these circuits in the present embodiment. Here, a configuration described here is different from the configuration described in Embodiment 1.

As shown in FIG. 19, the write circuit 225 includes an HR write circuit 750 and an LR write circuit 850. In the write mode, the HR write circuit 750 applies a voltage and a current to the memory cell so that the resistance state of the variable resistance element of the memory cell changes to the high resistance state. The LR write circuit 850 applies a voltage and a current to the memory cell so that the resistance state of the variable resistance element of the memory cell changes to the low resistance state.

The HR write circuit 750 includes a first HR write circuit 710 and a second HR write circuit 720. An output terminal WDH1 of the first HR write circuit 710 is connected to an output terminal WDH2 of the second HR write circuit 720. Suppose that the memory cell selected by the word line selection circuit 203 and the bit line selection circuit 204 is normal. In this case, the first HR write circuit 710 applies the first high-resistance write voltage Vwh1 to the bit line BL selected by the bit line selection circuit 204 with respect to the word line WL, as a reference, selected by the word line selection circuit 203. Here, the first high-resistance write voltage Vwh1 is applied as a voltage to change the resistance state of the variable resistance element of the memory cell to the first high resistance state. Moreover, the first write circuit 710 applies a second high-resistance write voltage Vwh2 by changing the power supply voltage VH outputted from the high-resistance write power source 212 of the write power source 210.

The HR write circuit 750 includes the second HR write circuit 720, so that: a first high-resistance write current "Iwh1" is outputted from the output terminal WDH1 of the first write circuit 710; a second high-resistance write current "Iwh2" is outputted from the output terminal WDH2 of the second HR write circuit 720; and a third high-resistance write current "Iwh3" that is a sum of the first high-resistance write current Iwh1 and the second high-resistance write current Iwh2 is outputted. To be more specific, the first high-resistance write current Iwh1, the second high-resistance write current Iwh2, and the third high-resistance write current Iwh3 are outputted from the output terminal WDH of the HR write circuit 750.

A detailed configuration of the HR write circuit 750 is as follows.

The first HR write circuit 710 includes a PMOS 711, a PMOS 712, an NMOS 713, an NMOS 714, an inverter 715, and an inverter 716.

The PMOS 711, the PMOS 712, the NMOS 713, and the NMOS 714 are connected in this order in series with each other via respective main terminals (i.e., a drain terminal of one transistor is connected to a source terminal of the other transistor) to form one current path. Of two main terminals of the PMOS 711, the main terminal (the source terminal) that is not connected to the PMOS 712 is connected to the power source (such as the high-resistance write power source 212). Moreover, of two main terminals of the NMOS 714, the main terminal (the source terminal) that is not connected to the NMOS 713 is connected to the ground potential.

A first HR write enable signal WEH1 outputted from the data signal input-output circuit 207 is inputted to an input terminal of the inverter 716 and a gate terminal of the NMOS 713. The first HR write enable signal WEH1 received by the input terminal of the inverter 716 is inputted, as an inverted signal, to a gate terminal of the PMOS 712. Moreover, an HR write pulse signal WPH outputted from the control circuit 209 is inputted to an input terminal of the inverter 715. The signal received by the input terminal of the inverter 715 is inputted, as an inverted signal, to gate terminals of the PMOS 711 and the NMOS 714. One of main terminals (a drain terminal) of the PMOS 712 and one of main terminals (a drain terminal) of the NMOS 713 are connected, and an output thereof is provided from the write circuit 255 via an output terminal WDH of the HR write circuit 750 to the bit line selection circuit 204.

When the first HR write enable signal WEH1 is in an H state, the first HR write circuit 710 outputs one of a potential VH (=the first high-resistance write voltage Vwh1) supplied by the high-resistance write power source 212 and the ground potential (Vss), according to the write pulse signal WPH. When the output of the first HR write circuit 710 is one of the potential VH and the ground potential, a corresponding one of an output current "IHH1" (=the high-resistance write current Iwh1) and a current "IHL1" flows. When the HR write enable signal WEH1 is in an L state, the first HR write circuit 710 outputs a Hi-Z state.

The second HR write circuit 720 includes a PMOS 721, a PMOS 722, an inverter 723, and an inverter 724.

The PMOS 721 and the PMOS 722 are connected in this order in series with each other via respective main terminals (i.e., a drain terminal of one transistor is connected to a source terminal of the other transistor) to form one current path. Of two main terminals of the PMOS 721, the main terminal (the source terminal) that is not connected to the PMOS 722 is connected to the power source (such as the high-resistance write power source 212).

A second HR write enable signal WEH2 outputted from the control circuit 209 is inputted to a gate of an input terminal of the inverter 724. The second HR write enable signal WEH2 received by the input terminal of the inverter 724 is inputted, as an inverted signal, to a gate terminal of the PMOS 722. Moreover, an HR write pulse signal WPH outputted from the control circuit 209 is inputted to an input terminal of the inverter 723. The signal received by the input terminal of the inverter 723 is inputted, as an inverted signal, to a gate terminal of the PMOS 721. An output of one of main terminals (a drain terminal) of the PMOS 722 is provided from the write circuit 255 via the output terminal WDH of the HR write circuit 750 to the bit line selection circuit 204.

When the second HR write enable signal WEH2 is in an H state, the second HR write circuit 720 outputs one of a potential VH (=the first high-resistance write voltage Vwh1) supplied by the high-resistance write power source 212, according to the write pulse signal WPH. When the output of the second HR write circuit 720 is the potential VH, an output current "IHH2" (=the second high-resistance write current Iwh2) flows. When the second HR write enable signal WEH2 is in an L state, the second HR write circuit 720 outputs a Hi-Z state.

The LR write circuit 850 is described above and, therefore, the explanation is omitted here.

For example, the first HR write enable signal WEH1 is brought into the H state, namely, an enable state and the first HR write circuit 710 supplies the potential VH so that the output current IHH1 flows. With this, the other memory cells different from the faulty memory cell and located on the bit line that includes the faulty memory cell are set to the second high resistance state where the resistance value is higher than the resistance value in the first low resistance state. As a result, the abnormal current passing through the faulty memory cell can be reduced. Moreover, the second HR write enable signal WEH2 is brought into the H state, namely, the enable state, and a drive capability (=the output current) of the HR write circuit 750 is increased so that the potential VH is supplied and that the output current IHH2 more flows (is increased). As a result, the other memory cells different from the faulty memory cell and located on the bit line that includes the faulty memory cell can be brought into the second high resistance state or a state where the resistance value is higher. Furthermore, by employing the HR write circuit 750, the normal memory cell can be brought into the third high resistance state where the resistance value is even higher than the resistance value in the first high resistance state as in the following embodiment.

Embodiment 2

The following describes Embodiment 2.

Figure 20:
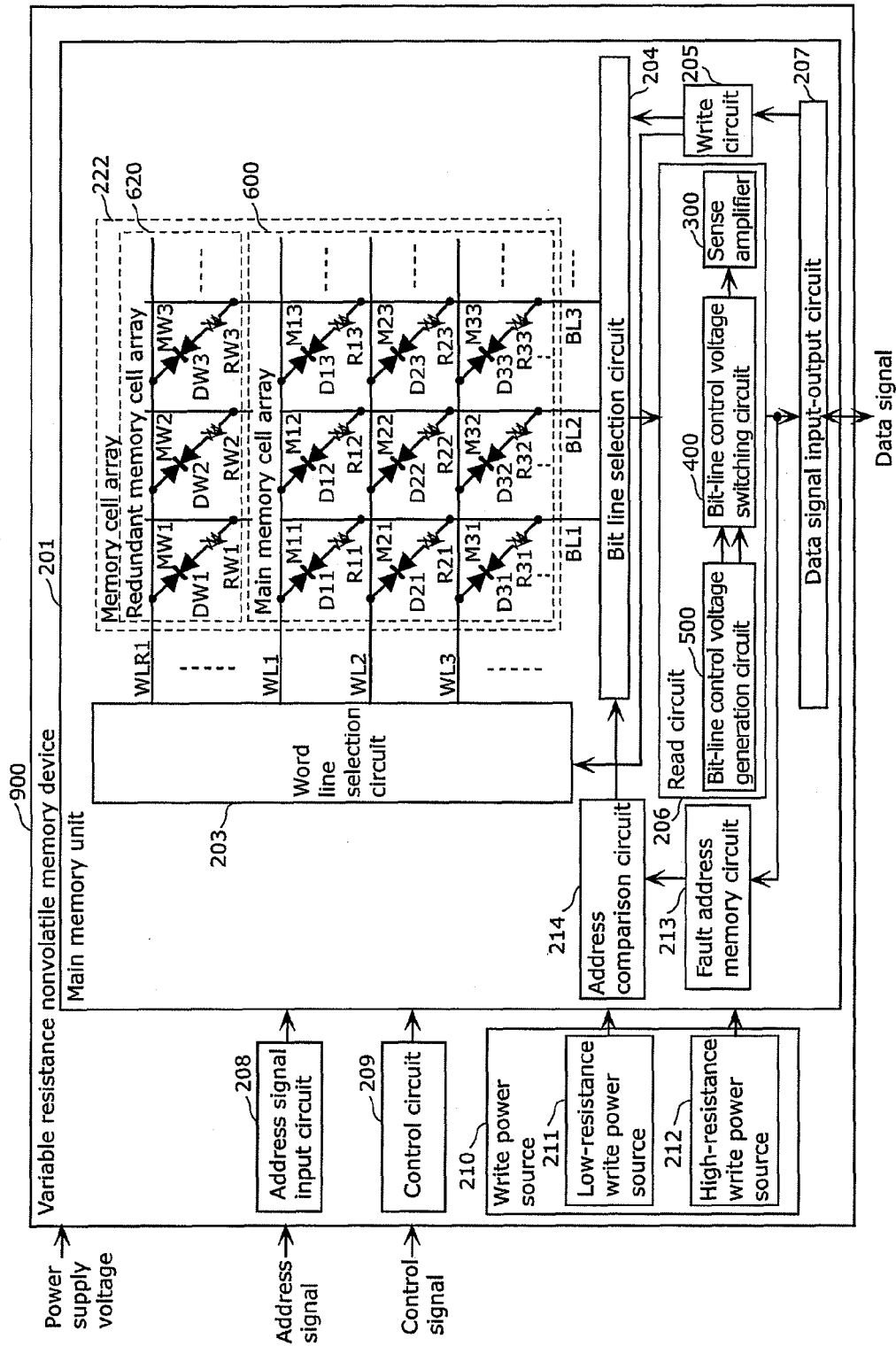
FIG. 20 is a diagram showing a configuration of a variable resistance nonvolatile memory device.

FIG. 20 is a diagram showing an example of a configuration of a variable resistance nonvolatile memory device 900 including, in addition to the configuration of the variable resistance nonvolatile memory device 200 shown in FIG. 5 in Embodiment 1, a redundant memory cell array 620 having the same number of memory cells 100 for each of columns of the main memory cell array 600. As an example, the redundant memory cell array 620 shown in FIG. 20 includes one memory cell 100 for each of the columns of the main memory cell array 600. That is, the redundant memory cell array 620 corresponding to one row is formed. It should be noted that although the redundant memory cell array 620 in FIG. 20 is placed above an upper part of the main memory cell array 600, the redundant memory cell array 620 may be placed in the main memory cell array 600.

In the following, explanations about components that are identical to those shown in FIG. 5 are omitted.

In FIG. 20, the variable resistance nonvolatile memory device 900 in Embodiment 2 includes a main memory unit 201 formed on a substrate. The main memory unit 201 includes a memory cell array 202. The memory cell array 202 includes: the main memory cell array 600 in which the memory cells 100 one of which is shown in FIG. 2 are arranged in a matrix with rows and columns; and the redundant memory cell array 620 in which the memory cells 100 one of which is also shown in FIG. 2 are arranged. Moreover, the memory cell array 202 includes a plurality of word lines WL1, WL2, WL3, . . . , and a plurality of bit lines BL1, BL2, BL3, . . . . Here, the word lines and the bit lines are arranged so as to cross each other. In addition, the memory cell array 202 includes one or more redundant word lines WLR1, . . . arranged in parallel to the word lines WL1, WL2, WL3, . . . .

As shown in FIG. 20, the plurality of word lines WL1, WL2, WL3, . . . are arranged in parallel to each other in one plane (a first plane) that is parallel to a main plane of the substrate. Similarly, the plurality of bit lines BL1, BL2, BL3, . . . are arranged in parallel to each other in one plane (a second plane parallel to the first plane) that is parallel to the first plane. The redundant word lines WLR1, . . . are arranged in parallel to the word lines WL1, WL2, WL3, . . . in the second plane.

The first plane and the second plane are parallel to each other, and the word lines WL1, WL2, WL3, . . . , and the bit lines BL1, BL2, BL3, . . . are arranged so as to three-dimensionally cross each other. Moreover, the bit lines BL1, BL2, BL3, . . . , and the redundant word lines WLR1, . . . are also arranged so as to three-dimensionally cross each other.

In the main memory cell array 600, at the three-dimensional cross points of the word lines WL1, WL2, WL3, . . . , and the bit lines BL1, BL2, BL3, . . . , there are provided memory cells M11, M12, M13, M21, M22, M23, M31, M32, M33, . . . (referred to as "the memory cells M11, M12, M13, . . ." hereafter). In the redundant memory cell array 620, at the three-dimensional cross points of the bit lines BL1, BL2, BL3, . . . , and the redundant bit lines WLR1, . . . , there are provided redundant memory cells MW1, MW2, MW3, . . . .

Each of the memory cells M11, M12, M13, . . . is configured with: a corresponding one of current steering elements D11, D12, D13, D21, D22, D23, D31, D32, D33, . . . (referred to as "the current steering elements D11, D12, D13, . . ." hereafter); and a corresponding one of variable resistance elements R11, R12, R13, R21, R22, R23, R31, R32, R33, . . . (referred to as "the variable resistance elements R11, R12, R13, . . ." hereafter) connected in series with the corresponding one of the current steering elements D11, D12, D13, . . . . Similarly, each of the redundant memory cells MW1, MW2, MW3, . . . is configured with: a corresponding one of current steering elements DW1, DW2, DW3, . . . ; and a corresponding one of variable resistance elements RW1, RW2, RW3, . . . connected in series with the corresponding one of the current steering elements DW1, DW2, DW3, . . . .

To be more specific, as shown in FIG. 20, one terminal of each of the variable resistance elements R11, R21, R31, . . . in the main memory cell array 600 is connected to a corresponding one of the current steering elements D11, D21, D31, . . . , and the other terminal of each of the variable resistance elements R11, R21, R31, . . . is connected to the bit line BL1. One terminal of each of the variable resistance elements R12, R22, R32, . . . is connected to a corresponding one of the current steering elements D12, D22, D32, . . . , and the other terminal of each of the variable resistance elements R12, R22, R32, . . . is connected to the bit line BL2. One terminal of each of the variable resistance elements R13, R23, R33, . . . is connected to a corresponding one of the current steering elements D13, D23, D33, . . . , and the other terminal of each of the variable resistance elements R13, R23, R33, . . . is connected to the bit line BL3. Moreover, one terminal of each of the current steering elements D11, D12, D13, . . . is connected to a corresponding one of the variable resistance elements R11, R12, R13, . . . , and the other terminal of each of the current steering elements D11, D12, D13, . . . is connected to the word line WL1. One terminal of each of the current steering elements D21, D22, D23, . . . is connected to a corresponding one of the variable resistance elements R21, R22, R23, . . . , and the other terminal of each of the current steering elements D21, D22, D23, . . . is connected to the word line WL2. One terminal of each of the current steering elements D31, D32, D33, . . . is connected to a corresponding one of the variable resistance elements R31, R32, R33, . . . , and the other terminal of each of the current steering elements D31, D32, D33, . . . is connected to the word line WL3.

Similarly, one terminal of each of the variable resistance elements RW1, RW2, RW3, . . . in the redundant memory cell array 620 is connected to a corresponding one of the current steering elements DW1, DW2, DW3, . . . , and the other terminal of each of the variable resistance elements RW1, RW2, RW3, . . . is connected to the redundant word line WLR1, . . . . One terminal of each of the current steering elements DW1, DW2, DW3, . . . is connected to a corresponding one of the variable resistance elements RW1, RW2, RW3, . . . , and the other terminal of the current steering elements DW1, DW2, DW3, . . . is connected to a corresponding one of the bit lines BL1, BL2, BL3, . . . .

In Embodiment 2, the variable resistance element is connected on the bit line side and the current steering element is connected on the word line side. However, it should be noted that the current steering element may be connected on the bit line side and that the variable resistance element may be connected on the word line side. Moreover, the number of the redundant word line WLR1, . . . in the redundant memory cell array 620 may be at least one in Embodiment 2, and more than one redundant bit line may be provided.

The word lines selection circuit 203 receives row address information from the address signal input circuit 208 and an address match determination signal from the address comparison circuit 214. Then, based on the received row address information and the address match determination signal, the word line selection circuit 203 applies a voltage supplied from the write circuit 205 to the word line selected from among the word lines WL1, WL2, WL3, . . . and the redundant bit line WLR1, . . . . In addition, the word line selection circuit 203 applies a predetermined nonselected-row voltage (a voltage between Vss and Vwl or a voltage between Vss and Vwh) to a nonselected word line or fixes the nonselected word line to the high impedance (Hi-Z) state.

Similarly, the bit line selection circuit 204 receives column address information from the address signal input circuit 208 and an address match determination signal from the address comparison circuit 214. Then, based on the received column address information and the address match determination signal, the bit line selection circuit 204 applies a voltage supplied from the write circuit 205 or the read circuit 206 to the bit line selected from among the bit lines BL1, BL2, BL3, . . . . In addition, the bit line selection circuit 204 can apply a predetermined nonselected-column voltage (a voltage between Vss and Vwl, a voltage between Vss and Vwh, or a voltage between Vss and Vbl) to a nonselected bit line or fix the nonselected bit line into the high impedance (Hi-Z) state.

It should be noted that each of the word line selection circuit 203 and the bit line selection circuit 204 corresponds to a memory cell selection circuit according to the present invention.

When the selected memory cell is determined to be faulty in the current-steering-element characteristic determination mode of the read circuit 206, the fault address memory circuit 213 stores, as a fault address, the row address information received from the address signal input circuit 208. To be more specific, as in the case of storing the fault address on a bit line basis, the fault address memory circuit 213 includes an address conversion table (not shown) and stores a faulty word line having a faulty memory cell in association with a redundant word line having a redundant memory cell serving as a substitute destination.

The address comparison circuit 214 compares the row address information received from the address signal input circuit 208 with a fault address stored in the fault address memory circuit 213. Then, the address comparison circuit 214 outputs, to the word line selection circuit 203, an address match determination signal indicating whether or not the row address information matches the faulty address. Suppose that the row address information received from the address signal input circuit 208 matches the faulty-word-line address stored in the fault address memory circuit 213. In this case, in the rescue mode, the faulty word line is substituted by the redundant word line serving as the substitution destination for writing and reading data, according to the address conversion table stored in the fault address memory circuit 213.

The following describes the method of rescuing a faulty memory cell in Embodiment 2.

Figure 21:
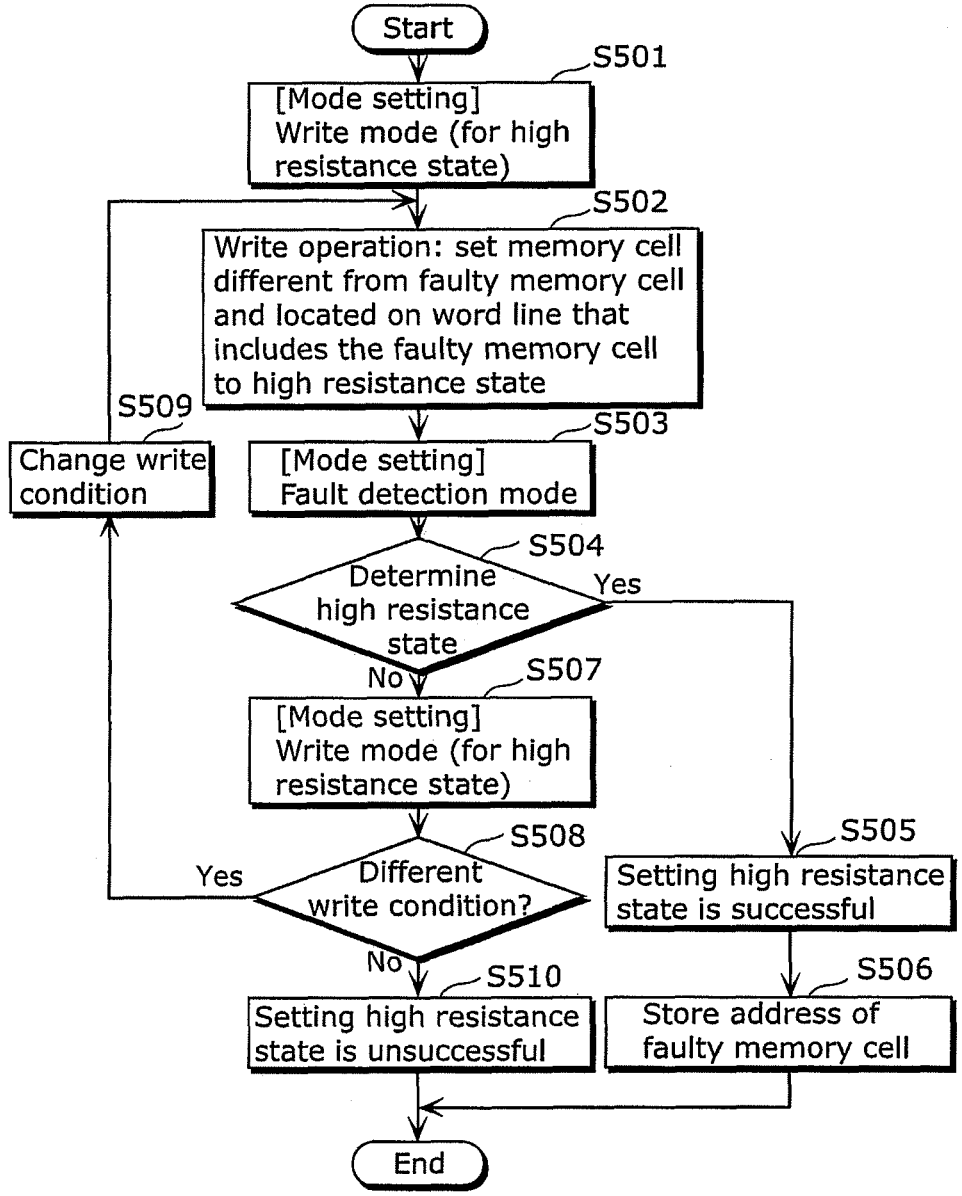
FIG. 21 is a diagram showing an example of a determination flow in the rescue mode.

FIG. 21 is a diagram showing an example of a flowchart of the method for rescuing a memory cell that is determined to be faulty in the current-steering-element characteristic determination mode. More specifically, variable resistance elements of memory cells different from the faulty memory cell having the faulty current steering element and located on the word line that includes the faulty memory cell are set to the second high resistance state where the resistance value is higher than the resistance value in the first low resistance state (that is, the resistance value is set to be higher than in the low resistance state for a regular write operation). As a result, the abnormal current passing through the faulty memory cell can be cut. Moreover, in order to substitute a redundant memory cell as a normal memory cell for each of the memory cells different from the faulty memory cell and located on the word line that includes the faulty memory cell, each of addresses of the memory cells is stored in association with an address of the corresponding substitute.

As shown in FIG. 21, according to the method of rescuing the faulty memory cell in Embodiment 2, the variable resistance nonvolatile memory device is firstly set to the write mode (for the high resistance state) (step S501). Then, a high-resistance write operation is performed on: at least one faulty memory cell, in the memory cell array 202, selected by the word line selected by the word line selection circuit 203 and the bit line selected by the bit line selection circuit 204; and the other memory cells different from the faulty memory cell and located on the word line that includes the faulty memory cell (step S502). After this, a fault detection mode is set (step S503). Then, the sense amplifier 300 of the read circuit 206 determines whether the other memory cells different from the faulty memory cell and located on the word line that includes the faulty memory cell are in the second high resistance state (step S504).

When the other memory cells different from the faulty memory cell and located on the word line that includes the faulty memory cell are in the second high resistance state, it is determined that each target memory cell is set to the high resistance state successfully (step S505). Following this, the address of each target memory cell is stored into the fault address memory circuit 213 (step S506). Then, the process is terminated here.

On the other hand, when the other memory cells different from the faulty memory cell and located on the word line that includes the faulty memory cell are not in the second high resistance state in step S504, the write mode (for the high resistance state) is set again in the mode setting (step S507). After this, whether or not a different write condition can be set is determined (step S508). When it is determined that a different write condition can be set, the different write condition is set (step S509). Then, once again, the high-resistance write operation is performed on the other memory cells different from the faulty memory cell and located on the word line that includes the faulty memory element (step S502). Here, to set the different write condition is to change, for example, a write voltage, a write pulse time, and a drive capability of a write driver. For example, when the different write condition is set, the write voltage may be changed to a third write pulse to set a memory cell to a third high resistance state where the resistance value is higher than the resistance value in the first high resistance state. When it is determined in step S508 that the different write condition cannot be set, it is determined that setting the target memory cell different from the faulty memory cell and located on the word line that includes the faulty memory cell to the high resistance state is unsuccessful (step S510). Then, the process is terminated here. In this case, the faulty memory cell cannot be rescued, and is thus treated as a faulty circuit.

It should be noted that the detection flow and the rescue flow of the faulty memory cell described above may be performed: when the variable resistance nonvolatile memory device 200 is turned on; at predetermined intervals; or whenever a record is written.

Figure 22A:
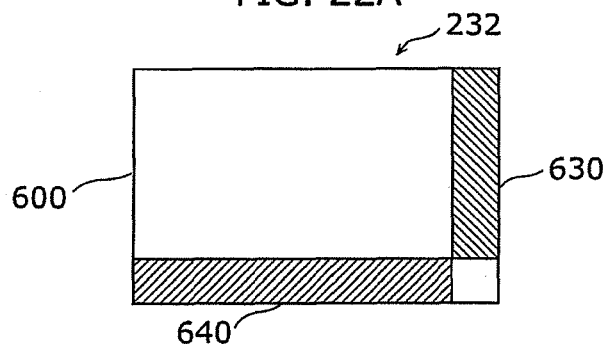
FIG. 22A is a diagram showing an example of an arrangement of a main memory cell array and a redundant memory cell array.
Figure 22B:
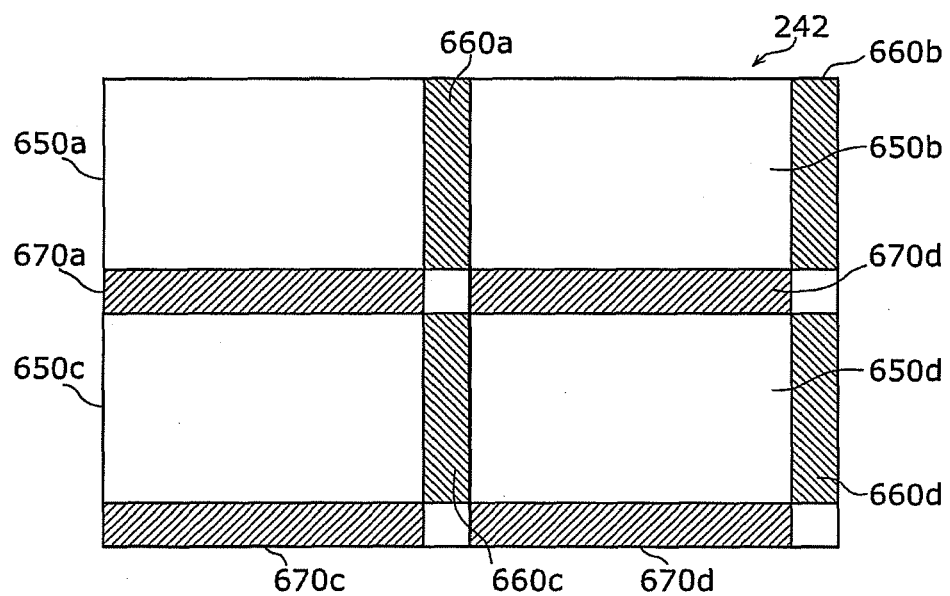
FIG. 22B is a diagram showing an example of an arrangement of a main memory cell array and a redundant memory cell array.
Figure 22C:
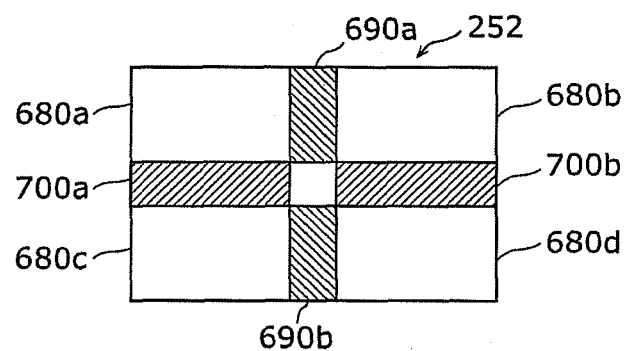
FIG. 22C is a diagram showing an example of an arrangement of a main memory cell array and a redundant memory cell array.

It should be noted that the arrangement of the redundant memory cell array 620 is not limited to the row direction as shown in FIG. 20. The arrangement in the column direction as described in Embodiment 1 above with reference to in FIG. 5 can be conceived, and a different arrangement can be conceived as well. Each of FIG. 22A, FIG. 22B, and FIG. 22C is a diagram showing an example of a different arrangement of the main memory cell array and the redundant memory cell array. In each of FIG. 22A, FIG. 22B, and FIG. 22C, a diagonally shaded area indicates a position of the redundant memory cell array in the memory cell array.

As shown in FIG. 22A, a memory cell array 232 may include redundant memory cell arrays 630 and 640 in either one of or both the column direction and the row direction with respect to the main memory cell array 600.

Moreover, as shown in FIG. 22B, the main memory cell array may be divided into a plurality of main memory cell arrays 650a, 650b, 650c, and 650d. Then, a memory cell array 242 may include redundant memory cell arrays 660a, 660b, 660c, 660d, 670a, 670b, 670c, and 670d in either one of or both the column direction and the row direction with respect to these respective main memory cell arrays 650.

Furthermore, as shown in FIG. 22C, the main memory cell array may be divided into a plurality of main memory cell arrays 680a, 680b, 680c, and 680d. Then, a memory cell array 252 may include redundant memory cell arrays 690a, 690b, 700a, and 700b in either one of or both the column direction and the row direction with respect to these respective main memory cell arrays 680.

Embodiment 3

The following describes a method of rescuing a faulty memory cell in Embodiment 3.

Figure 23:
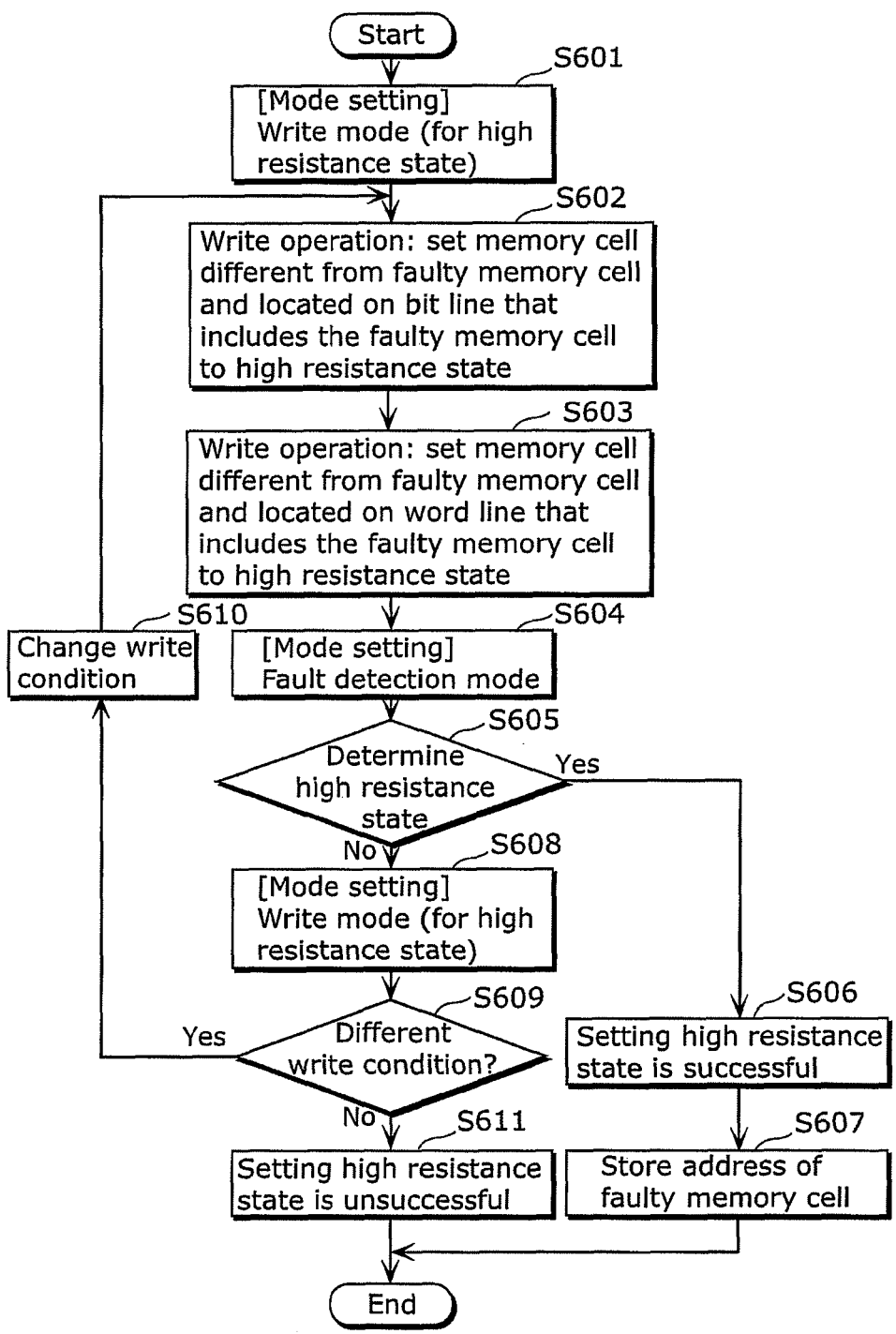
FIG. 23 is a diagram showing an example of a determination flow in the rescue mode.

FIG. 23 is a diagram showing an example of a flowchart of the method for rescuing a memory cell that is determined to be faulty in the current-steering-element characteristic determination mode. More specifically, variable resistance elements of memory cells different from the faulty memory cell having the faulty current steering element and located on the bit line and the word line that include the faulty memory cell are set to the second high resistance state where the resistance value is higher than the resistance value in the first low resistance state (that is, the resistance value is set to be higher than in the low resistance state for a regular write operation). As a result, the abnormal current passing through the faulty memory cell can be cut. Moreover, in order to substitute a redundant memory cell as a normal memory cell for each of the memory cells different from the faulty memory cell and located on the bit line and the word line that include the faulty memory cell, each of addresses of the memory cells is stored in association with an address of the corresponding substitute.

As shown in FIG. 23, according to the method of rescuing the faulty memory cell in Embodiment 3, the variable resistance nonvolatile memory device is firstly set to the write mode (for the high resistance state) (step S601). Then, a high-resistance write operation is performed on: at least one faulty memory cell, in the memory cell array 202, selected by the word line selected by the word line selection circuit 203 and the bit line selected by the bit line selection circuit 204; and the other memory cells different from the faulty memory cell and located on the bit line that includes the faulty memory cell (step S602). Moreover, the high-resistance write operation is performed on: at least one faulty memory cell, in the memory cell array 202, selected by the word line selected by the word line selection circuit 203 and the bit line selected by the bit line selection circuit 204; and the other memory cells different from the faulty memory cell and located on the word line that includes the faulty memory cell (step S603).

After this, a fault detection mode is set (step S604). Then, the sense amplifier 300 of the read circuit 206 determines whether the other memory cells different from the faulty memory cell and located on the bit line and the word line that include the faulty memory cell are in the second high resistance state (step S605).

When the other memory cells different from the faulty memory cell and located on the bit line and the word line that include the faulty memory cell are in the second high resistance state, it is determined that each target memory cell is set to the high resistance state successfully (step S606). Following this, the address of each target memory cell is stored into the fault address memory circuit 213 (step S607). Then, the process is terminated here.

On the other hand, when the other memory cells different from the faulty memory cell and located on the bit line and the word line that include the faulty memory cell are not in the second high resistance state in step S605, the write mode (for the high resistance state) is set again in the mode setting (step S608). After this, whether or not a different write condition can be set is determined (step S609). When it is determined that a different write condition can be set, the different write condition is set (step S610). Then, once again, the high-resistance write operation is performed on the other memory cells different from the faulty memory cell and located on the bit line and the word line that include the faulty memory element (steps S602 and S603). Here, to set the different write condition is to change, for example, a write voltage, a write pulse time, and a drive capability of a write driver. For example, when the different write condition is set, the write voltage may be changed to a third write pulse to set a memory cell to a third high resistance state where the resistance value is higher than the resistance value in the first high resistance state. When it is determined in step S609 that the different write condition cannot be set, it is determined that setting the target memory cell different from the faulty memory cell and located on the bit line and the word line that include the faulty memory cell to the high resistance state is unsuccessful (step S611). Then, the process is terminated here. In this case, the faulty memory cell cannot be rescued, and is thus treated as a faulty circuit.

It should be noted that the detection flow and the rescue flow of the faulty memory cell described above may be performed: when the variable resistance nonvolatile memory device 200 is turned on; at predetermined intervals; or whenever a record is written.

Embodiment 4

The following describes a variable resistance nonvolatile memory device in Embodiment 4 according to the present invention.

Figure 24:
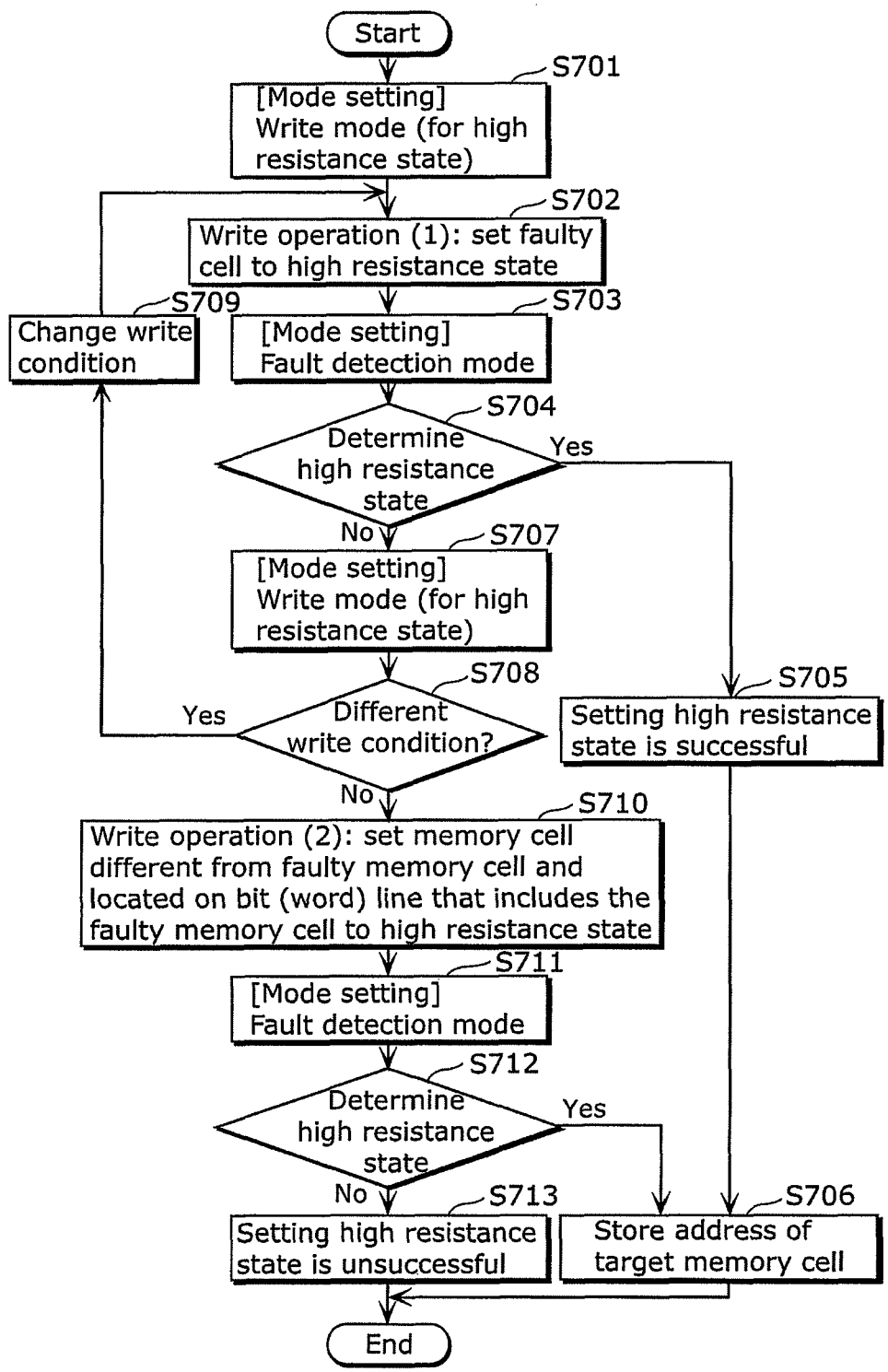
FIG. 24 is a diagram showing an example of a determination flow in the rescue mode.

FIG. 24 is a diagram showing an example of a flow for rescuing a faulty memory cell in Embodiment 4. In Embodiment 4, an abnormal current passing through a memory cell that is determined to be faulty in the current-steering-element characteristic determination mode is cut as follows. That is, the variable resistance element of this faulty memory cell and the variable resistance elements of the other memory cells different from the faulty memory cell and located on the word line that includes the faulty memory cell are set to the second high resistance state where the resistance value is higher than the resistance value in the first low resistance state (that is, the resistance value is set to be higher than in the low resistance state for a regular write operation). Moreover, in order to substitute a redundant memory cell as a normal memory cell for each of the memory cells different from the faulty memory cell and located on the bit line that includes the faulty memory cell, each of addresses of the memory cells is stored into a fault address memory circuit in association with an address of the corresponding substitute.

Firstly, the variable resistance nonvolatile memory device 200 is set to the write mode (for the high resistance state) (step S701). Then, a high-resistance write operation (1) is performed on at least one faulty memory cell, in the memory cell array 202, selected by the word line selected by the word line selection circuit 203 and the bit line selected by the bit line selection circuit 204 (step S702). After this, a fault detection mode is set (step S703). Then, the sense amplifier 300 of the read circuit 206 determines whether the faulty memory cell is in a fourth high resistance state where the resistance value is higher than the resistance value in the first low resistance state (step S704).

When the faulty memory cell is in the fourth high resistance state, it is determined that the target faulty memory cell is set to the high resistance state successfully (step S705). Following this, the address of the target faulty memory cell is stored into the fault address memory circuit 213 (step S706). Then, the process is terminated here.

On the other hand, when the target memory cell is not in the fourth high resistance state in step S704, the write mode (for the high resistance state) is set again in the mode setting (step S707). After this, whether or not a different write condition can be set is determined (step S708). When it is determined that a different write condition can be set, the different write condition is set (step S709). Then, once again, the high-resistance write operation is performed on the faulty memory cell (step S702). Here, to set the different write condition is to change, for example, a write voltage value, a write current value, a write pulse time, and a drive capability of a write driver. For example, when the different write condition is set, the write voltage may be changed to a third write pulse to set a memory cell to a third high resistance state where the resistance value is higher than the resistance value in the first high resistance state.

When it is determined in step S708 that the different write condition cannot be set, the other memory cells different from the target faulty memory cell and connected to the bit or word line that includes the target faulty memory, cell or to the bit and word lines that include the target faulty memory cell are selected one by one and the high-resistance write operation is performed (step S710). Here, the other memory cell may be another faulty memory cell different from the aforementioned faulty memory cell, or may be a normal memory cell.

At this time, for example, the second high-resistance write voltage Vwh2 higher than the voltage Vwh0 described above as the write voltage is applied to the memory cell on which the high-resistance write operation is to be performed, so that the memory cell is set to the second high resistance state where the resistance value is higher than the first low resistance state. Note that it is more preferable to set a third high-resistance write voltage Vwh3 such that the resistance value in the second high resistance state is, for example, higher than or equal to 10 times the resistance value in the first high resistance state.

After this, the fault detection mode is set (step S711). Then, the sense amplifier 300 of the read circuit 206 determines whether all the other memory cells different from the target faulty memory cell and located on the bit or word line including the target faulty memory cell are in the second high resistance state (step S712). When all the other memory cells different from the target faulty memory cell and located on the bit or word line including the target faulty memory cell are in the second high resistance state, the address of the target faulty memory cell is stored into the fault address memory circuit 213 (step S706). Then, the process is terminated here. On the other hand, when all the other memory cells different from the target faulty memory cell and located on the bit or word line including the target faulty memory cell are not in the high resistance state, it is determined that setting the target faulty memory cell to the high resistance state is unsuccessful (step S713). Then, the process is terminated here. In this case, the faulty memory cell cannot be rescued, and the memory cell array 202 is thus treated as a faulty circuit.

It should be noted that the present invention is not limited to Embodiments described above. Therefore, various changes and modifications can be made without departing from the scope of the present invention.

For example, the connection relationship between the current steering element and the variable resistance element may be turned upside down. Moreover, the connection relationship between the first variable resistance layer and the second variable resistance layer may be turned upside down. Furthermore, the connection relationship between the lower electrode and the upper electrode may be turned upside down.

In Embodiments described above, the bit line selection circuit fixes the nonselected bit lines BL1 and BL3 to the high impedance state, and the word line selection circuit fixes the nonselected word lines WL1 and WL3 to the high impedance state. However, the present invention is not limited to this. Each of the nonselected bit lines BL1 and BL3 and the nonselected word lines WL1 and WL3 may be set at a voltage lower than or equal to the voltage applied between the selected bit line BL2 and the selected word line WL2.

The materials of the upper electrode, the lower electrode, the first variable resistance layer, and the second variable resistance layer described in Embodiments above are only examples and, therefore, different materials may be used. For example, the metal oxide layer of the variable resistance element has been described to have a structure where tantalum oxides are stacked. However, the aforementioned advantageous effect according to the present invention is implemented not only in the case of the metal oxide layer comprising the tantalum oxide. It should be obvious that the variable resistance element may have a different structure or comprise a different material as long as the variable resistance element changes a resistance value reversibly between at least two values.

In Embodiments above, the current steering element has been described as a bidirectional current steering element. However, a unidirectional diode may be used. Moreover, the current steering element described in Embodiments above may be a PN diode, a Schottky diode, or a zener diode.

INDUSTRIAL APPLICABILITY

As described thus far, the variable resistance nonvolatile memory device having the cross point type structure according to the present invention is useful for implementing a highly-reliable memory by detecting an address of a faulty memory cell including a current steering element having a bidirectional characteristic and by rescuing the faulty memory cell.

REFERENCE SIGNS LIST 10, 100 Memory cell
20, 101 Current steering element
21 Lower electrode of current steering element (first electrode)
22 Semiconductor layer of current steering element
23 Upper electrode of current steering element (second electrode)
30, 102 Variable resistance element
31 Lower electrode of variable resistance element (third electrode)
32 First variable resistance layer of variable resistance element
33 Second variable resistance layer of variable resistance element
34 Upper electrode of variable resistance element (fourth electrode)
35 Variable resistance layer of variable resistance element
50 Lower line
51 Upper line
200 Variable resistance nonvolatile memory device
201 Main memory unit
202, 232, 242, 252 Memory cell array
203 Word line selection circuit (memory cell selection circuit)
204 Bit line selection circuit (memory cell selection circuit)
205 Write circuit
206 Read circuit
207 Data signal input-output circuit
208 Address signal input circuit
209 Control circuit
210 Write power source
211 Low-resistance write power source
212 High-resistance write power source
213 Fault address memory circuit
214 Address comparison circuit
300 Sense amplifier
310 Comparison circuit (detection circuit)
320 Current mirror circuit
330 Constant current circuit
400 Bit-line control voltage switching circuit
500 Bit-line control voltage generation circuit
600, 601 Main memory cell array
602 Nonselected memory cell array
610, 620, 630, 640 Redundant memory cell array
650a, 650b, 650c, 650d Main memory cell array
660a, 660b, 660c, 660d Redundant memory cell array
670a, 670b, 670c, 670d Redundant memory cell array
680 Bit-line voltage detection circuit (voltage detection circuit)
680a, 680b, 680c, 680d Main memory cell array
690a, 690b, 700a, 700b Redundant memory cell array
700 HR write circuit
710 First HR write circuit
720 Second HR write circuit
800 LR write circuit
BL1, BL2, BL3 Bit line
BLR1 Redundant bit line
D11, D12, D13 Current steering element
D21, D22, D23 Current steering element
D31, D32, D33 Current steering element
M11, M12, M13 Memory cell
M21, M22, M23 Memory cell
M31, M32, M33 Memory cell
R11, R12, R13 Variable resistance element
R21, R22, R23 Variable resistance element
R31, R32, R33 Variable resistance element
WL1, WL2, WL3 Word line
WLR1 Redundant word line

The invention claimed is:
1. A variable resistance nonvolatile memory device comprising:
a memory cell array having a plurality of memory cells each including a variable resistance element and a current steering element that are connected in series, each of the memory cells being located at a three-dimensional cross point of one of a plurality of word lines and one of a plurality of bit lines, the variable resistance element changing a resistance value reversibly in response to an applied write voltage pulse, and the current steering element flowing a current from which the current steering element is assumed to be conducting as a result of an application of a voltage exceeding a predetermined threshold voltage;
a memory cell selection circuit that selects at least one of the memory cells from the memory cell array by selecting at least one of the word lines and at least one of the bit lines;
a write circuit that rewrites the resistance value of the variable resistance element of the selected memory cell by applying a voltage pulse to the selected memory cell; and
a read circuit that reads a state of the selected memory cell by performing read-voltage application on the selected memory cell so that one of a first voltage higher than the threshold voltage and a second voltage lower than or equal to the threshold voltage is applied to the current steering element of the selected memory cell,
wherein the write circuit sets the variable resistance element of the memory cell selected from among the plurality of memory cells to one of a first low resistance state and a first high resistance state by applying, as the write voltage pulse, a corresponding one of a first low-resistance write pulse and a first high-resistance write pulse to the selected memory cell,
when the selected memory cell is not faulty and a resistance state of the variable resistance element of the selected memory cell is read by applying the first voltage to the selected memory cell, the read circuit detects (i) a current having a first predetermined value when the selected memory cell is in the first low resistance state and (ii) a current having a second predetermined value when the selected memory cell is in the first high resistance state,
when a value of a current passing through the selected memory cell is greater than one of the first predetermined value corresponding to the first low resistance state and the second predetermined value corresponding to the first high resistance state when the resistance state of the variable resistance element of the selected memory cell is read, the read circuit determines that the selected memory cell is a faulty memory cell having a fault, and the write circuit sets the variable resistance element of another memory cell different from the faulty memory cell and located on at least one of the bit line and the word line that includes the faulty memory cell to a second high resistance state where a resistance value is higher than a resistance value in the first low resistance state, by applying a second high-resistance write pulse to the other memory cell.

2. The variable resistance nonvolatile memory device according to claim 1, wherein the write circuit sets the variable resistance elements of other memory cells different from the faulty memory cell and located on the bit line and the word line that include the faulty memory cell to a third high resistance state where a resistance value is higher than the resistance value in the first high resistance state, by applying a third high-resistance write pulse to the other memory cells.

3. The variable resistance nonvolatile memory device according to claim 1, wherein, when the value of the current passing through the selected memory cell with the application of the second voltage is greater than the first predetermined value, the read circuit determines that the selected memory cell is a faulty memory cell having a short-circuit fault.

4. The variable resistance nonvolatile memory device according to claim 1, wherein the write circuit sets the variable resistance element of the selected memory cell to the first high resistance state by applying the first high-resistance write pulse, and the read circuit reads the resistance state of the variable resistance element of the selected memory cell by applying the first voltage to the selected memory cell, and determines that the variable resistance element of the selected memory cell is faulty when the value of the current passing through the selected memory cell is greater than the second predetermined value.

5. The variable resistance nonvolatile memory device according to claim 1, wherein, when the value of the current passing through the selected memory cell with the application of the second voltage after the write circuit applies the first low-resistance write pulse to the faulty memory cell is greater than the first predetermined value, it is determined that the selected memory cell is a faulty memory cell having a short-circuit fault.

6. The variable resistance nonvolatile memory device according to claim 1, wherein the write circuit sets the variable resistance element of the faulty memory cell to a fourth high resistance state where a resistance value is higher than the resistance value in the first low resistance state, by applying, to the faulty memory cell, a fourth high-resistance write pulse having an absolute value higher than or equal to an absolute value of a pulse voltage at which the variable resistance element enters a high resistance state.

7. The variable resistance nonvolatile memory device according to claim 1, wherein the memory cell array includes:

a main memory cell array having the memory cells for a main memory; and a redundant memory cell array having a redundant memory cell used, when at least one of the memory cells included in the main memory cell array is a faulty memory cell, as a substitute for the other memory cell different from the faulty memory cell and located on at least one of the bit line and the word line that includes the faulty memory cell, the redundant memory cell array having a plurality of redundant memory cells.

8. The variable resistance nonvolatile memory device according to claim 7, comprising a fault address memory circuit that stores address information regarding the other memory cell located on at least one of the bit line and the word line that includes the faulty memory cell, in association with address information regarding the redundant memory cell.

9. The variable resistance nonvolatile memory device according to claim 8, wherein the fault address memory circuit stores an address of the bit line that includes the faulty memory cell, in association with an address of a bit line that includes the redundant memory cell used as the substitute for the other memory cell different from the faulty memory cell and located on the bit line that includes the faulty memory cell.

10. The variable resistance nonvolatile memory device according to claim 8, wherein the fault address memory circuit stores an address of the word line that includes the faulty memory cell, in association with an address of a word line that includes the redundant memory cell used as the substitute for the other memory cell different from the faulty memory cell and located on the word line that includes the faulty memory cell.

11. A driving method of a variable resistance nonvolatile memory device, the variable resistance nonvolatile memory device including a memory cell array having a plurality of memory cells each including a variable resistance element and a current steering element that are connected in series, each of the memory cells being located at a three-dimensional cross point of one of a plurality of word lines and one of a plurality of bit lines, the variable resistance element changing a resistance value reversibly in response to an applied write voltage pulse, and the current steering element flowing a current from which the current steering element is assumed to be conducting as a result of an application of a voltage exceeding a predetermined threshold voltage, and the driving method comprising:

(a) setting, by the write circuit, the variable resistance element of the memory cell selected from among the plurality of memory cells to one of a first low resistance state and a first high resistance state by applying a corresponding one of a first low-resistance write pulse and a first high-resistance write pulse to the selected memory cell;

(b) reading, by the read circuit, a resistance state of the variable resistance element of the selected memory cell by applying a first voltage higher than the threshold voltage to the selected memory cell;

(c) determining that the selected memory cell is a faulty memory cell having a fault when a value of a current passing through the selected memory cell is greater than one of a first predetermined value corresponding to the first low resistance state and a second predetermined value corresponding to the first high resistance state when the resistance state of the variable resistance element of the selected memory cell is read, the first predetermined value representing a current passing through the selected memory cell when the selected memory cell is not faulty and is in the first low resistance state and the second predetermined value representing a current passing through the selected memory cell when the selected memory cell is not faulty and is in the first high resistance state; and (d) setting, by the write circuit, the variable resistance element of another normal memory cell different from the faulty memory cell and located on at least one of the bit line and the word line that includes the faulty memory cell to a second high resistance state where a resistance value is higher than a resistance value in the first low resistance state, by applying a second high-resistance write pulse to the other memory cell.

12. The driving method of the variable resistance nonvolatile memory device according to claim 11, wherein the write circuit sets the variable resistance elements of other memory cells different from the faulty memory cell and located on the bit line and the word line that include the faulty memory cell to a third high resistance state where a resistance value is higher than the resistance value in the first high resistance state, by applying a third high-resistance write pulse to the other memory cells.

13. The driving method of the variable resistance nonvolatile memory device according to claim 11, wherein, in the determining in (c), when the value of the current passing through the selected memory cell with the application of the second voltage lower than the threshold voltage is greater than the first predetermined value, the read circuit determines that the selected memory cell is the faulty memory cell having a short-circuit fault.

14. The driving method of the variable resistance nonvolatile memory device according to claim 11, wherein, in the determining in (c):

the write circuit sets the variable resistance element of the selected memory cell to the first high resistance state by applying the first high-resistance write pulse to the selected memory cell; and the read circuit reads the resistance state of the variable resistance element of the selected memory cell by applying the first voltage to the selected memory cell, and determines that the variable resistance element of the selected memory cell is faulty when the value of the current passing through the selected memory cell is greater than the second predetermined value.

15. The driving method of the variable resistance nonvolatile memory device according to claim 11, the driving method further comprising, in the setting in (d), (e) setting, by the write circuit, the variable resistance element of the faulty memory cell to a fourth high resistance state where a resistance value is higher than the resistance value in the first low resistance state, by applying, to the faulty memory cell, a fourth high-resistance write pulse having an absolute value higher than or equal to an absolute value of a pulse voltage at which the variable resistance element enters a high resistance state.

* * * * *